(12) United States Patent
Werner et al.

(10) Patent No.: US 7,161,513 B2
(45) Date of Patent: Jan. 9, 2007

(54) APPARATUS AND METHOD FOR IMPROVING RESOLUTION OF A CURRENT MODE DRIVER

(75) Inventors: Carl Werner, Los Gatos, CA (US); Pak Shing Chau, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/742,250

(22) Filed: Dec. 20, 2000

(65) Prior Publication Data

US 2002/0091948 A1 Jul. 11, 2002

Related U.S. Application Data

(63) Continuation-in-part of application No. 09/655,010, filed on Sep. 5, 2000, now Pat. No. 6,772,351, which is a continuation-in-part of application No. 09/478,916, filed on Jan. 6, 2000.

(60) Provisional application No. 60/158,189, filed on Oct. 19, 1999.

(51) Int. Cl.
*H03M 1/06* (2006.01)

(52) U.S. Cl. .................. 341/119; 341/118; 341/144
(58) Field of Classification Search ................ 341/119, 341/118, 120, 144–172; 702/129, 130, 132, 702/99
See application file for complete search history.

(56) References Cited

U.S. PATENT DOCUMENTS

| | | | |
|---|---|---|---|
| 2,912,684 A | 11/1959 | Steele | |
| 3,051,901 A | 8/1962 | Yaeger | |
| 3,078,378 A | 2/1963 | Burley et al. | |
| 3,267,459 A | 8/1966 | Chomicki et al. | |
| 3,484,559 A | 12/1969 | Rigby | |

(Continued)

FOREIGN PATENT DOCUMENTS

| | | |
|---|---|---|
| DE | 43 20 930 | 1/1995 |
| EP | 0 094 624 | 11/1983 |
| EP | 0 352 869 | 1/1990 |

(Continued)

OTHER PUBLICATIONS

Vogt, et al. "10–Bit High Speed CMOS DAC MACRO-CELL", IEEE 1989 Custom Integrated Circuits Conference pp. 6.7.1–6.7.4, no month/no date.

(Continued)

*Primary Examiner*—Linh Nguyen
(74) *Attorney, Agent, or Firm*—Morgan, Lewis & Bockius LLP

(57) ABSTRACT

A method for improving resolution of a current mode driver. The current mode driver is operable to provide an output that falls within a predetermined range. An embodiment of the method includes sensing a condition, such as a process condition, a voltage condition and a temperature condition. A full scale current of a digital-to-analog converter is adjusted in accordance with the condition. A current control signal is set based on an output of the digital-to-analog converter. The sensing step may include measuring a process, voltage or temperature sensitive DC parameter. Alternatively, the sensing step may include sensing a process, voltage or temperature sensitive AC parameter.

17 Claims, 30 Drawing Sheets

U.S. PATENT DOCUMENTS

| | | | |
|---|---|---|---|
| 3,508,076 A | 4/1970 | Winder | |
| 3,510,585 A | 5/1970 | Stone | |
| 3,560,856 A | 2/1971 | Kaneko | |
| 3,569,955 A | 3/1971 | Maniere | |
| 3,571,725 A | 3/1971 | Kaneko | |
| 3,587,088 A | 6/1971 | Frnszek | |
| 3,648,064 A | 3/1972 | Mukai et al. | |
| 3,697,874 A | 10/1972 | Kaneko | |
| 3,731,199 A | 5/1973 | Tazaki et al. | |
| 3,733,550 A | 5/1973 | Tazaki et al. | |
| 3,753,113 A | 8/1973 | Maruta et al. | |
| 3,754,237 A | 8/1973 | De Laage de Meux | |
| 3,761,818 A | 9/1973 | Tazaki et al. | |
| 3,772,680 A | 11/1973 | Kawai et al. | |
| 3,798,544 A | 3/1974 | Norman | |
| 3,832,490 A | 8/1974 | Leonard | |
| 3,860,871 A | 1/1975 | Hinoshita et al. | |
| 3,876,944 A | 4/1975 | Mack et al. | |
| 3,927,401 A | 12/1975 | McIntosh | |
| 3,978,284 A | 8/1976 | Yoshino et al. | |
| 3,988,676 A | 10/1976 | Whang | |
| 4,038,564 A | 7/1977 | Hakata | |
| 4,070,650 A | 1/1978 | Ohashi et al. | |
| 4,079,373 A * | 3/1978 | Brown | 341/119 |
| 4,086,587 A | 4/1978 | Lender | |
| 4,097,859 A | 6/1978 | Looschen | |
| 4,131,761 A | 12/1978 | Giusto | |
| RE30,182 E | 12/1979 | Howson | |
| 4,181,865 A | 1/1980 | Kohyama | |
| 4,280,221 A | 7/1981 | Chun et al. | |
| 4,373,152 A | 2/1983 | Jacobsthal | |
| 4,382,249 A | 5/1983 | Jacobsthal | |
| 4,403,330 A | 9/1983 | Meyer | |
| 4,408,135 A | 10/1983 | Yuyama et al. | |
| 4,408,189 A | 10/1983 | Betts et al. | |
| 4,438,491 A | 3/1984 | Constant | |
| 4,481,625 A | 11/1984 | Roberts et al. | |
| 4,528,550 A | 7/1985 | Graves et al. | |
| 4,571,735 A | 2/1986 | Furse | |
| 4,602,374 A | 7/1986 | Nakamura et al. | |
| 4,620,188 A | 10/1986 | Sengehanh | |
| 4,628,297 A | 12/1986 | Mita et al. | |
| 4,748,637 A | 5/1988 | Bishop et al. | |
| 4,779,073 A | 10/1988 | Iketani | |
| 4,805,190 A | 2/1989 | Jaffre et al. | |
| 4,821,286 A | 4/1989 | Graczyk et al. | |
| 4,823,028 A | 4/1989 | Lloyd | |
| 4,825,450 A | 4/1989 | Herzog | |
| 4,841,301 A | 6/1989 | Ichihara | |
| 4,860,309 A | 8/1989 | Costello | |
| 4,875,049 A | 10/1989 | Yoshida | |
| 4,888,764 A | 12/1989 | Haug | |
| 4,899,152 A * | 2/1990 | Barrow et al. | 341/154 |
| 5,003,555 A | 3/1991 | Bergmans | |
| 5,023,488 A | 6/1991 | Gunning | |
| 5,023,841 A | 6/1991 | Akrout et al. | |
| 5,045,728 A | 9/1991 | Crafts | |
| 5,046,050 A | 9/1991 | Kertis | |
| 5,115,450 A | 5/1992 | Arcuri | |
| 5,121,411 A | 6/1992 | Fluharty | |
| 5,126,974 A | 6/1992 | Sasaki et al. | |
| 5,153,459 A | 10/1992 | Park et al. | |
| 5,172,338 A | 12/1992 | Mehrotra et al. | |
| 5,191,330 A | 3/1993 | Fisher et al. | |
| 5,194,765 A | 3/1993 | Dunlop et al. | |
| 5,230,008 A | 7/1993 | Duch et al. | |
| 5,243,625 A | 9/1993 | Verbakel et al. | |
| 5,254,883 A | 10/1993 | Horowitz et al. | |
| 5,259,002 A | 11/1993 | Carlstedt | |
| 5,280,500 A | 1/1994 | Mazzola et al. | |
| 5,287,108 A | 2/1994 | Mayes et al. | |
| 5,295,155 A | 3/1994 | Gersbach et al. | |
| 5,295,157 A | 3/1994 | Suzuki et al. | |
| 5,315,175 A | 5/1994 | Langner | |
| 5,331,320 A | 7/1994 | Cideciyan et al. | |
| 5,373,473 A | 12/1994 | Okumura | |
| 5,408,498 A | 4/1995 | Yoshida | |
| 5,412,689 A | 5/1995 | Chan et al. | |
| 5,425,056 A | 6/1995 | Maroun et al. | |
| 5,426,739 A | 6/1995 | Lin et al. | |
| 5,438,593 A | 8/1995 | Karam et al. | 375/317 |
| 5,459,749 A | 10/1995 | Park | |
| 5,471,156 A | 11/1995 | Kim et al. | |
| 5,473,635 A | 12/1995 | Chevroulet | |
| 5,483,110 A | 1/1996 | Koide et al. | |
| 5,508,570 A | 4/1996 | Laber et al. | |
| 5,513,327 A | 4/1996 | Farmwald et al. | |
| 5,525,983 A | 6/1996 | Patel et al. | |
| 5,534,795 A | 7/1996 | Wert | |
| 5,534,798 A | 7/1996 | Phillips et al. | |
| 5,539,774 A | 7/1996 | Nobakht et al. | |
| 5,546,042 A | 8/1996 | Tedrow et al. | |
| 5,553,097 A | 9/1996 | Dagher | |
| 5,570,090 A * | 10/1996 | Cummins | 341/144 |
| 5,596,439 A | 1/1997 | Dankberg et al. | |
| 5,604,468 A * | 2/1997 | Gillig | 331/176 |
| 5,608,755 A | 3/1997 | Rakib | |
| 5,633,631 A | 5/1997 | Teckman | |
| 5,640,605 A | 6/1997 | Johnson et al. | |
| 5,644,253 A | 7/1997 | Takatsu | |
| 5,663,663 A | 9/1997 | Cao et al. | |
| 5,684,833 A | 11/1997 | Watanabe | |
| 5,694,424 A | 12/1997 | Ariyavisitakul | |
| 5,703,582 A * | 12/1997 | Koyama et al. | 341/120 |
| 5,734,294 A | 3/1998 | Bezzam et al. | |
| 5,740,201 A | 4/1998 | Hui | |
| 5,742,591 A | 4/1998 | Himayat et al. | |
| 5,751,168 A | 5/1998 | Speed, III et al. | |
| 5,757,712 A | 5/1998 | Nagel et al. | |
| 5,761,246 A | 6/1998 | Cao et al. | |
| 5,793,815 A | 8/1998 | Goodnow et al. | |
| 5,793,816 A | 8/1998 | Hui | |
| 5,796,781 A | 8/1998 | DeAndrea et al. | |
| 5,798,918 A * | 8/1998 | Georgiou et al. | 700/17 |
| 5,809,033 A | 9/1998 | Turner et al. | |
| 5,812,572 A * | 9/1998 | King et al. | 372/38.04 |
| 5,825,450 A | 10/1998 | Date et al. | |
| 5,825,825 A | 10/1998 | Altmann et al. | |
| 5,828,329 A * | 10/1998 | Burns | 341/155 |
| 5,852,637 A | 12/1998 | Brown et al. | 375/316 |
| 5,864,584 A | 1/1999 | Cao et al. | |
| 5,867,010 A | 2/1999 | Hinedi et al. | |
| 5,872,468 A | 2/1999 | Dyke | |
| 5,887,032 A | 3/1999 | Cioffi | |
| 5,892,466 A | 4/1999 | Walker | |
| 5,898,734 A | 4/1999 | Nakamura et al. | |
| 5,917,340 A | 6/1999 | Manohar et al. | |
| 5,917,856 A | 6/1999 | Torsti | |
| 5,933,458 A | 8/1999 | Leurent et al. | |
| 5,940,442 A | 8/1999 | Wong et al. | 375/232 |
| 5,942,994 A | 8/1999 | Lewiner et al. | |
| 5,946,355 A | 8/1999 | Baker | |
| 5,949,280 A | 9/1999 | Sasaki | |
| 5,969,579 A | 10/1999 | Hartke et al. | |
| 5,969,648 A | 10/1999 | Garnett | |
| 5,970,088 A | 10/1999 | Chen | |
| 5,973,508 A | 10/1999 | Nowak et al. | |
| 5,977,798 A | 11/1999 | Zerbe | |
| 5,982,741 A | 11/1999 | Ethier | |
| 5,986,472 A | 11/1999 | Hinedi et al. | |
| 6,005,895 A | 12/1999 | Perino et al. | |

| | | | |
|---|---|---|---|
| 6,006,169 A * | 12/1999 | Sandhu et al. | 327/83 |
| 6,009,120 A | 12/1999 | Nobakht | |
| 6,018,550 A | 1/2000 | Emma et al. | |
| 6,034,993 A | 3/2000 | Norrell et al. | |
| 6,038,260 A | 3/2000 | Emma et al. | |
| 6,048,931 A | 4/2000 | Fujita et al. | |
| 6,049,229 A | 4/2000 | Manohar et al. | |
| 6,052,390 A | 4/2000 | Deliot et al. | |
| 6,061,395 A | 5/2000 | Tonami | |
| 6,067,326 A | 5/2000 | Jonsson et al. | |
| 6,069,577 A | 5/2000 | Morisson et al. | |
| 6,078,627 A | 6/2000 | Crayford | |
| 6,094,075 A | 7/2000 | Garrett, Jr. et al. | |
| 6,094,461 A | 7/2000 | Heron | |
| 6,097,215 A | 8/2000 | Bialas, Jr. et al. | |
| 6,101,561 A | 8/2000 | Beers et al. | |
| 6,114,979 A | 9/2000 | Kim | |
| 6,122,010 A | 9/2000 | Emelko | |
| 6,130,632 A * | 10/2000 | Opris | 341/120 |
| 6,140,841 A | 10/2000 | Suh | |
| 6,140,860 A * | 10/2000 | Sandhu et al. | 327/513 |
| 6,160,421 A | 12/2000 | Barna | |
| 6,195,397 B1 | 2/2001 | Kwon | |
| 6,204,785 B1 * | 3/2001 | Fattaruso et al. | 341/120 |
| 6,215,635 B1 * | 4/2001 | Nguyen | 361/103 |
| 6,222,380 B1 | 4/2001 | Gerowitz | |
| 6,246,353 B1 * | 6/2001 | Elliott et al. | 341/156 |
| 6,282,184 B1 | 8/2001 | Lehman et al. | 370/342 |
| 6,307,824 B1 | 10/2001 | Kuroda et al. | |
| 6,308,049 B1 * | 10/2001 | Bellaouar et al. | 455/76 |
| 6,377,197 B1 * | 4/2002 | Rantanen | 341/118 |
| 6,396,329 B1 | 5/2002 | Zerbe | 327/336 |
| 6,665,351 B1 | 12/2003 | Hedberg | 375/296 |
| 6,674,377 B1 * | 1/2004 | Li | 341/120 |
| 6,683,549 B1 * | 1/2004 | Kinugasa | 341/136 |
| 2001/0021987 A1 | 9/2001 | Govindarajan et al. | 714/705 |

FOREIGN PATENT DOCUMENTS

| | | |
|---|---|---|
| EP | 0 463 316 | 1/1992 |
| EP | 0 482 392 | 4/1992 |
| EP | 0 490 504 | 7/1992 |
| JP | 354051343 | 4/1979 |
| JP | 354060850 | 5/1979 |
| JP | 356164650 | 12/1981 |
| JP | 58-54412 | 3/1983 |
| JP | 358070662 | 4/1983 |
| JP | 359036465 | 2/1984 |
| JP | 360087551 | 5/1985 |
| JP | 360194647 | 10/1985 |
| JP | 362051329 | 3/1987 |
| JP | 402128201 | 5/1990 |
| JP | 402140676 | 5/1990 |
| JP | 404044691 | 2/1992 |
| JP | 405143211 | 6/1993 |
| JP | 408202677 | 8/1996 |
| JP | 408286943 | 11/1996 |
| JP | 409181778 | 7/1997 |
| JP | 10200345 | 7/1998 |
| WO | WO 95/31867 | 11/1995 |
| WO | WO 96/31038 | 10/1996 |
| WO | WO 98/33306 | 7/1998 |
| WO | WO 99/10982 | 3/1999 |

OTHER PUBLICATIONS

IEEE Standard 802 3ad–1999, 802.3 Supplemental. Local and Metropolitan Area Networks, Jul. 17, 1999.

802.3 ab., A Tutorial Presentation, 63 pages, presented at an IEEE 802.3 working group meeting in Mar. 1998, no date.

Thompson, "How 1000BASE–T Works", *IEEE802.3 Plenary*, (1997), Montreal PQ Canada, 8 pages, no date/month.

Perez–Alvarez, et al. "A Differential Error Reference Adaptive Echo Canceller for Multilevel PAM Line Codes", *IEEE*, pp. 1707–1710 (1996), no date/month.

Kuczyski, et al., "A 1Mb/s Digital Subscriber Line Transceiver Signal Processor", *1993 IEEE International Solid–State Circuits Conference*, (1993), no date/month.

Cova, et al. "Characterization of Individual Weights in Transversal Filters and Application to CCD's ", *IEEE Journal of Solid–State Circuits*, vol. SC–17, pp. 1054–1061 (1982), no date/month.

Dally, et al., "Multi–Gigabit Signaling with CMOS", May 12, 1997.

Fielder, et al. "A 1.0625 Gbps Transceiver with 2x–Oversampling and Transmit Signal Pre–Emphasis," *1997 IEEE International Solid State Circuit Conference and Slideset*, no date/month.

Raghaven, et al. "Nonuniformly Spaced Trapped Delay–Line Equalizers", *IEEE Transactions on Communications*, vol. 41, pp. 1290–1295 (1993), no date/month.

Ariyavisitakul, et al., "Reduced–Complexity Equalization Techniques for Broadband Wireless Channels", *IEEE Journal on Selected Areas in Communication*, pp. 5–15 (1997, no date/month.

Ariyavisitakul, et al., "Tap–Selected Decision–Feedback Equalization", *IEEE Transactions on Communications*, pp. 1497–1500 (1997), no month/date.

Sidiropoulos, et al, "A 700–Mb/s/pin CMOS Signaing Interface Using Current Integrating, Receivers", *IEEE Journal of Solid–State Circuits*, vol. 32, pp. 681–690 (1997), no month/date.

Donnelly et al, "A 660 MB/s Interface Megacell Portable Circuit in 0.3 µm–0.7 µm CMOS ASIC", *IEEE Journal of Solid–State Circuits*, vol. 31, pp. 1995–2003 (1996), no date/month.

Allen, "Probability, Statistics, and Queueing Theory with Computer Science Applications," $2^{nd}$ Edition, CH 7, pp. 450–459, no date/month/year.

Chappell, et al., "A 2ns–Cycle, 4ns Access 512kb CMOS ECL SRAM", *1991 IEEE Journal of Solid–State Circuits*, pp. 50–51 (1991), no date/month.

Pilo, et al., "A 300MHz, 3.3V 1Mb SRAM Fabricated in a .5 µm CMOS Process," *IEEE Journal of Solid–State Circuits*, pp. 148–149 (1996), no date/month.

Schumacher, et al., "CMOS Subnanosecond True–ECL Output Buffer", *IEEE Journal of Solid–State Circuits*, vol. 25, pp. 150–154 (1990), no date/month.

Yang, et al., "A 4–ns 4K×1–bit Two Port BiCMOS SRAM", *IEEE Journal of D–State Circuits*, vol. 23, No. 5, pp. 1030–1040 (1988), no date/month.

Bazes, "Two Novel Fully Complementary Self–Biased CMOS Differential Amplifiers", *IEEE Journal of Solid State Circuits*, vol. 28, pp. 165–168, (1991), no date/month.

Ishibe, et al. "High–Speed CMOS I/O Buffer Circuits", *IEEE Journal of Solid–State Circuits*, vol. 27, pp. 671–677 (1992), no date/month.

Lee, et al., "A 80ns 5V–Only Dynamic RAM", *ISSCC/79 Proceedings*, Paper 12.2 (1979), no date/month.

Seki, et al., "A 6–ns 1–Mb CMOS SRAM with Latched Sense Amplifier", *IEEE Journal of Solid–State Circuits*, vol. 28, pp. 4–483 (1993), no date/month.

Kobayashi, et al., "A Current–Controlled Latch Sense Amplifier and a Static Power–Saving Input Buffer for Low–Power Architecture", *IEEE Journal of Solid State Circuits*, pp. 523–527 (1993), no date/month.

Tomassini et al., "A fully differential CMOS Line Driver for ISDN", *IEEE Journal of Solid State Circuits*, vol. 25, No. 2 (1990), no date/month.

Farjad–Rad, et al., "A 0.4 μm CMOS 10–Gb/s 4–PAM Pre–Emphasis Serial Link Transmitter", *IEEE Journal of Solid–State Circuits*, vol. 34, pp. 580–585 (1999).

Yeung, et al., "A 2.4Gbps Per Pin Simultaneous Bidirectional Parallel Link with Per Pin Skew Compensation", *ISSCC* 2000, pp. 1–11, no date/month.

Portmann et al., "A Multiple Vendor 2.5–V DLL for 1.6–GB/s RDRaMs", *IEEE VLSI Circuits Symposium*, Jun. 1999, no date.

Moncayo, "Bus Design and Analysis at 500 MHz and Beyond", *High Performance System Design Conference*, (1995), no date/month.

Lau, et al. "A 2.6–Byte/s Multipurpose Chip–to–Chip Interface", *IEEE Journal of Solid State Circuits*, vol. 33, pp. 1617–1626 (1998), no date/month.

Current, "Current Mode CMOS Multiple–Valued Logic Circuits", *IEEE Journal of Solid–State Circuits*, vol. 29, No. 2, pp. 95–107 (1994).

Dally and Poulton, Digital Systems Engineering, Cambridge University Press, New York, pp. 334–347 and 352 (1998), no date/month.

Farjad–Rad, et al. "An Equalization Scheme for 10Gb/s 4–PAM Signaling over Long Cables," *Department of Electrical Engineering, Stanford University*, 1997, no month/date.

IBM Technical Disclosure Bulletin, Jun. 1967, "Use of Multibit encoding to increase Linear Recording Densities in Serially Recorded Records," pp. 14–15, no date.

IBM Technical Disclosure Bulletin, Jan. 1968, "Coding Data Transmission," pp. 1295–1296, no date.

IBM Technical Disclosure Bulletin, Jul. 1969, "Clock Recovery Circuit," pp. 219–220, no date.

IBM Technical Disclosure Bulletin, Nov. 1970, "Transmission by Data Encoding", pp. 1519–1520, no date.

IBM Technical Disclosure Bulletin, Feb. 1976, "Bidirectional Communications Within a Binary Switching System," pp. 2865–2866, no date.

IBM Technical Disclosure Bulletin, Feb. 1976, "Multilevel Bidirectional Signal Transmission," pp. 2867–2868, no date.

IBM Technical Disclosure Bulletin, Oct. 1978, "Multilevel Signal Transfers," pp. 1798–1800, no date.

IBM Technical Disclosure Bulletin, Feb. 1981, "Circuit for Multilevel Logic Implementation," pp. 4206–4209, no date.

IBM Technical Disclosure Bulletin, Apr. 1983, "Multi Level Logic Testing", pp. 5903–5904, no date.

IBM Technical Disclosure Bulletin, Sep. 1985, "Push–Pull Multi–Level Driver Circuit for Input–Output Bus," pp. 1649–1651, no date.

IBM Technical Disclosure Bulletin, Aug. 1986, "Multilevel CMOS Sense Amplifier," pp. 1280–1281, no date.

IBM Technical Disclosure Bulletin, Nov. 1992, "Multi–Level Encoded High Bandwidth Bus," pp. 444–447, no date/month/year.

IBM Technical Disclosure Bulletin, Feb. 1995, "High Speed Complimentary Metal Oxide Semiconductors Input/Output Circuits," pp. 111–114, no month/date.

IBM Technical Disclosure Bulletin, Apr. 1995, "Common Front End Bus for High–Performance Chip–to–Chip Communication," pp. 443–444, no date.

IBM Technical Disclosure Bulletin, Apr. 1995, "High Performance Impedance Controlled CMOS Driver," pp. 445–448, no date.

IBM Technical Disclosure Bulletin, Apr. 1995, "3–state Decoder for External 3–State Buffer," pp. 477–478, no date/month/year.

Matick, Transmission Lines for Digital and Communication Networks: An Introduction to Transmission Lines, High–Frequency and High–Speed Pulse Characteristics and Applications, IEEE Press, New York, pp. 268–269 (1995), no date no month.

Singh, "Four Valued Buses for Clocked CMOS VLSI Systems", *Proceedings of the Seventeenth International Symposium on Multiple–Valued Logic, The Computer Society of the IEEE*, pp. 128–133 (1987).

Smith, "The Prospects for Multivalued Logic: a Technology and Applications View", *IEEE Transactions on Computers*, vol. c–30, pp. 619–634 (1981), no date, no month.

Thrion, "10 Gig PMD Technologies," *IEEE Plenary*, Kauai, Hawaii, (1999), no date/no month.

Vranesic, "Multivalued Signalling in Daisy Chain Bus Control", *Proceedings of the Ninth International Symposium on Multiple–Valued Logic*, Bath, England, pp. 14–18 (1979), no date no month.

Azadet et al., "A Gigabit Transceiver Chip Set for UTP CAT6 Cables in Digital CMOS Technology," *2000 IEEE International Solid State Circuits Conference*, pp. 3–6–307.

Yang, et al., "A Scalable 32Gb/s Parallel Data Transceiver with On–Chip Timing Calibration Circuits", *2000 IEEE International Solid–State Circuits Conference*, pp. 258–259 (2000), no date/no month.

Modulation Schemes for High Bit Rate Data Transmission in the Loop Plant, URL–http://www.bib.fri–lippe.de/volltext/dipl/schlegd/chapter4.html, 29 pages, printed Apr. 19, 2001.

Scott, "Propagation Over Multiple Parallel Transmission Lines Via Modes", IBM Technical Disclosure Bulletin, Apr. 1990, no date.

1996 Symposium on VLSI Circuits, *IEEE*, Jun. 13–15, 1996.

Taborek, et al. IEEE 802.3 Tutorial, "Multi–Level Analog Signaling Techniques for 10 Gigabit Ethernet", no date/month/year indicate.

IBM, Servo Control of Analog Power Supplies Interface Card, Apr. 1, 1993, vol. 36, Issue 4, pp. 283–286.

* cited by examiner

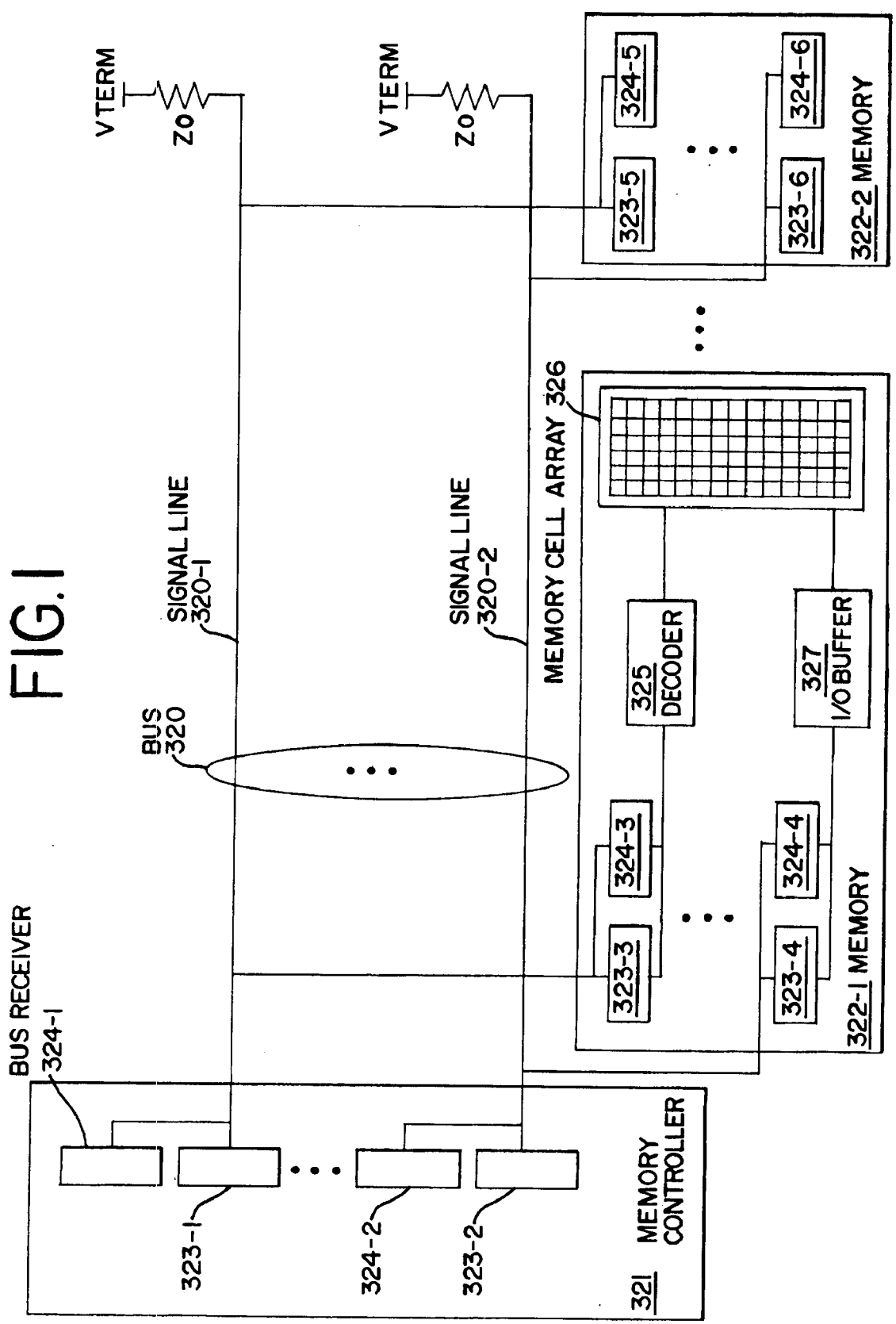

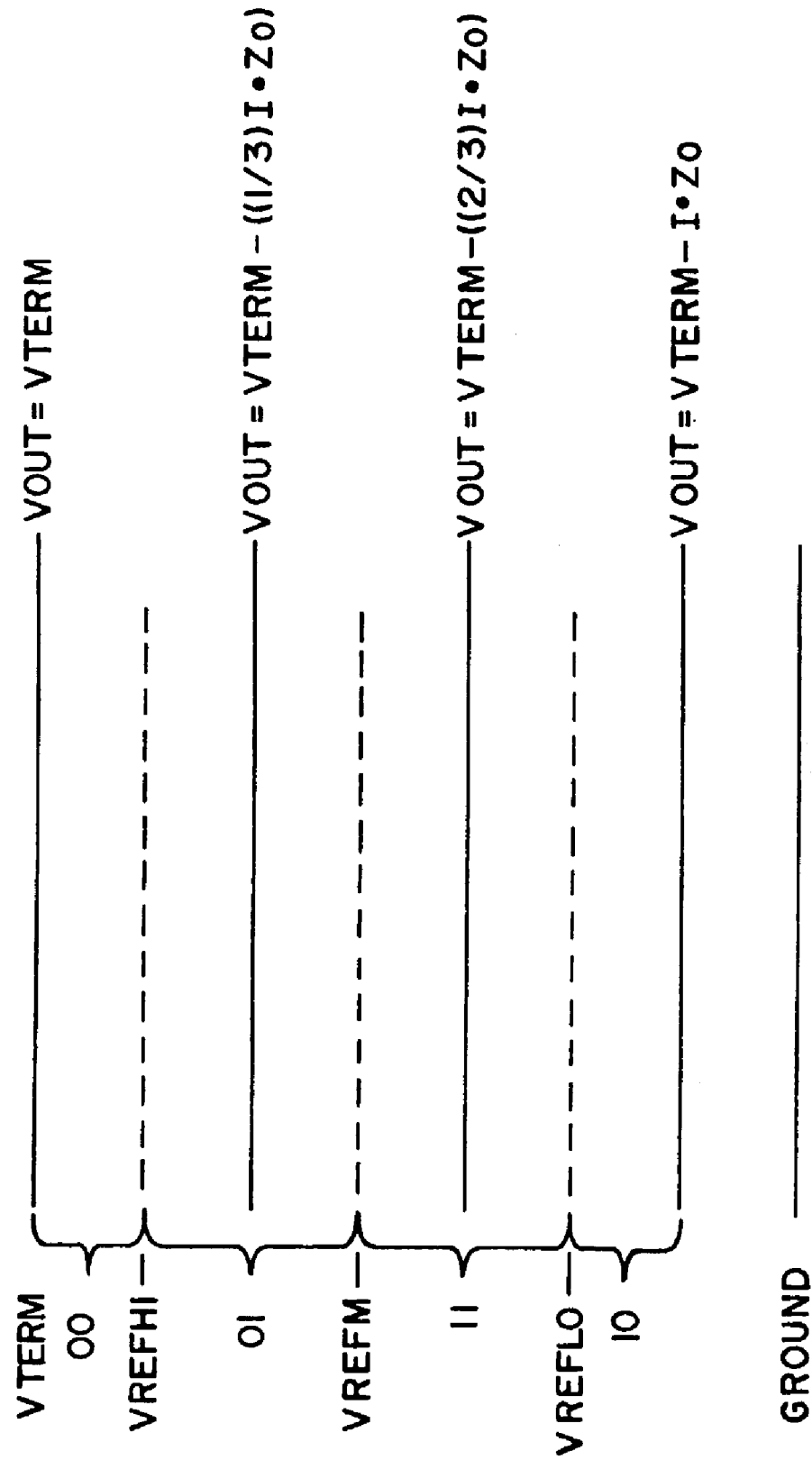

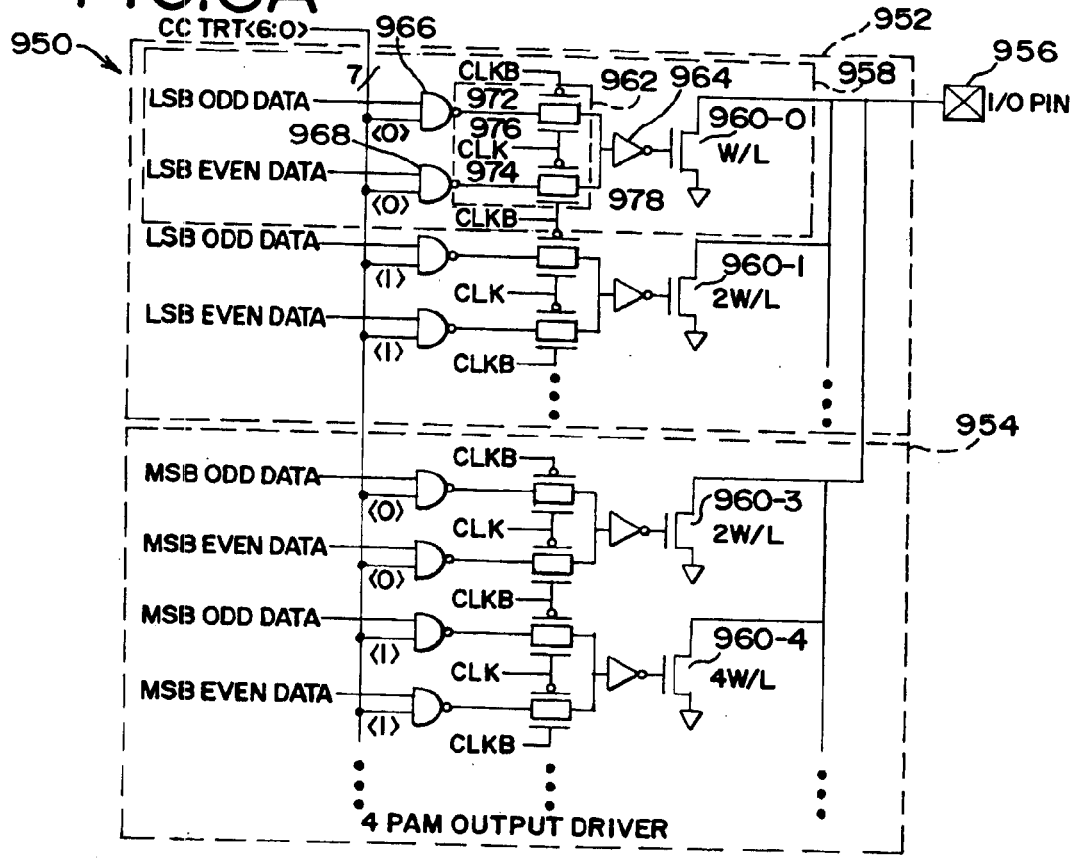
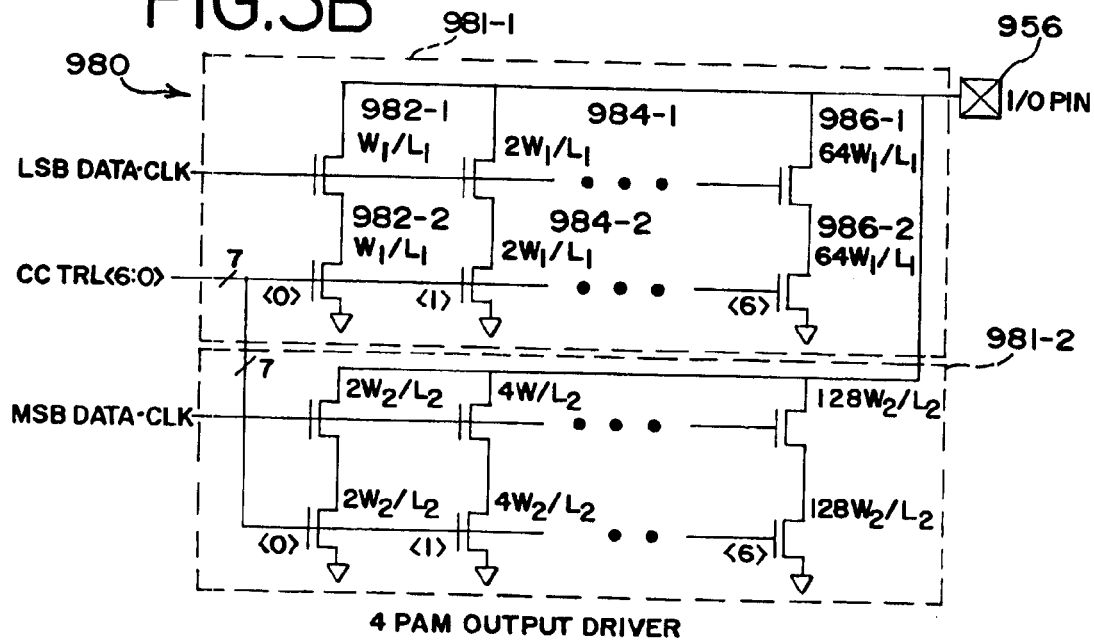

CIRCUIT TO REDUCE SWITCHING NOISE

GDS COMPENSATED MULTI-PAM OUTPUT DRIVER

GDS COMPENSATED MULTI-PAM OUTPUT DRIVER WITH CURRENT CONTROL

CIRCUIT FOR CALIBRATING THE GDS COMPENSATED
OUTPUT DRIVER WITH CURRENT CONTROL

METHOD FOR CALIBRATING THE GDS COMPENSATED OUTPUT DRIVER WITH CURRENT CONTROL

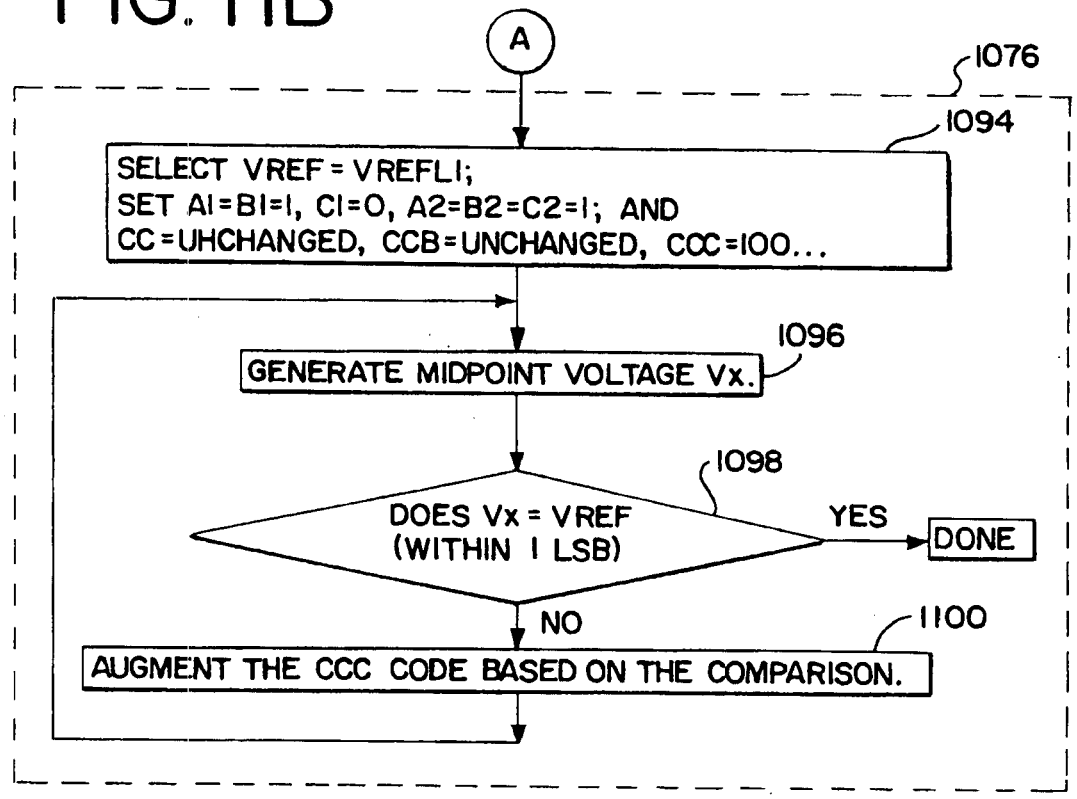
METHOD FOR CALIBRATING THE GDS COMPENSATED OUTPUT DRIVER WITH CURRENT CONTROL
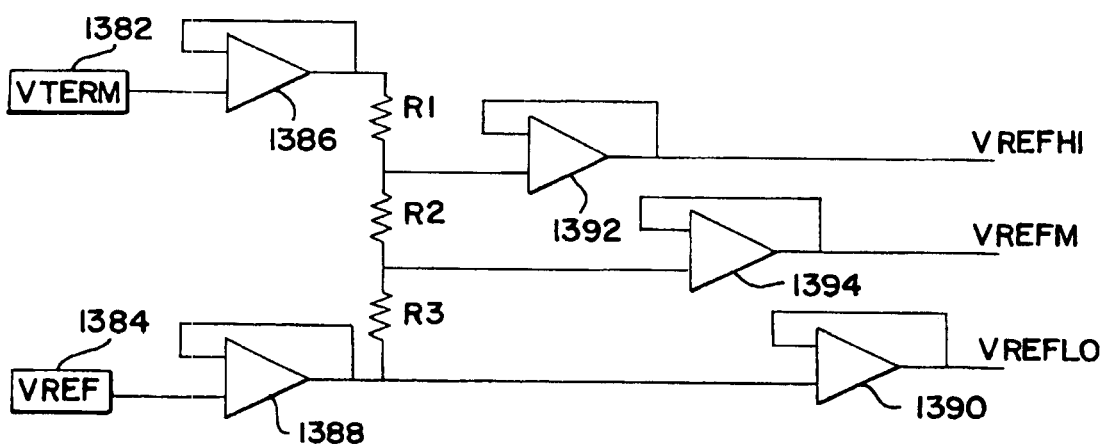

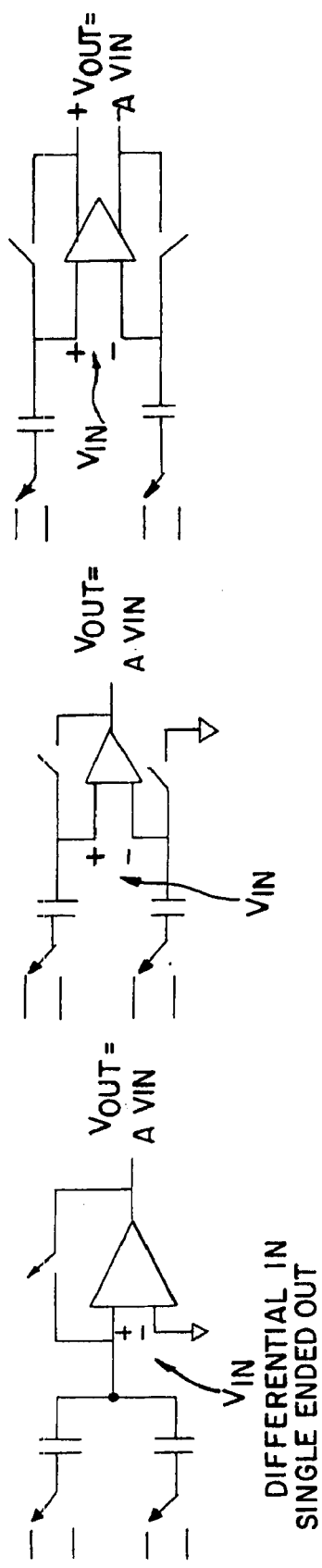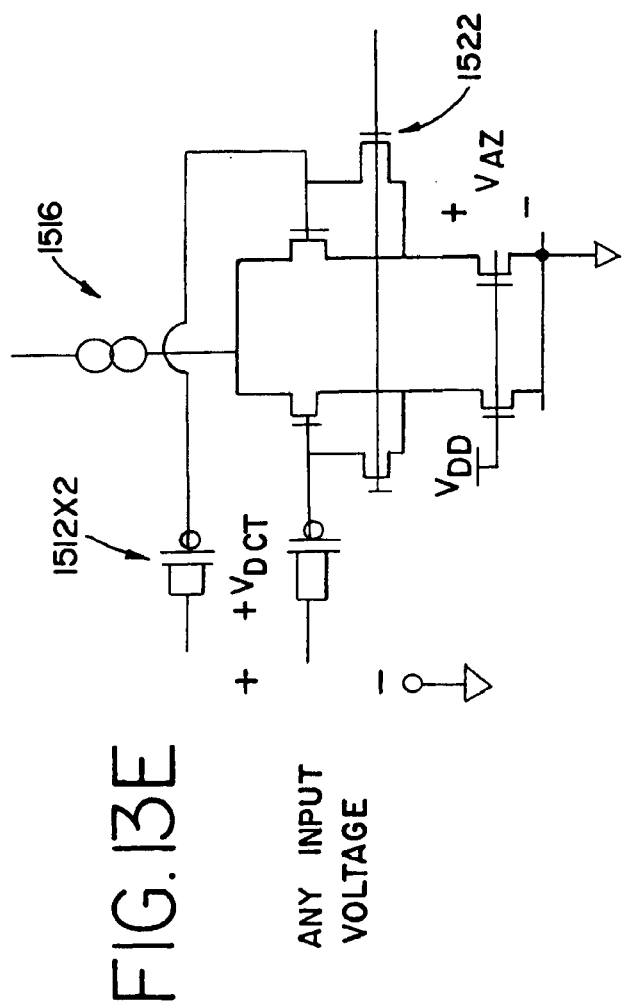
FIG.13D
FIG.13E

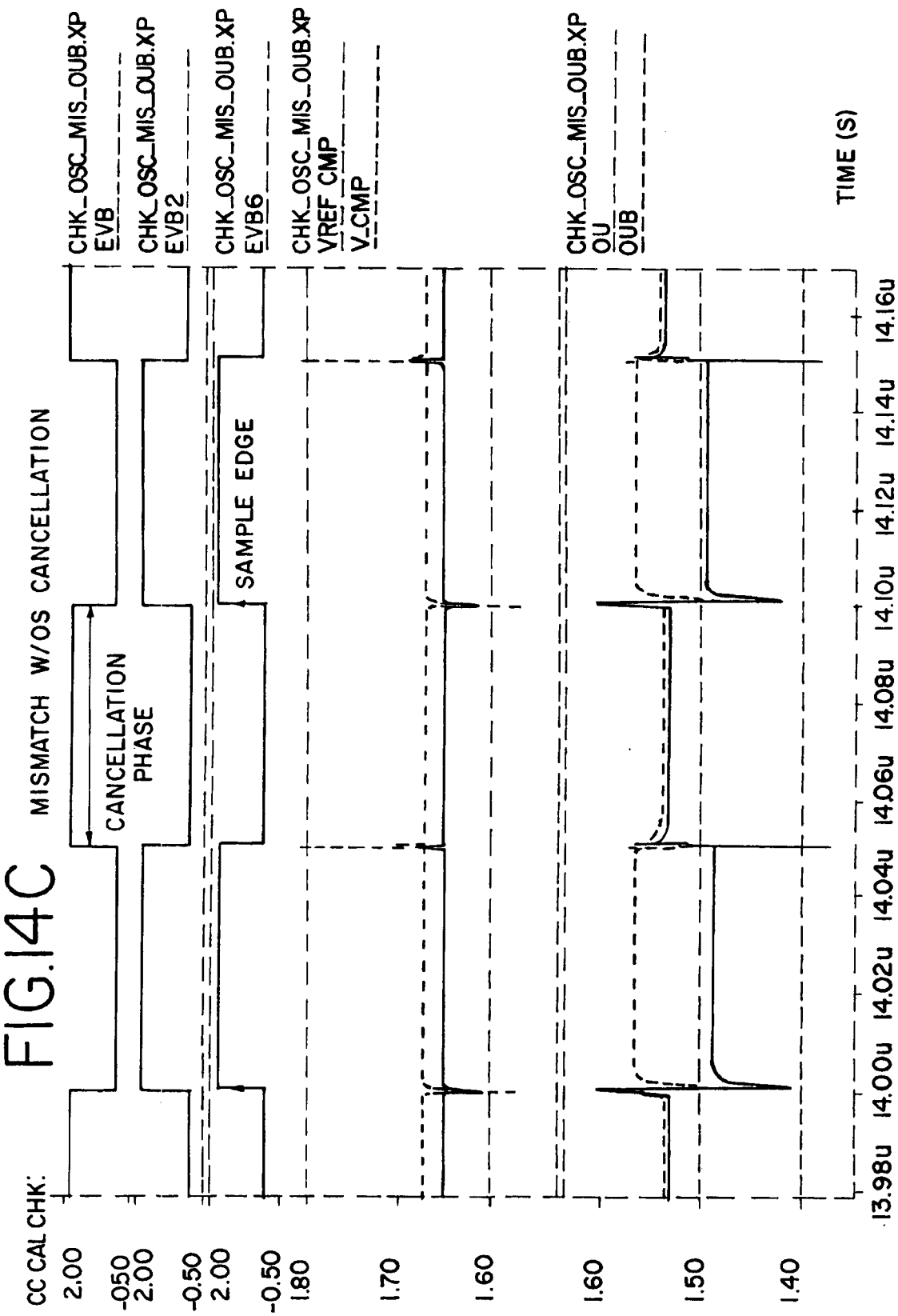

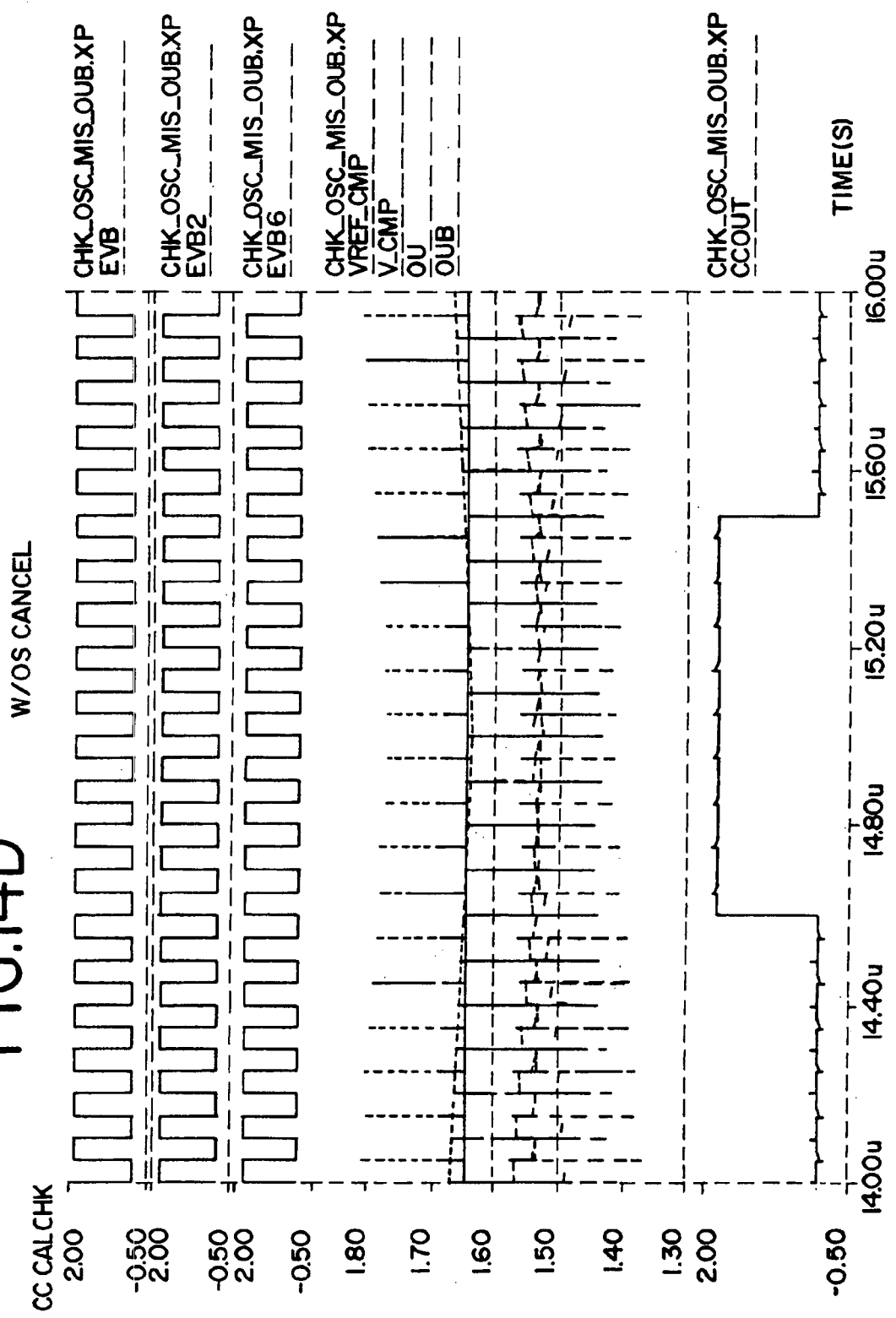
FIG.14D  W/OS CANCEL

CURRENT DRIVERS
TRANSCONDUCTANCE STAGE
LATCHING STAGE
TO STATE MACHINE
CLOCK
MULTI LEVEL REFERENCE AND MUX

OUTPUT DRIVER BLOCK DIAGRAM

FAST CONDITIONS

SLOW CONDITIONS

ALTERNATE EMBODIMENT OF VGATE DAC

M1, M2 SCALED TO MATCH ACTUAL OUTPUT DRIVER

APPARATUS AND METHOD FOR IMPROVING RESOLUTION OF A CURRENT MODE DRIVER

CROSS REFERENCE TO RELATED APPLICATION(S)

This application is a continuation-in-part of U.S. patent application Ser. No. 09/655,010 (U.S. Pat. No. 6,772,351), entitled "Method and Apparatus for Calibrating a Multi-Level Current Mode Driver," filed Sep. 5, 2000 which is a continuation-in-part of U.S. patent application Ser. No. 09/478,916, entitled "Low Latency Multi-Level Communication Interface," filed on Jan. 6, 2000, which claims priority to U.S. Provisional Patent Application Ser. No. 60/158,189, entitled "A Method and Apparatus for Receiving High Speed Signals with Low Latency," filed on Oct. 19, 1999, the contents of each of which are incorporated herein by reference.

FIELD OF THE INVENTION

The present invention relates generally to the field of electrical buses. More particularly, the present invention relates to a current mode driver for a high speed bus.

BACKGROUND OF THE INVENTION

Computer systems and other electronic systems typically use buses for interconnecting integrated circuit components so that the components may communicate with one another. The buses frequently connect a master, such as a microprocessor or controller, to slaves, such as memories and bus transceivers. Generally, a master may send data to and receive data from one or more slaves. A slave may send data to and receive data from a master, but not another slave.

Each master and slave coupled to a prior bus typically includes output driver circuitry for driving signals onto the bus. Some prior bus systems have output drivers that user transistor-transistor logic ("TTL") circuitry. Other prior bus systems have output drivers that include emitter-coupled logic ("ECL") circuitry. Other output drivers use complementary metal-oxide-semiconductor ("CMOS") circuitry or N-channel metal-oxide-semiconductor ("NMOS") circuitry.

While many prior buses were driven by voltage level signals, it has become advantageous to provide buses that are driven by a current mode output driver. A benefit associated with a current mode driver is a reduction of peak switching current. In particular, the current mode driver draws a known current regardless of load and operating conditions. A further benefit is that the current mode driver typically supresses noise coupled from power and ground supplies.

A known current mode driver is shown in U.S. Pat. No. 5,254,883 (the "'883 patent"), which is assigned to the assignee of the present invention and incorporated herein by reference. The '883 patent discusses an apparatus and method for setting and maintaining the operating current of a current mode driver. The driver in the '883 patent includes an output transistor array, output logic circuitry coupled to the transistor array and a current controller coupled to the output logic circuitry.

For one embodiment, the current controller in the '883 patent is a resistor reference current controller. The current controller receives two input voltages, $V_{TERM}$ and $V_{REF}$, the latter of which is applied to an input of a comparator. $V_{TERM}$ is coupled by a resistor to a node, which is in turn coupled to a second input of the comparator. The voltage at the node is controlled by a transistor array, which is in turn controlled in accordance with an output of the comparator.

When the transistor array is placed in the "off" state, i.e. there is no current flowing through the transistors of the array to ground, the voltage at the node is equal to $V_{TERM}$. In addition, by using the output of the comparator to adjustably activate the transistor array, the '883 patent shows that the voltage at the node may be driven to be approximately equal to the reference voltage, $V_{REF}$.

Knowing the value of $V_{REF}$ and $V_{TERM}$, the current mode driver of the '833 patent therefore provides a binary signaling scheme utilizing a symmetrical voltage swing about $V_{REF}$. Specifically, in a first current state (the "off" state), the current mode driver is not sinking current and the signal line (or bus line) is at a voltage, $V_o = V_{TERM}$, representing a logic "0". In a second current state (the "on" state), the current mode driver is sinking current to drive the voltage on the signal line (or bus line) to be:

$$V_o = V_{TERM} - 2(V_{TERM} - V_{REF}).$$

The second state therefore representing a logical "1."

While the above techniques have met with substantial success, end users of data processing systems, such as computers, continue to demand increased throughput. Whether throughput is expressed in terms of bandwidth, processing speed or any other measure, the bottom line is the desire to get a block of data from point A to point B faster. At the same time, however, it is desirable to achieve such increases without requiring deviation from known semiconductor fabrication techniques.

SUMMARY OF THE INVENTION

In accordance with a first aspect of the present invention, a method for improving resolution of a current mode driver is provided. The current mode driver is operable to provide an output that falls within a predetermined range. The method includes sensing a condition, such as a process condition, a voltage condition and a temperature condition. A full scale current of a digital-to-analog converter is adjusted in accordance with the condition. A current control signal is set based on an output of the digital-to-analog converter.

In one embodiment, the sensing step includes measuring a process, voltage or temperature sensitive DC parameter. In an alternative embodiment, the sensing step includes sensing a process, voltage or temperature sensitive AC parameter.

In accordance with a second aspect of the present invention, a circuit is provided for improving resolution of a current mode driver. A process-voltage-temperature detector is coupled to the current mode driver. The detector includes circuitry for detecting a process condition, a voltage condition, a temperature condition or any combination of the foregoing. The detector further includes circuitry for providing an output indicative of the detected condition(s). The output of the detector may be used to adjust the current mode driver.

In accordance with a third aspect of the present invention, a digital-to-analog converter is provided for improving resolution of a current mode driver. The digital-to-analog converter provides an analog output in response to a digital input. The output is coupled to one or more transistor gates to control a current mode driver. In one embodiment, the digital input represents at least one of a process condition, a voltage condition and a temperature condition. In an alternative embodiment, the digital input is set by a register during current control calibration.

BRIEF DESCRIPTION OF THE DRAWINGS

FIG. 1 is a block diagram of a memory controller, bus and memories utilizing an output driver in accordance with a preferred embodiment of the present invention.

FIG. 2 illustrates a preferred encoding scheme utilizing a multi-level voltage reference for use with a multi-level output driver.

FIGS. 3A and 3B are schematic diagrams of a first and a second multi-level output driver in accordance with embodiments of the present invention.

FIGS. 11A and 11B are a flowchart of a method for calibrating the current control circuitry using the setup of FIG. 10 for the output driver shown in FIG. 9A.

FIG. 12 is an electrical schematic of an on-chip, multi-level reference voltage generator utilizing a resistive voltage divider.

FIG. 13D illustrates alternative embodiments for the differential comparator of FIG. 13B.

FIG. 13E illustrates an electrical schematic of a charge coupled comparator using PMOS capacitors.

FIGS. 14C and 14D are timing diagrams for the circuits of FIGS. 14A and 14B.

DETAILED DESCRIPTION OF THE PREFERRED EMBODIMENT(S)

Figure 4C:
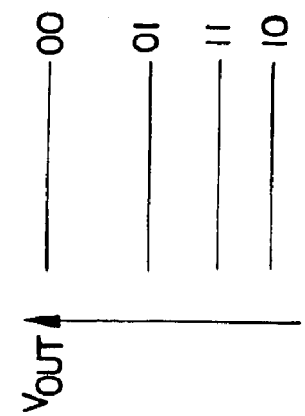
FIGS. 4B and 4C illustrate the effect of $g_{ds}$ distortion on the output voltage of a four-level output driver encoding in binary and gray code, respectively.

In FIG. 1, a bus 320 interconnects a memory controller 321 and memories 322. Thus bus 302 is formed of signal lines 320-1, 320-2 that transmit address, data and control signals. Physically, on each integrated circuit 321, 322, the address, data and control signals are supplied to and output from external connections, called pins, and the bus 320 interconnects respective pins. The bus 320 may be implemented as traces on a printed circuit board, wires or cables and connectors. Each of these integrated circuits 321, 322 has bus output driver circuits 323 that connect to the pins to interface with the bus 320 to transmit signals to other ones of the integrated circuits. In particular, the bus output drivers 323 in the memory controller 321 and in the memories 322 transmit data over the bus 320. Each bus output driver 323 drives a signal line of the bus 320. For example, bus output driver 323-1 in the memory controller 321 drives bus line 320-1. The bus 320 supports signaling with characteristics that are a function of many factors such as the system clock speed, the bus length, the amount of current that the output drivers can driver, the supply voltages, the spacing and width of the wires or traces making up the bus 320, the physical layout of the bus itself and the resistance of a terminating resistor Zo attached to each bus.

At least a subset of the signal lines connect to pull-up resistors Zo that connect to a termination voltage VTERM. In some systems, all signal lines connect to pull-up resistors Zo that connect to the termination voltage VTERM. The termination voltage VTERM can be different from the supply voltage VDD. In one embodiment, the supply voltage VDD is equal to 2.5 volts, the termination voltage VTERM is equal to 1.8 volts, the bus voltage for a signal at low levels VOL is equal to 1.0 volts, and the voltage swing is 0.8 volts. The resistance of the terminating resistors Zo is equal to twenty-eight ohms.

The output drivers 323 are designed to drive the bus 320 with a predetermined amount of current; and the bus receivers 324 are designed to receive the signals sent by the bus drivers 323 on the bus 320. In a device, each bus receiver 324 receives signals from one signal line of the bus 320. The bus receivers 324 are integrating receivers according to the present invention.

In one embodiment, the memories are random access memories (RAMs). In an alternative embodiment, the memories are read-only memories (ROMs). Alternatively, the bus output drivers 323 and bus receivers 324 of the present invention are implemented in other semiconductor devices that use a bus to interconnect various types of integrated circuits such as microprocessors and disk controllers.

In yet another alternative embodiment, the output drivers are implemented in a point-to-point system. Although a bus that uses current mode signaling has been described with respect to FIG. 1, the apparatus and method of the present invention may be used in any signaling system where it is desirable to distinguish between signals having different voltage levels.

Multi-Level Signaling

Referring back to FIG. 1, in previously known implementations of the bus system, signals transmitted on each signal line of the bus have either of two voltage levels representing a binary zero or one for binary digital communication. For example, an output voltage equal to the voltage level VTERM set by the voltage source at one end of the termination resistor Zo may represent a binary zero. And, an output voltage level equal to VTERM−(I*Zo) may represent a binary one, where the output driver circuit 323 sinks an amount of current equal to I. In this way, the bus driver circuits 323 can be implemented as switched current sources that sink current when driving binary one's onto the signal lines. When receiving data, the receiver circuits 324 detect whether the voltage on the signal line is greater than or less than VTERM −0.5(I*Zo), i.e. the midpoint between a logical zero and a logical one, to determine whether the data is a binary zero or one, respectively. In one embodiment, data is transmitted and received on each edge of the system clock to achieve a data rate equal to twice the frequency of the system clock. In an alternative embodiment, data is transmitted once per clock cycle of the system clock.

As used herein, the term multi-level signaling refers to signaling schemes utilizing two or more signal levels. Multi-level signaling may also be referred to herein as multiple level pulse amplitude modulation, or multi-PAM, signaling, because the preferred coding methods are based upon the amplitude of the voltage signal. Although the multi-level signaling of the preferred embodiments will be described with respect to a current mode bus, multi-level signaling can also be used with a voltage mode bus.

In various embodiments of the present invention, the data rate on a bus is increased without increasing either the system clock frequency or the number signal lines. Output drivers generate, and receivers detect, multi-PAM signals that allow multiple (k) bits to be transmitted or received as one of $2^k$ possible voltages or data symbols at each clock edge or once per clock cycle. For example, one preferred embodiment is a 4-PAM system win which two bits are represented by $2^2$ or four voltage levels, or data symbols, and the two bits are transferred at every clock edge by transferring an appropriate one of the four voltage levels. Therefore, the data rate of a 4-PAM system is twice that a binary or 2-PAM system.

Multi-PAM is not traditionally used in multi-drop bus systems due, at least in part, to the lower signal-to-noise ratio that is realized when the voltage range is divided into multiple levels. Prior art memory systems have been implemented as only binary systems. A preferred embodiment allows such systems to be implemented using more than two signal levels.

In FIG. 2, a graph shows one embodiment utilizing a 4-PAM signaling scheme. Specifically, the multi-PAM voltage levels are associated with two-bit binary values or symbols such as 00, 01, 10 and 11. In the embodiment of FIG. 2, the binary values are assigned to voltage levels using Gray coding, i.e. the symbol sequence from the highest voltage level to the lowest voltage level is 00, 01, 11, 10. Gray coding provides the advantage of reducing the probability of dual-bit errors because only one of the two bits changes at each transition between voltage levels. If a received 4-PAM voltage symbol is misinterpreted as an adjacent symbol, a single-bit error will occur.

The y-axis of the graph in FIG. 2 shows the associated 4-PAM output voltages VOUT for each symbol. To provide the appropriate voltage to transmit a 4-PAM symbol, the output driver sinks a predetermined amount of current for that symbol. In particular, each symbol is associated with different amount of current. To transmit the symbol "00", the output driver 323 sinks no current and the signal line is pulled up to VTERM. To transmit the symbol "01", the bus output driver 323 sinks a predetermined amount of current I01 to cause the output voltage VOUT to equal VTERM −⅓ (I·Zo), where I01 is equal to ⅓I. To transmit the symbol "11", the bus output driver 323 sinks a predetermined amount of current I11 to cause the output voltage VOUT to equal VTERM−⅔ (I Zo), where I11 is equal to ⅔ I. to transmit the symbol "10", the bus output driver 323 sinks a predetermined amount of current I to cause the output voltage VOUT to equal VTERM −(I Zo). Further details regarding preferred embodiments of the output driver 323 are provided below.

At 4-PAM receiver identifies a received symbol based on a voltage range or range of voltages associated with that symbol. A set of reference voltage VREFLO, VREFM and VREFHI function as thresholds to define ranges of voltages associated with each 4-PAM symbol. In accordance with a preferred embodiment, the reference voltages VREFLO, VREFM and VREFHI are set at the midpoint voltage between neighboring symbols. For example, the symbol "00" is associated with voltages greater than VREFHI. The symbol "01" is associated with voltages within the range between VREFHI and VREFM. The symbol "11" is associated with a range of voltages from VREFM to VREFLO. The symbol "10" is associated with a range of voltages less than VREFLO. The reference voltages VREFHI, VREFM and VREFLO are threshold voltages from which a multi-PAM data symbol is determined to be one of the four possible data symbols.

4-PAM symbols or signals also allow for direct compatibility with 2-PAM or binary signaling. When operating in 4-PAM mode, the received data bits are compared to the three reference voltages, VREFHI, VREFM and VREFLO to determine the 4-PAM symbol and the associated two bits. Because the most significant bit (MSB) is determined by comparing the received data bit to VREFM, i.e. the MSB is zero for voltages greater than VREFM and the MSB is one for voltages less than VREFM, the multi-PAM system can be used as a 2-PAM system by ignoring the least significant bit (LSB) and using the MSB. Alternatively, to transmit 2-PAM symbols using the gray code of FIG. 2, the LSB is set equal to zero (low), while the MSB determines the output voltage.

Multi-PAM signaling increases the data rate with a small increase in power consumption because the number of input/output (I/O) pins and the system clock frequency may be the same as that used for binary signaling. The major factor in the power consumption of CMOS circuits, for example, is the $CV^2F$ power, which depends directly on the system clock frequency. Therefore, increasing the system clock frequency to increase the data rate directly increases the power consumption. Although some additional power is used for the additional circuitry of the multi-PAM interface, described below, this increase in power is much less than the increase in power that would occur if either the number of I/O pins or the system clock frequency were increased to increase the data rate.

Multi-PAM signaling also increases the data rate without a corresponding increase in the electro-magnetic interference (EMI). If the data rate were increased by increasing the number of I/O pins or by increasing frequency, the EMI would increase proportionally. Because multi-PAM signaling does not increase the number of I/O pins, the EMI does not increase if the total voltage amplitude of the multi-PAM I/O pins remains the same as that used in binary signaling. The total voltage amplitude may be increased to provide greater voltage margin to improve system reliability. Although the EMI would increase correspondingly, the increase would be smaller than that incurred by increasing the number of I/O pins with binary signaling.

Although the circuits described below use 4-PAM signaling, the embodiments described can be explained for use in 8-PAM, 16-PAM and, more generally, N-PAM signaling. Accordingly, it is to be understood that the preferred embodiments are not limited to 4-PAM signaling, but rather may be applied to the general, N-PAM signaling, case.

In FIG. 3A, a 4-PAM output driver circuit 950 is used with current control bits (CCtrl<6:0>) to produce desired output voltage levels over a set of on-chip process, voltage and temperature (PVT) conditions. In the output driver 950, a first driver circuit 952 and a second driver circuit 954 connect to an I/O pin 956. The first driver circuit 952 drives the LSB, while the second driver circuit 954 drives the MSB. The first driver circuit 952 and the second driver circuit 954 have a set of driver blocks 958 that are connected in parallel. Since the driver blocks have the same components, one driver block 958 will be described. Each driver block has a binary weighted driver transistor 960-0 with a width to length (W/L) ratio as shown. The driver transistors 960 of the second driver circuit 954 are preferably twice as large as the driver transistors of the first driver circuit 952 because the second driver circuit 954 drives the MSB while the first driver circuit 952 drives the LSB. In other words, the MSB is driven with twice as much current as the LSB.

In driver block 958, odd and even data bits are multiplexed onto the driver transistors 950 via passgates 962 and an inverter 964. In this embodiment, odd data is transmitted at the rising edge of the clock, while even data is transmitted at the falling edge of the clock. NAND gates 966, 968 connect to current control bit zero <0>, and the LSB Odd Data bit and LSB Even Data bit, respectively. When the respective current control bit zero <0> is high, the NAND gates 966, 968 are responsive to the odd and even data. When the respective control bit is low, the output of the NAND gates 966, 968 is low and driver block 958 does not respond to the data bit. The current control bits provide the specified amount of current to cause the desired voltage swing regardless of the PVT conditions. The circuit of FIG. 3A uses seven current control bits. Techniques for determining the setting of the current control bits are described below.

The passages 962 include two transistor pairs, each pair including a PMOS transistor 972, 974 connected in parallel with an NMOS transistor 976, 978. The clock and clock_b signals connect in an opposite manner to the gates of the transistors of the transistor pair.

Although FIG. 3A shows that the first driver circuit 952 drives the LSB and the second driver circuit 954 drives the MSB, in an alternative embodiment, the first driver circuit 952 drives the MSB and the second driver circuit 954 drives the LSB. Alternatively, any arbitrary coding scheme can be produced by placing combinational logic to combine the data bits before sending the combined data bit to the driver block 958.

Table 1 below shows two 4-PAM encoding schemes that may be implemented using the output driver 950 of FIG. 3A.

TABLE 1

Encoding Schemes

| Coding Scheme | Data Bits (Symbol) to be Transmitted | MSB Input | LSB Input | Output Voltage |
|---|---|---|---|---|
| Binary | 00 | 0 | 0 | VTERM |
| | 01 | 0 | 1 | VTERM − 1/3 (I · Zo) |
| | 10 | 1 | 0 | VTERM − 2/3 (I · Zo) |
| | 11 | 1 | 1 | VTERM − (I · Zo) |
| Gray | 00 | 0 | 0 | VTERM |
| | 01 | 0 | 1 | VTERM − 1/3 (I · Zo) |
| | 11 | 1 | 1 | VTERM − 2/3 (I · Zo) |
| | 10 | 1 | 0 | VTERM − (I · Zo) |

In another embodiment shown in FIG. 3B, a 4-PAM output driver 980 uses current control bits to control switch transistors in series with the output current source transistors, resulting in the desired output voltage levels. Two sets 981-1 and 981-2 of binary weighted transistors 982–986 combine the current control bits with 4-PAM signal generation. The current control bits directly control current-control NMOS transistors 982-2, 984-2, 986-2 that are connected in series with the driver transistors 982-1, 984-1, 986-1, respectively, that receive the LSB and MSB data. For odd data, the driver transistors 982-1, 984-1, 986-1, cause current to flow to the I/O pin 956 when the respective data bit and the clock signal are high, and the associated current control bit is high to place NMOS transistors 982-2, 984-2 and 986-2 in the active state.

The circuit for even data is not shown, but a separate set of the current control NMOS transistors connects in series with a set of driver transistors that respond to the logical "AND" of the respective data bit and the complement of the clock signal Clock_b for even data.

Figure 4B:
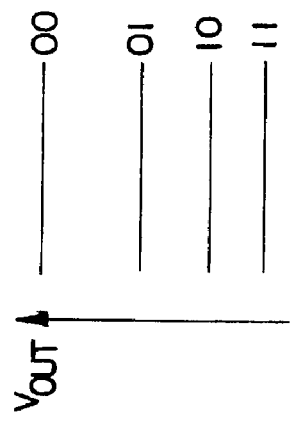
Figure 4A:
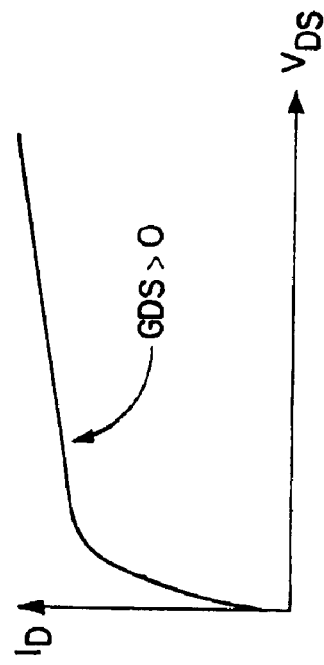
FIG. 4A is a graph showing $g_{ds}$ distortion in a transistor.

The output voltages of the circuits of FIGS. 3A and 3B include gds distortion from the driver transistors. In FIG. 4A, a graph shows gds distortion. The x-axis shows the drain-to-source voltage, and the y-axis shows the drain current. Specifically, gds of a MOS transistors is the change of drain current in response to a change in drain voltage. FIG. 4B and 4C show the data bits, in binary and gray code respectively, and the effect of gds distortion on the output voltage VOUT. In particular, as the output voltage VOUT decreases, the incremental voltage different between adjacent 2-bit pairs decreases. Because of gds distortion, the voltage increments between the 4-PAM voltages are generally not equal.

Figure 5A:
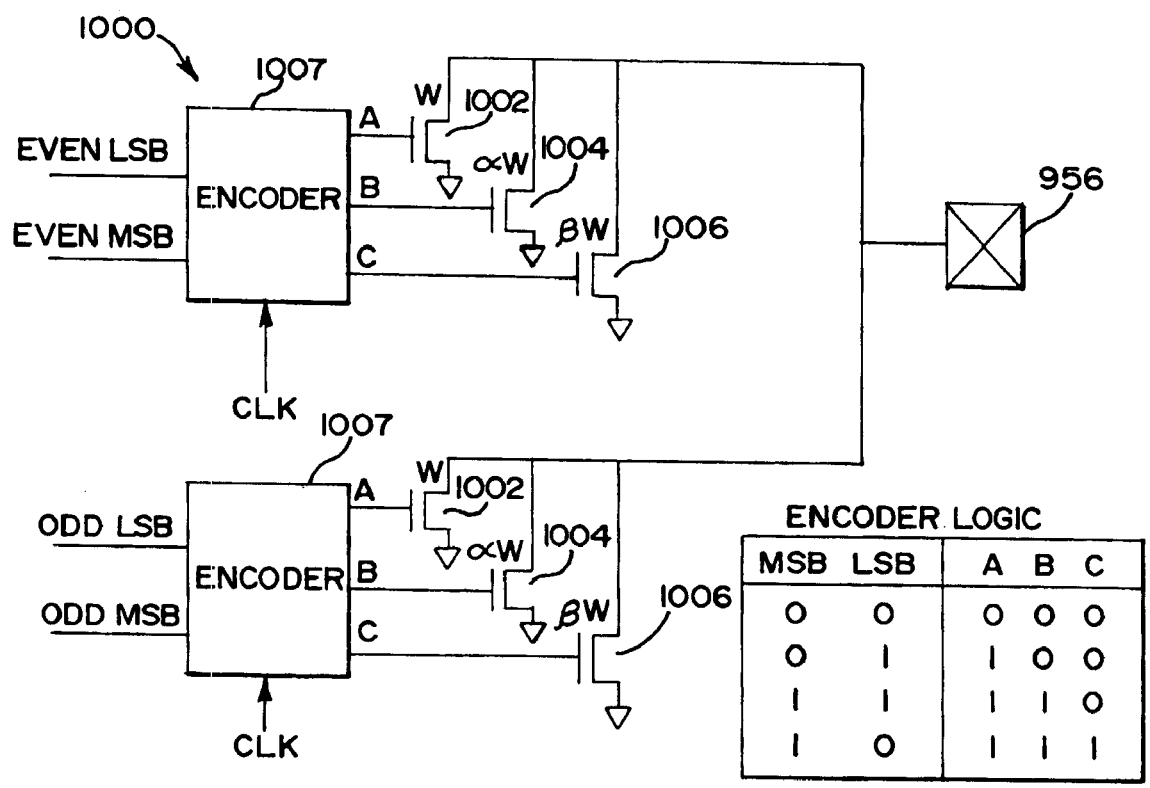
FIG. 5A is an electrical schematic of a multi-level output driver, having a binary generator, that corrects for $g_{ds}$ distortion.

In FIG. 5A, a 4-PAM output driver 1000 that corrects for gds distortion is shown. The output driver 1000 is two-way multiplexed, with the multiplexing occurring at the I/O pin 956. The output driver is of the open-drain type and operated in current-mode, with the output current set by a bias voltage on a current source device coupled in series with each of the transistors 1002, 1004 and 1006. For simplicity the current control transistors are not shown. In accordance with a preferred embodiment, a new output symbol is generated on each rising and falling edge (referred to herein as "odd" and "even," respectively) of the clock.

The gds distortion is eliminated by adjusting the width to length (W/L) ratio of transistors 1004 and 1006 by factors $\alpha$ and $\beta$, such that $\beta > \alpha > 1$ and the incremental voltage difference between adjacent 4-PAM levels is constant. Transistors 1002, 1004 and 1006 have a width to length ratio of W/L, $\alpha$(W/L), and $\beta$(W/L) respectively.

Examples of encoding schemes that may be implemented using the output driver of FIG. 5A are shown in Table 2 below. In accordance with a preferred embodiment, input signals A, B, and C are derived from the MSB and LSB of a symbol to be transmitted to produce the 4-PAM levels as shown in Table 2 below. The encoder of the output driver 1000 uses combinational logic 1007 to produce the A, B and C inputs according to Table 2.

TABLE 2

Mapping of Data Bits to ABC Inputs and Encoding Schemes

| Coding Scheme | Data Bits (Symbol) to be Transmitted | A | B | C | Output Voltage |
|---|---|---|---|---|---|
| Binary | 00 | 0 | 0 | 0 | VTERM |
|  | 01 | 1 | 0 | 0 | VTERM − 1/3 (I · Zo) |
|  | 10 | 1 | 1 | 0 | VTERM − 2/3 (I · Zo) |
|  | 11 | 1 | 1 | 1 | VTERM − (I · Zo) |
| Gray | 00 | 0 | 0 | 0 | VTERM |
|  | 01 | 1 | 0 | 0 | VTERM − 1/3 (I · Zo) |
|  | 11 | 1 | 1 | 0 | VTERM − 2/3 (I · Zo) |
|  | 10 | 1 | 1 | 1 | VTERM − (I · Zo) |

Figure 5B:
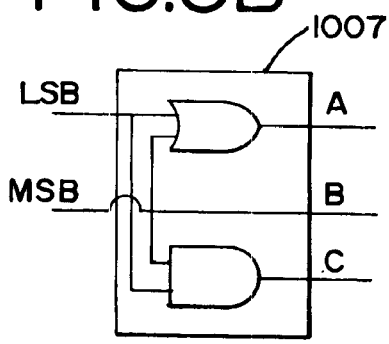
FIGS. 5B and 5C are an electrical schematic of an alternate embodiment of the binary generator shown in FIG. 5A.

A binary encoder 1007 is illustrated in FIG. 5B. In the encoder 1007, an OR gate 1008 generates the A signal by performing an OR operation between the LSB and MSB. The B input is the MSB. An AND gate 1009 generates the C signal by performing an AND operation between the LSB and MSB.

Figure 5C:
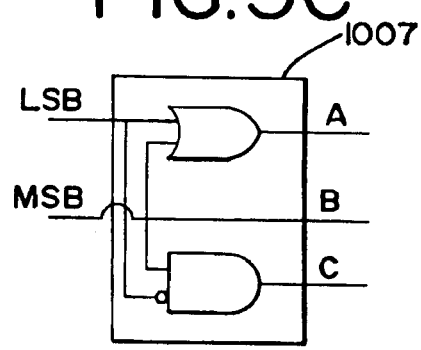

In FIG. 5C, an alternative preferred encoder 1007 encodes the LSB and MSB using Gray code. The encoder 1007 of FIG. 5C is the same as the encoder 1007 of FIG. 5B except that, to generate the C signal, the AND gate 1009a receives the complement of the LSB rather than the LSB.

Figure 9A:
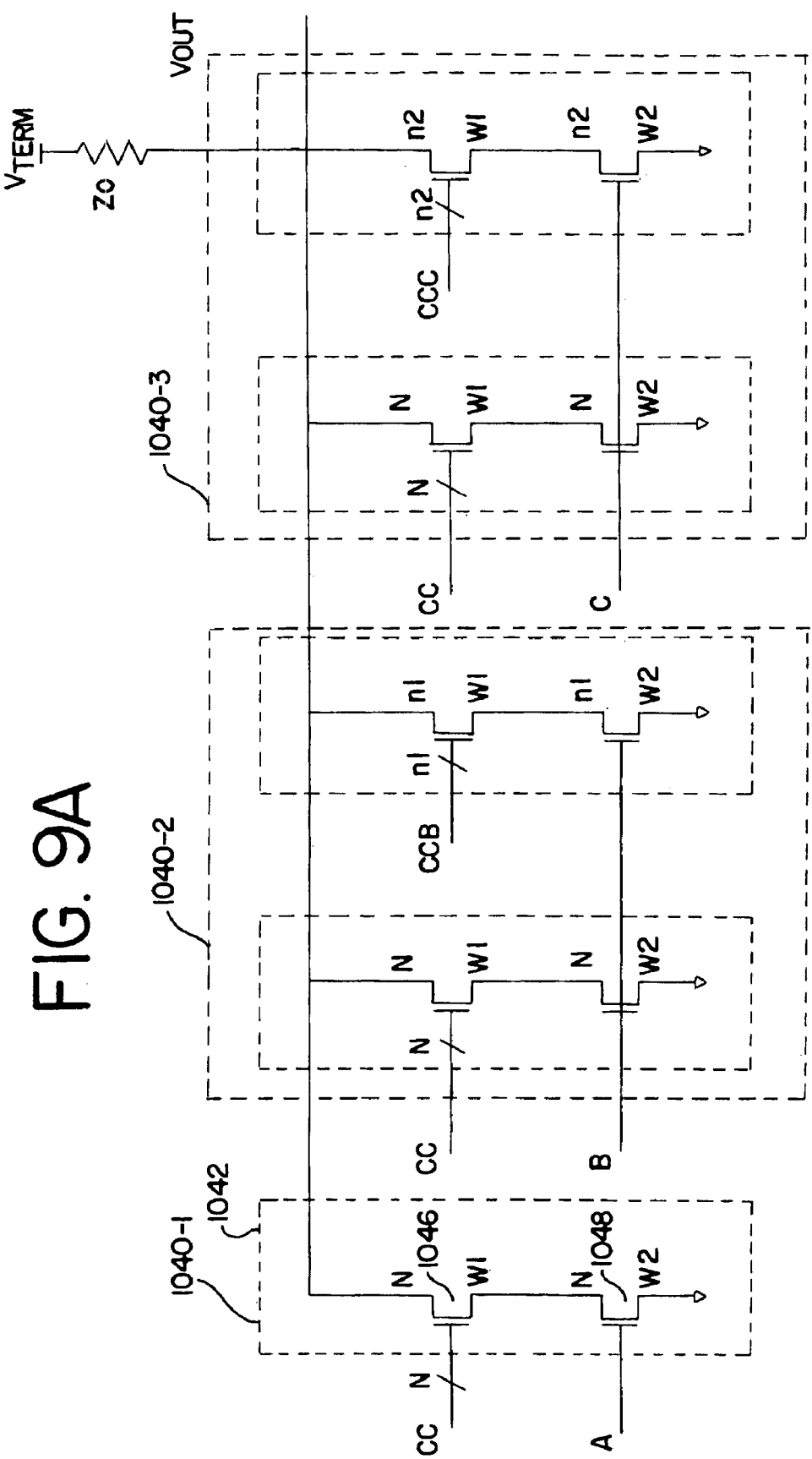
FIG. 9A is an electrical schematic of a $g_{ds}$ compensated, multi-level output driver with current control circuitry.
Figure 9B:
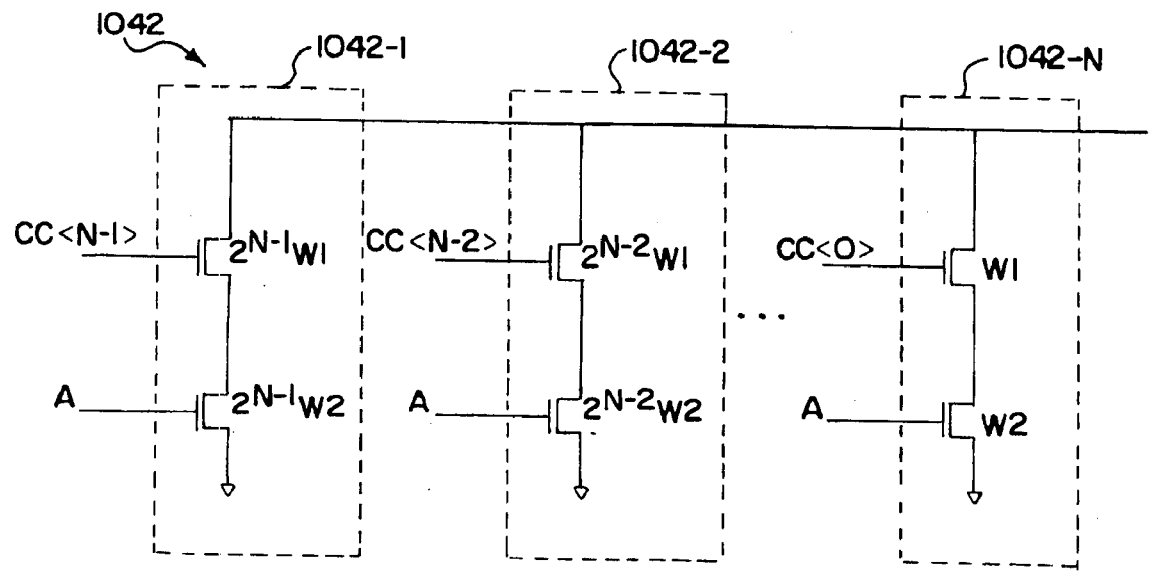
FIG. 9B is an electrical schematic of a set of stacked transistor pairs for a current drive block, such as the current drive blocks shown in FIG. 9A.
Figure 9C:
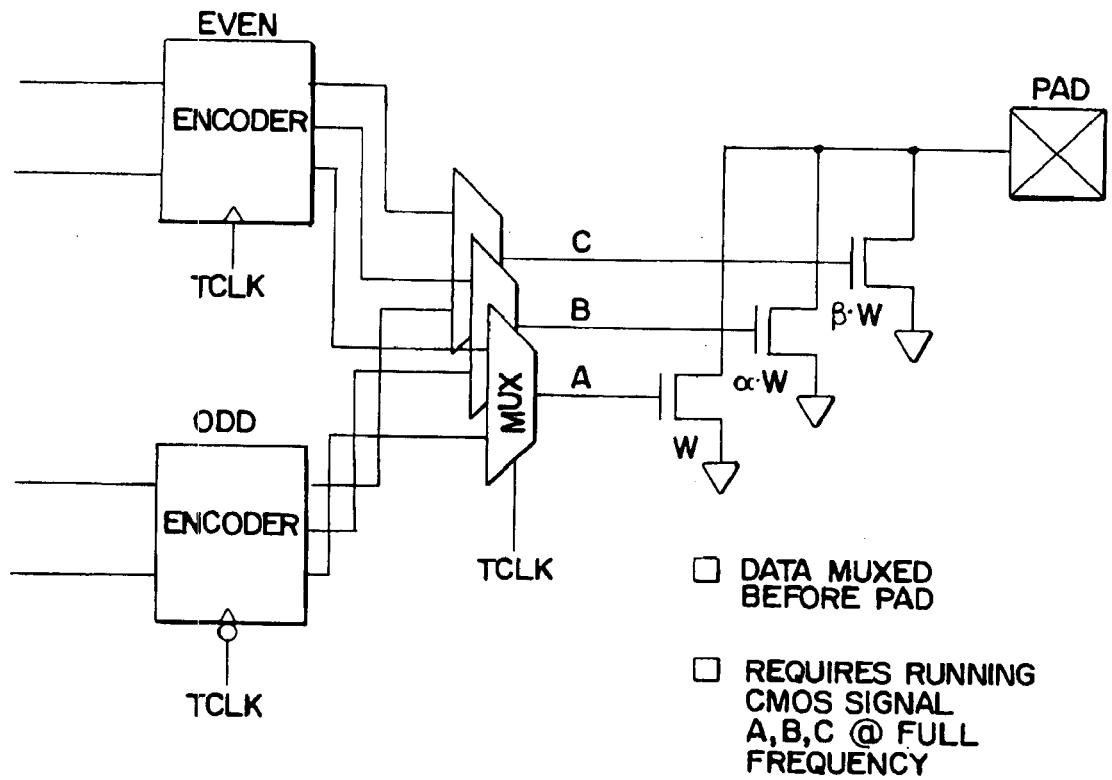
FIG. 9C is an electrical schematic of a preferred $g_{ds}$ compensated, multi-level output driver.

In FIG. 9C, an alternative preferred embodiment of the gds compensated output driver is shown. In this embodiment, the output driver has separate odd and even symbol encoders, with the encoder outputs being multiplexed at the gates of the output transistors.

On-chip, single-ended output drivers, as shown in FIGS. 3A and 3B generate switching noise. For example, when the transistors in the output driver transition from sinking no current such as when driving the "00" symbol, to sinking maximum current such as when driving the gray-coded "10" symbol, the current surges through the I/O pin 956 and through a ground pin. The path between I/O pin 956 and ground has inherent inductance that opposes the current surge and produces significant switching noise (i.e., ground bounce). Because the voltage margins for multi-PAM signaling are less than the voltage margins for binary signaling, switching noise may cause decoding errors.

Figure 6:
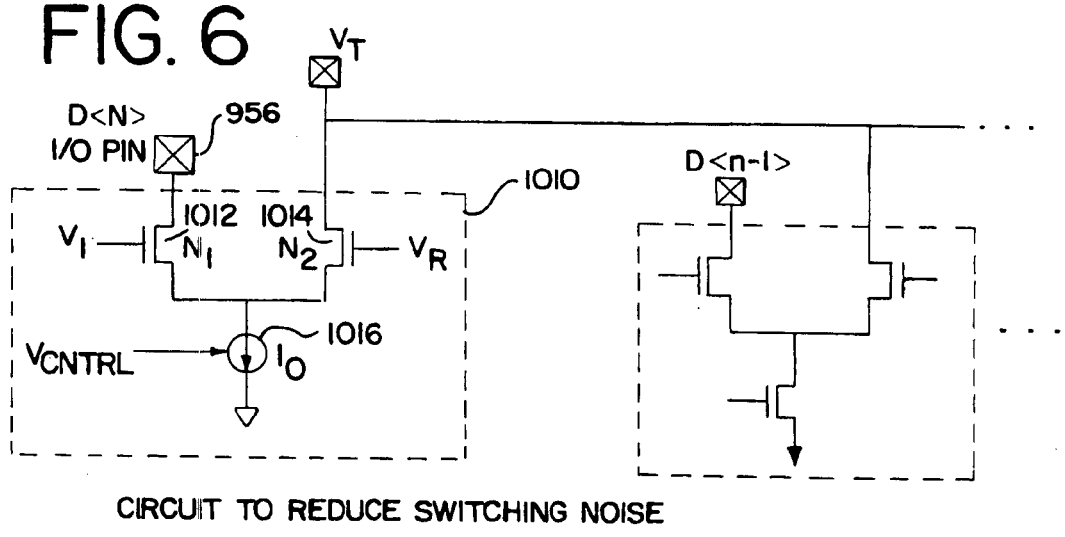
FIG. 6 is an electrical schematic of a circuitry to reduce switching noise at an output pin.

To reduce sensitivity to switching noise, output drivers can provide a constant or semi-constant current to ground regardless of the output current being driven. As shown in FIG. 6, each single-ended transistor branch 960 (FIG. 3A) and 986 (FIG. 3B) in the output drivers of FIGS. 3A and 3B is replaced with a differential pair 1010.

When the output driver sinks output current from the I/O pin 956, current is steered through transistor N1 1012 to ground. When transistor N1 1012 is inactive, transistor N2 1014 becomes active to allow the same or substantially the same amount of current to flow to ground. In this way, a substantially constant amount of current continuously flows to ground to eliminate a large portion of the output driver switching noise and provide a quieter on-chip ground, thereby improving the performance of the 4-PAM signaling. The signal Vi, is the signal that drives transistor N1 1012. Alternatively, the signal VR that drives transistor N2 1014 is a reference voltage between ground and Vi. In response to an input voltage VCntrl, the current source 1016 sinks a predetermined current Io to ground.

Figure 7:
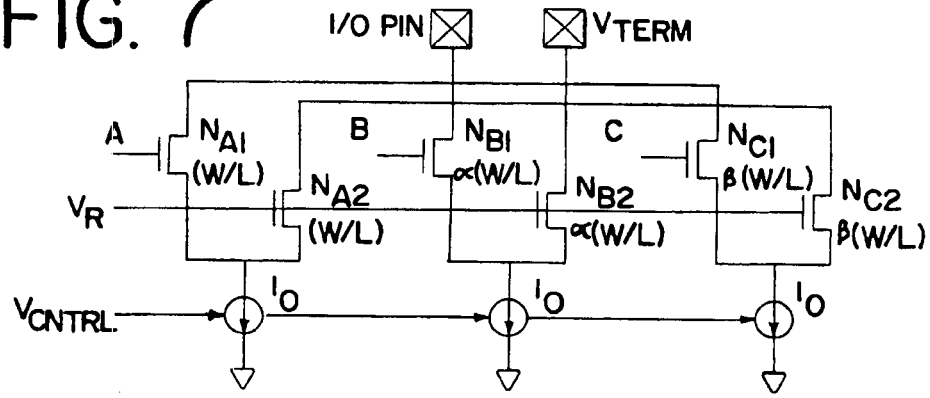
FIG. 7 is an electrical schematic of a multi-level driver, such as the driver shown in FIG. 5A, that further incorporates a circuit to reduce switching noise, such as the circuit shown in FIG. 6.

FIG. 7 is another embodiment of a multi-PAM output driver that combines the circuit of FIG. 5A, which eliminates gds distortion, with the circuit of FIG. 6 to reduce sensitivity to switching noise.

Figure 8:
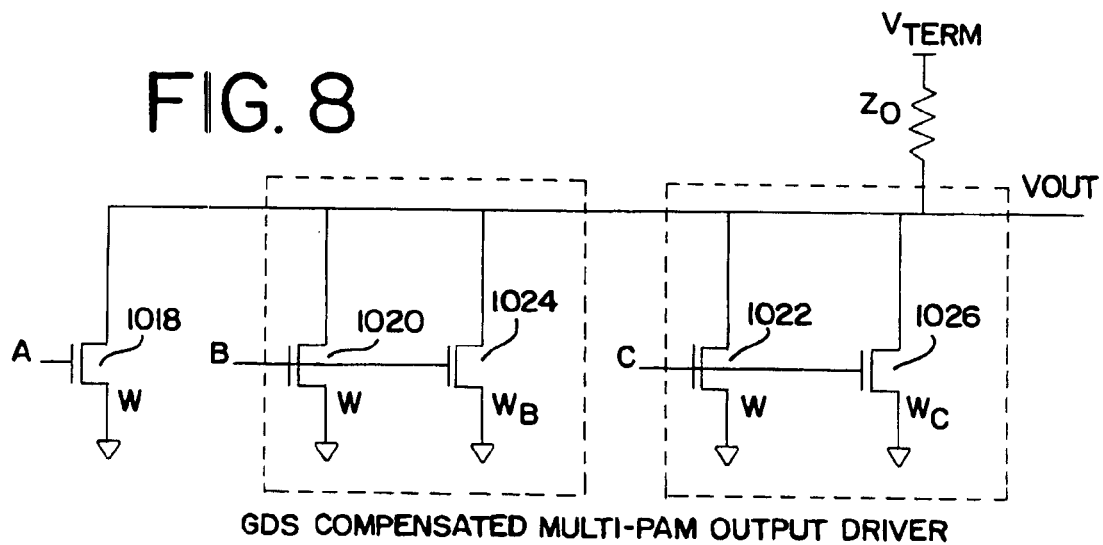
FIG. 8 is an electrical schematic of another alternative $g_{ds}$ compensated, multi-level output driver.

In FIG. 8, yet another gds compensated 4-PAM output driver is shown. In the 4-PAM output driver, the A, B, and C signals drive equal-sized NMOS transistors 1018, 1020, 1022 having width W. In accordance with a preferred embodiment, signals B and C also drive NMOS transistors 1024, 1026 of width WB and WC, respectively, to compensate for gds distortion. The widths of the NMOS transistors 1024 and 1026, WB and WC, respectively, are chosen such that the different between output levels for adjacent bits is substantially the same, such as ⅓ (I·Zo). The widths of the transistors 1018–1026 may therefore have the following relationship:

W+WC>W+Wb>W

In FIG. 9A, a 4-PAM output driver corrects the gds distortion and provides current control. As described above, the signals A, B and C preferably determine the output voltage or symbol in accordance with the gray-cooled binary signaling shown in Table 2, above. In addition, three sets of current control calibration bits, CC, CCB and CCC, respectively determine the amount of current supplied by the output driver for various combinations of A, B and C. The first set of control bits CC provides primary current control, while the second and third sets of current control bits, CCB and CCC, respectively, fine tune the amount of current. The first set of current control bits CC has N bits; the second set of current control bits CCB has n1 bits; and the third set of current control bits CCC has n2 bits. In one embodiment, the relationship between the numbers of current control bits is as follows:

$n1 > n2 < N$.

There may be different relationships between N, n1 and n2 is alternative embodiments.

Each of the A, B and C signals is associated with a current drive block 1040 to drive a predetermined amount of current associated with the symbol. Each current drive block 1040 includes one or more sets of stacked resistor pairs 1042 that are associated with each set of current control bits for that current driver block 1040. For example, the current drive block 1040-1 that drives the A signal receives current control bits CC. The current drive block 1040-2 that drives the B signal receives current control bits CC and CCB. The amount of current supplied by current drive block 1040-2 is adjusted for gds distortion using the CCB bits. The current drive block 1040-3 that drives the C signal receives current control bits CC and CCC. The amount of current supplied by current drive block 1040-3 is adjusted for gds distortion using the CCC bits.

Referring also to FIG. 9B, a set of stacked transistor pairs 1042 is shown. Each stacked transistor pair 1042 includes two NMOS transistors 1046, 1048 connected in series. The lower NMOS transistor 1046 connects to the one of the A, B, or C signals associated with the current drive block 1040. The upper NMOS transistor 1048 connects to a current control bit. The lower NMOS transistor 1046 is preferably wider than the upper NMOS transistor 1048. Because there are N current control bits, there are N stacked transistor pairs. For example, the current control block 1040 has N stacked transistor pairs 1042-1 to 1042-N, and each stacked transistor pair connects to one of the current control bits, CC <0> to CC <N-1>.

The transistors of the stacked transistor pairs are binary weighted with respect to minimum width of W1 for the upper transistors and W2 for the lower transistors. The widths W1 and W2 may be chosen to determine output characteristics such as output resistance and capacitance.

Generally the widths W1 and W2 are chosen such that W1 is less than W2.

Although drawn to illustrate the circuit for the CC current control bits, the circuit diagram of FIG. 9B also applies to the sets of stacked transistor pairs associated with the CCB and CCC current control bits.

Figure 10:
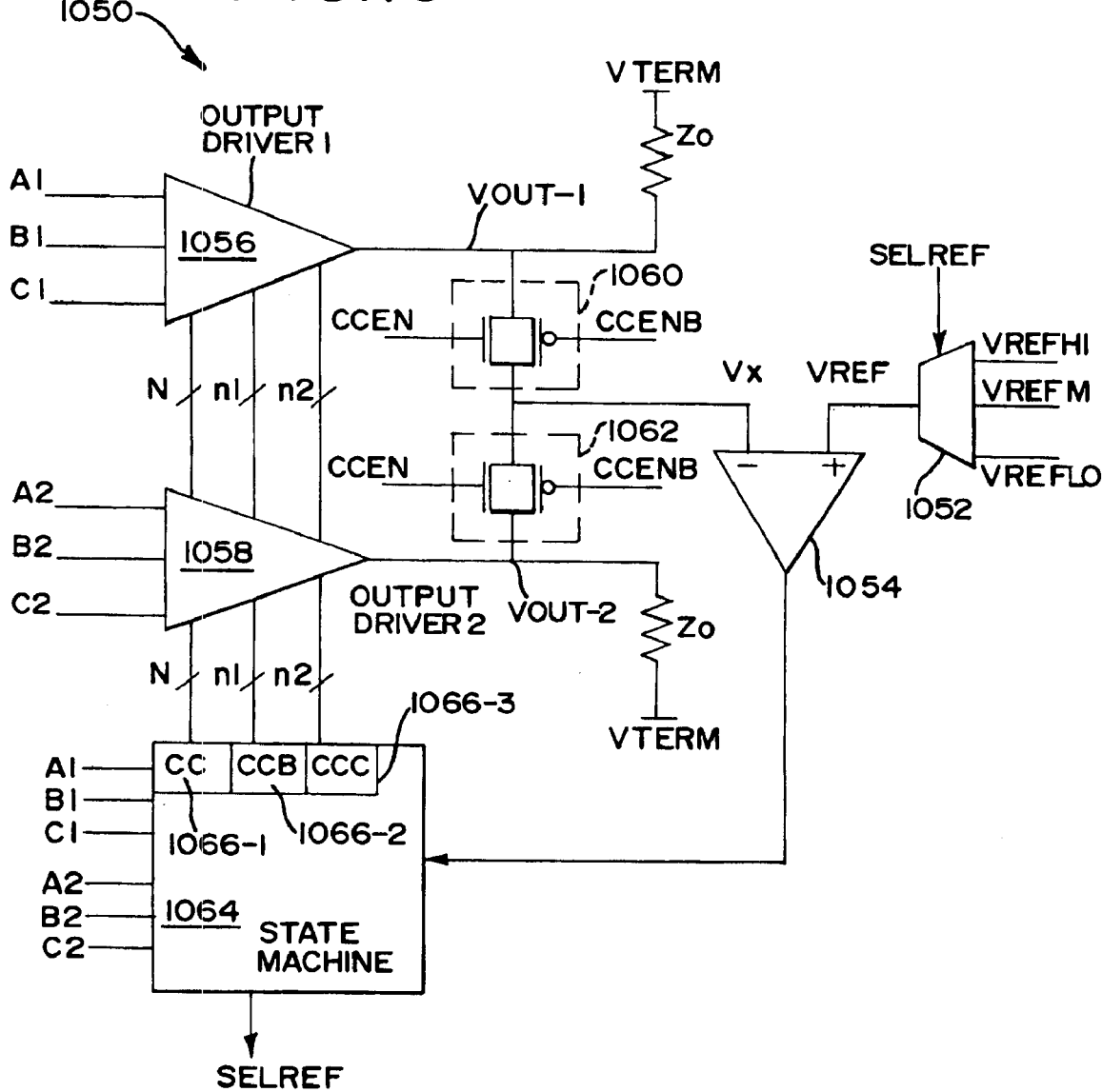
FIG. 10 is an electrical schematic of a circuit for calibrating a $g_{ds}$ compensated output driver with current control circuitry.

As shown in FIG. 10, a current control calibration circuit 1050 determines the settings for the current control bits CC, CCB and CCC by selecting a current control reference voltage, VREF, and comparing the current control reference voltage, VREF, to a voltage at a mid-point between two calibration output voltages, VOUT-1 and VOUT-2. The current calibration circuit 1050 determines settings for each of the sets of current control bits CC, CCB and CCC for each 4-PAM output voltage such that VOUT-1 and VOUT-2 provide each adjacent pair of voltage levels to the circuit.

A multiplexor 1052 receives the three 4-PAM reference voltages VREFHI, VREFM and VREFLO. A select reference voltage signal, SelRef, selects one of the referenced voltages as the selected current control reference voltage, VREF. A comparator 1054 comprises the selected current control reference voltage VREF to a mid-point voltage Vx and generates a comparison signal.

To generate the mid-point Vx, output driver 1 1056 sinks a first amount of current to provide the first output voltage VOUT-1 and output diver 2 1058 sinks a second amount of current to provide the second output voltage VOUT-2. Two passgate pairs 1060, 1062, in response to a current control enable and its complementary signal, act as a resistor divider to provide the midpoint voltage, Vx, between the first output voltage, VOUT-1, and the second output voltage, VOUT-2.

A state machine 1064 includes first, second and third counters, 1066-1, 1066-2 and 1066-3 that provide the first, second and third sets of current control bits, CC, CCB and CCC, respectively. If the comparison signal indicates that the midpoint signal Vx is greater than the reference voltage VREF, the state machine 1064 increments an associated set of current control bits by one to increase the amount of current that is sink by the output driver, thereby decreasing the midpoint voltage. If the midpoint voltage signal Vx is less than the current control reference voltage, VREF, the state machine 1064 decrements the associated current control bits by one, thereby increasing the midpoint voltage.

In one embodiment, the current control bits are calibrated during a power-up sequence. The theory of operation for calibrating the current control bits is as follows. The first set of current control bits CC provides the primary amount of current control for each current control block 1040. To compensate for gds distortion, the CCB and CCC current control bits fine tune the amount of current associated with the Gray-coded "11" and "10" signals, respectively. The current control bits are preferably calibrated in the following order: CC, CCB, then CCC.

In alternative embodiments, the current control bits may be calibrated after power-up in response to triggering events, e.g., lapse of a period of time, a change in ambient temperature, a change in power supply voltage, or in response to a threshold number of errors.

Referring also to FIG. 4B, the first and main set of current control bits CC are set using the voltage differences between the "00" and "01" symbols. The first set of current control bits CC are set to provide a mount of current to provide the output voltage for the "01" symbol such that VREFHI is placed at the midpoint between the output voltage for the "00" symbol and the output voltage for the "01" symbol.

As shown in FIG. 4B, because of gds distortion, without compensation, the voltage difference between the "01" symbol and the "11" symbol is less than the voltage difference between the "00" symbol and the "01" symbol. To compensate for the gds distortion, the output voltage for the "11" symbol is decreased by increasing the amount of current sunk by the output driver. The second set of current control bits CCB are set to increase the current sunk by the output driver such that the output voltage becomes equal to the desired voltage level when the midpoint voltage between output voltage for the "01" and "11" is equal to VREFM.

Finally, the third set of current control bits CCC is adjusted such that the midpoint voltage between output voltage for the "11" and "10" symbols is equal to VREFL.

Figure 11A:
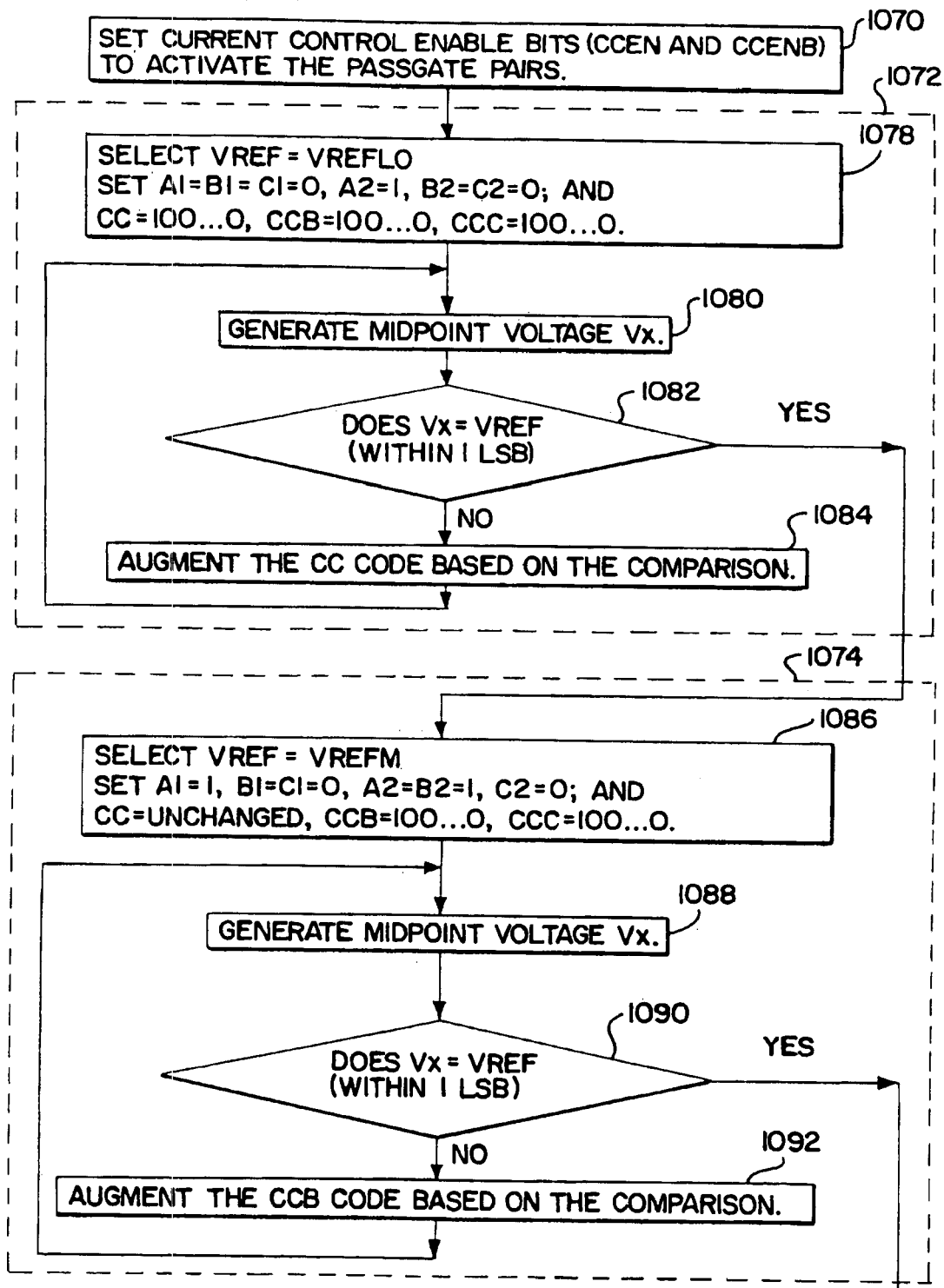

Referring to FIGS. 10, 11A and 11B, the operation of the circuit 1050 including the state machine 1064 will be described. The flowchart of FIGS. 11A and 11B uses gray coded output voltages. In step 1070, the current control enable signal (ccen) and its complement (ccenb) are set to activate the passgate pairs 1060 and 1062 and output the midpoint voltage Vx, described above.

Three major blocks of steps 1072, 1074 and 1076 set the current control bits, CC, CB and CCC, respectively.

In block 1072, step 1078 sets the initial conditions for determining the settings for the first set of current control bits CC. The state machine 1064 outputs the select reference voltage signal (SelRef), which causes the multiplexor 1054 to output the reference voltage VREFHI to the comparator 1054. A "00" symbol is supplied to output driver 1 1056 by outputting multi-PAM bit selection signals A1, B1 and C1 with values of zero. A "01" symbol is supplied to output driver 2 1058 by outputting multi-PAM bit selection signals A2 with a value of one, and B2 and C2 with a value of zero. The initial state of the first, second and third current control bits is as follows:

CC={1 0 0 . . . 0};

CCB={1 0 0 . . . 0}; and

CCC={1 0 0 . . . 0}.

The current control bits are initially set such that the stacked transistor pair sinking the most current will be activated.

In step 1080, the output drivers 1 and 2 output the voltages corresponding to the symbols "00" (the Vterm reference) and "01" (the drive level under calibration) and the midpoint voltage Vx is generated. In step 1082, the comparator 1054 compares the midpoint voltage Vx to the selected reference voltage VREFHI. When the midpoint voltage is within one least significant bit of the reference voltage VREFHI, the first set of current control bits have the proper setting. The state machine 1058 determines that the midpoint voltage Vx is within one least significant bit of the reference voltage VREFHI when the current control bits begin to dither between two settings. In other words, the output of the comparator will alternate between a zero and a one.

In step 1084, when the midpoint voltage Vx is not within one least significant bit of the reference voltage VREFHI, the state machine 1064 augments the first set of current control bits depending on the result of the comparison. The term "augment" is used to indicate either incrementing or decrementing the current control bits. The process proceeds to step 1080.

If, in step 1082, the state machine 1064 determines that the midpoint voltage Vx is within one least significant bit of the reference voltage, the process proceeds to step 1086 to calibrate the second set of current control bits, CCB.

In step 1086, the initial conditions for calibrating the second set of current control bits CCB are set. The state machine 1064 outputs the select reference voltage signal (SelRef), which causes the multiplexor 1054 to output the reference voltage VREFM to the comparator 1054. A "01" symbol is supplied to output driver 1 1056 by outputting multi-PAM bit selection signals A1 with a value of one, and B1 and C1 with values of zero. A "11" symbol is supplied to output driver 2 1058 by outputting multi-PAM bit selection signals A2 and B2 with a value of one, and C2 with a value of zero. The state of the first set of current control signals CC remains unchanged. The initial state of the second and third sets of current control bits, CCB and CCC, respectively, is as follows:

CCB={1 0 0 ... 0};

CCC={1 0 0 ... 0}.

In step 1088, the output drivers 1 1056 and 2 1058 output the voltages corresponding to the symbols "01" (the level calibrated in step 1072) and "11" (the level now under calibration), and the passage pairs 1060, 1062 output the midpoint voltage Vx. In step 1090, the comparator 1054 compares the midpoint voltage Vx to the selected reference voltage VREFM. When the midpoint voltage is not within one least significant bit of the reference voltage VREFM, as described above with respect to VREFHI, in step 1092, the state machine 1064 augments the second set of current control bits CCB by one and the process repeats at steps 1086.

When the midpoint voltage is within one least significant bit of the reference voltage VREFM, as described above with respect to VREFHI, the second set of current control bits CCB have the proper setting and the process proceeds to step 1094 to calibrate the third set of current control bits, CCC.

In step 1094, the initial conditions for calibrating the third set of current control bits CCC are set. The state machine 1064 outputs the select reference voltage signal (SelRef), which causes the multiplexer 1054 to output the reference voltage VREFLO to comparator 1054. A "11" symbol (calibrated in step 1074) is supplied to output driver 1 1056 by outputting multi-PAM bit selection signals A1 and B1 with a value of one, and C1 with a value of zero. A "10" symbol (the level now under calibration) is supplied to output driver 2 1058 by outputting multi-PAM bit selection signals A2, B2 and C2 with a value of one. The state of the first and second sets of current control signals CC and CCB, respectively, remains unchanged. The initial state of the third sets of current control bits CCC is as follows:

CCC={1 0 0 ... 0}.

In step 1096, the output drivers 1 1056 and 2 1058 output the voltages corresponding to the symbols "11" and "10" and the passage pairs 1060, 1062 output the midpoint voltage Vx. In step 1098, the comparator 1054 compares the midpoint voltage Vx to the selected reference voltage VREFLO. When the midpoint voltage is not within one least significant bit of the reference voltage VREFLO, as described above with respect to VREFHI, in step 1100, the state machine 1064 augments the third set of current control bits CCC by one and the process repeats at step 1094.

In step 1098, when the midpoint voltage is within one least significant bit of the reference voltage VREFLO, the appropriate settings for the first, second and third sets of current control bits, CC, CCB and CCC respectively are determined and the calibration is complete.

For the foregoing embodiment, a sequential search is described: starting at an initial value and augmenting. It should be emphasized, however, that alternative search techniques known to those skilled in the art may be used. For example, without limiting the foregoing, successive approximation using a binary search may be used. As a further, although less desirable because it is hardware intensive, alternative, a direct flash conversion may be used.

As described above, the current control bits may be augmented until the output of a current control calibration circuit dithers. The resolution of the current mode driver, as that term is used herein, therefore corresponds not only to the number of current control bits that are used but also to the voltage swing that the current mode driver provides. In other words, once the current control calibration circuit locks onto the proper output voltage level, the output voltage level will be dithering within a tolerance range, where the tolerance range is proportional to the minimum current step size of the current control circuit.

It has been observed that certain conditions, including process variation, supply voltage variation and temperature variation, may affect the current that is available from a current mode driver. One approach to compensating for such considerations is to calibrate the output driver so that, at the worst case conditions and with the current control bits set to their maximum, full scale count, the output driver provides at least the minimum required current, Imin. For an embodiment in which each augmentation of the current control bits results in a ratiometric step-size change in current, the current change associated with a change in the least significant bit ("LSB") of the current control bits, LSB(I), may be represented as:

$$LSB(I)=Imin/2^N-1,$$

where N is the number of current control bits. The corresponding voltage, LSB(V), is:

$$LSB(V)=Vmin/2^N-1,$$

where Vmin=Imin * Rterm.

Figure 16:
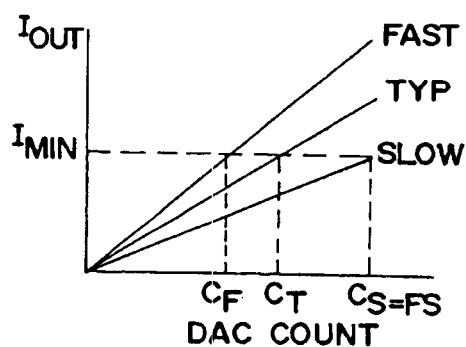
FIG. 16 illustrates output current as a function of the current control bit count for three sets of conditions: slow, typical and fast.

A shortcoming of this approach, however, is that the absolute LSB step size increases as the output driver current capability increases. FIG. 16 illustrates output current as a function of the current control bit count for three sets of conditions: slow, typical and fast. As shown, whereas Imin is provided at the full scale count under worst case conditions, i.e. the slow condition (minimum current drive capability), the output current is greater than Imin under the typical and fast conditions, at the same current control bit count. This results in an increase in LSB(I) under the typical and fast conditions, thereby resulting in a corresponding decrease in resolution of the current mode driver under such conditions.

In a multi-PAM system, it is desirable that the current step LSB(I) associated with the LSB of the current control bits be very small in comparison to the change in current between logic levels. Therefore, in accordance with a preferred embodiment of the present invention, a method is provided for improving the resolution of the current mode driver. A preferred method causes the full scale current under typical and fast conditions to be set closer to the full scale current under slow conditions. This not only results in improved resolution by reducing LSB(I) under typical and fast conditions, but also provides the benefit of reducing the variation of LSB(I) as conditions vary.

Figure 17:
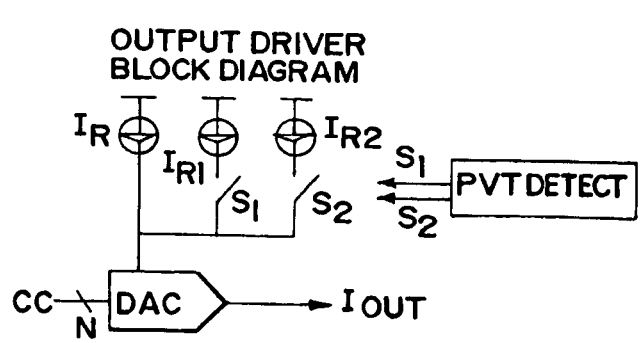
FIG. 17 is an electrical schematic of an output driver in accordance with a preferred embodiment.

FIG. 17 is an electrical schematic of an output driver in accordance with a preferred embodiment. The output driver includes a reference current source 2000 that is coupled to a current control digital-to-analog converter ("DAC") 2010. The DAC 2010 is also coupled to receive an N-bit current control signal, CC. The DAC 2010 provides an output current, Iout, whose value is dependent upon the current supplied by the reference current source 2000 and the current control signal, CC.

A process-voltage-temperature ("PVT") detector 2020, further described below, provides control signals, S1 and S2, to the reference current source 2000. The control signals S1 and S2 are utilized to adjust the reference current, Iref, supplied by the reference current source 2000 to the DAC 2010 in accordance with the PVT conditions. For example, as illustrated in FIG. 17, the control signals S1 and S2 may control switches, such as FET switches, to alter the reference current, Iref, in accordance with:

Iref=Ir+S1×Ir1+S2×Ir2, where S1, S2={0,1} and,

LSB(I)=Iref/$2^N$–1.

As an example of the concern raised by PVT variations, consider a 4-PAM system utilizing an encoding scheme as shown in FIG. 2 and having a 800 mV total voltage swing. In this case, the difference between logic levels is approximately 266 mV and the voltage difference between the logic levels and the closest reference voltage is approximately 133 mV. For a system that is using seven bits for the current control signal (CC<6:0>), i.e. N=7, the LSB(V) is 800 mV/127, or 6.3 mV.

A typical spread for a CMOS process results in a 2.5:1, or even a 3:1, variation in the output driver current from the fast to slow process corners. The term process corner, as used herein, refers to an N-dimensional space where each axis represents a range of values for some process parameter: e.g. threshold voltage, mobility, oxide thickness, etc. A wafer with nominal parameters would represent a point in the center of this N-dimensional space, while a wafer with a combination of anomalous (large deviation from average) parameters would be a point in the corner of this space. Process corners are readily visualized in 2D and 3D space.

The spread in process characteristics is of concern in multi-PAM systems. For example, using the 2.5:1 ratio, the LSB(V) for the fast extreme of the system in the preceding example would be 2.5*6.3 mV, or 15.75 mV. Using a current control loop that has an inherent dither, the magnitude of the dither may be as much as +/− LSB(V), or 31.5 mV peak-to-peak. This value is more than 10% of the 266 mV separation between logic levels.

The preferred embodiments therefore provide a way to control the dither under various PVT conditions, such that, in the foregoing example, the dither may be as low as +/−6.3 mV under all PVT conditions. A further advantage of the preferred embodiments is increased yield. Specifically, the ability to control the dither under all PVT conditions may allow circuits to be used that would otherwise be characterized as unacceptably fast or slow.

Figure 18:
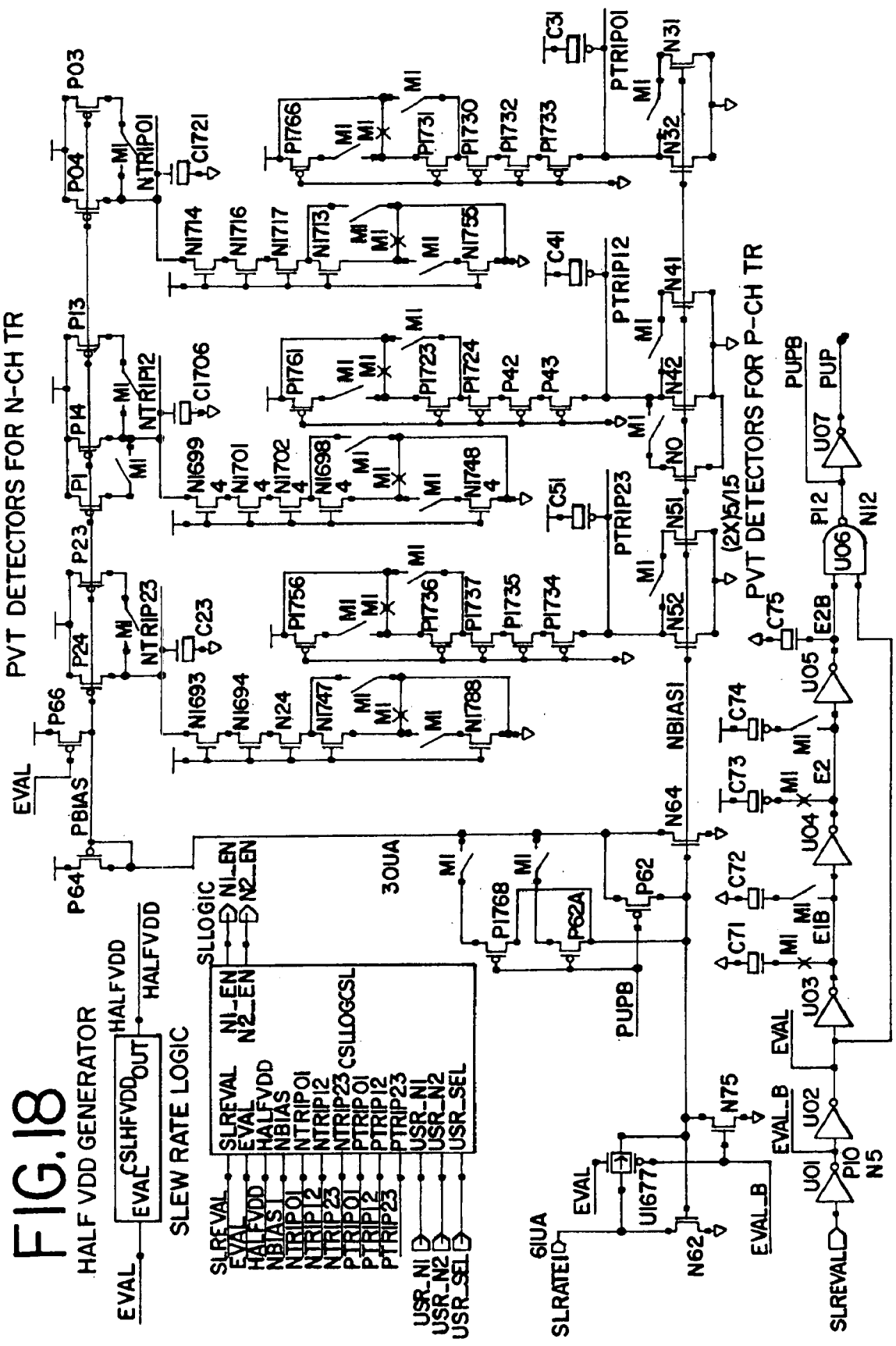
FIG. 18 is an electrical schematic of a first preferred embodiment of a PVT detector.

Referring now to FIG. 18, a first preferred embodiment of a PVT detector 2020 is shown. The PVT detector 2020 includes an input current mirror 2030 that is coupled to an array of NMOS current sources 2040 and an array of PMOS current sources 2050. Each of the current sources 2040 and 2050 drives current into a predetermined load 2060, which for example may be a MOS resistor of a predetermined size. The current sources 2040 and 2050 are preferably weighted, such as by scaling the width or the width-to length ratio of the transistors, to drive correspondingly weighted current values into the loads 2060. An output 2070, representing the voltage drop across the load, is provided.

The PVT detector 2020 of FIG. 18 operates as follows. A current, which is independent of PVT conditions, is applied to the input current mirror 2030 at, for example, pin 2080. The PVT independent current may for example be generated from a bandgap reference (not shown), which is a device that is well known to those skilled in the art. The current is mirrored by the current mirror 2030 to the current sources 2040 and 2050, which in response drive current into the respective loads 2060. The loads 2060 are responsive to PVT conditions. That is, the corresponding resistive value of the MOS resistors shown in FIG. 22 will vary in accordance with the PVT conditions. Each of the loads 2060 provides a corresponding output 2070.

The outputs 2070 are preferably coupled to a logic circuit 2090. The logic circuit 2090 decodes the outputs 2070 to determine whether the circuit is "fast," "normal" or "slow." For example, if the PVT conditions are fast, the resistive value of the MOS resistor loads 2060 will be low and all of the outputs 2070 will be small. As a further example, if the PVT conditions are slow, then the resistive value of the loads 2060, and the corresponding outputs 2070, will be high. As described above, the conductance of the FETS may vary over a 2.5:1~3:1 range. For a nearly constant current as provided by the bandgap reference, the voltage drop across any of the three legs will vary by the same range (i.e. approximately 2.5:1~3:1). A thermometer code may be used, for example, to decode the outputs 2070. For a fast process, the voltage drop across all the loads 2060 may be low and hence detected as logic low. For a slow process, one or more of the voltage drops across the loads 2060 may be higher and therefore detected as logic high. The logic circuit 2090 therefore senses the PVT conditions based on the outputs 2070 and provides a corresponding current control signal—for example, setting the control signals S1 and S2 in accordance with the state of the outputs 2070.

Figure 19A:
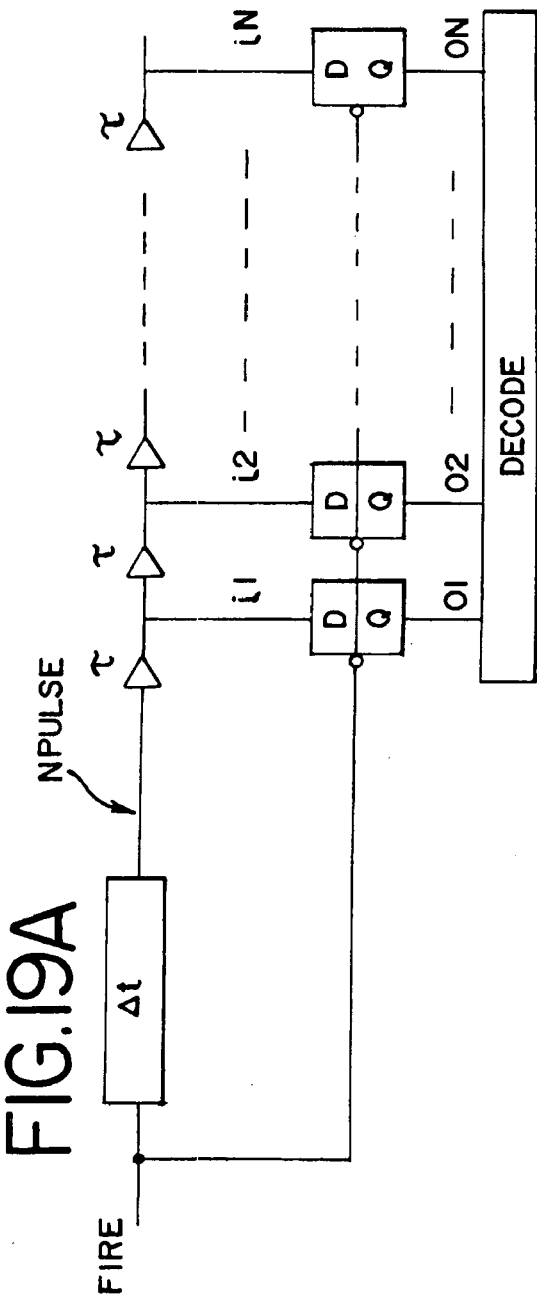
FIG. 19A is a schematic diagram of a second preferred embodiment of a PVT detector.

FIG. 19A is a schematic diagram of a second preferred embodiment of a PVT detector 2020. The PVT detector 2020 includes a delay line 2100 followed by a series of delay stages 2110. An output of each delay stage 2110 is coupled by a latch 2120 to a decoder 2130.

In operation, the latches 2120 are initially cleared by a reset signal. A first signal, preferably a pulse having a predetermined duration, is generated. For example, the fire signal may have a duration of 2.5 clock cycles, which for a 400 MHz Rambus system, corresponds to approximately 6.25 nsec. The signals are preferably full swing CMOS, although other implementations and pulse durations may alternatively be used. The fire signal is preferably derived from, for example, an external clock, so that its duration is PVT insensitive.

The first signal is applied to the delay line 2100 and the latches 2120, as shown in FIG. 19A. When the first signal is high, the latches are open and any change in the input signal (i1, i2, . . . iN) at the "D" side of the latch, such as may be produced as the fire signal propagates through the delay line 2100 and delay stages 2110, produces a corresponding change in the latch output signal (o1, o2, . . . oN) at the "Q" side of the latch. On the other hand, when the fire signal is low, the latch output signal is unresponsive to changes in the latch input signal.

In accordance with a first embodiment, N=10. More or fewer delay stages 2110 may, however, alternatively be used.

Figure 19C:
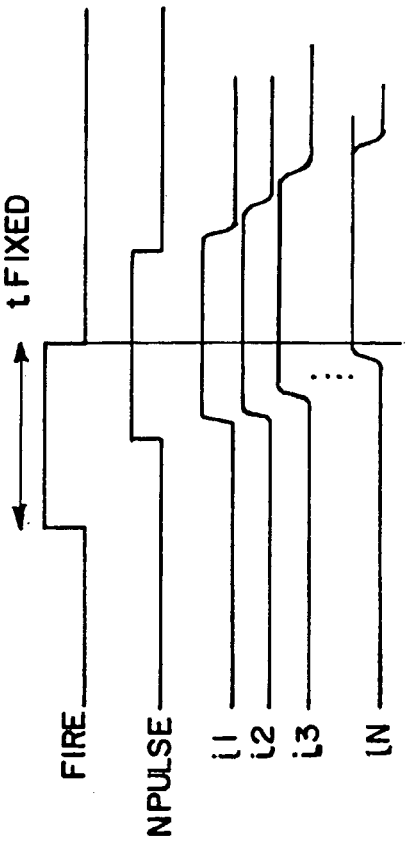
FIGS. 19B and 19C are timing diagrams depicting the state of several signals shown in FIG. 19A for "slow" conditions and "fast" conditions, respectively.
Figure 19B:
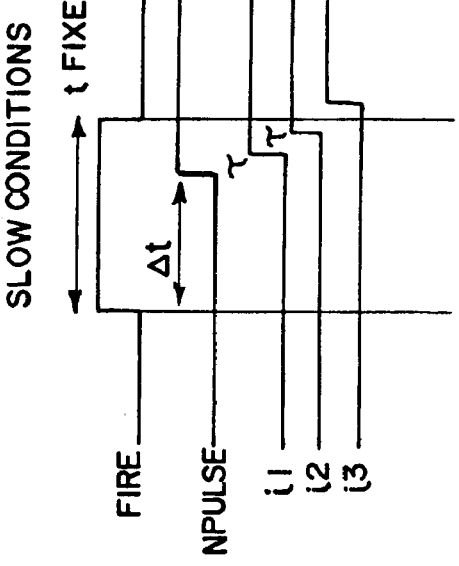

FIGS. 19B and 19C are timing diagrams depicting the state of several signals shown in FIG. 19A for "slow" conditions and "fast" conditions, respectively. In particular, when the conditions are slow, the delay of the fire signal through the delay line 2100 and the delay stages 2110 causes only one or a few of the latch input signals, such as i1 and i2, to arrive at the corresponding latch 2120 while the first signal is high. As a result, most of the latch output signals (o1, o2, . . . oN) remain low, and the decoder 2130 determines, based on the state of the latch output signals (o1, o2, . . . oN), that the conditions are slow.

When, on the other hand, the conditions are fast, the time delay of the fire signal through the delay line 2100 and the delay stages 2110 is reduced such that most or all of the latch input signals (i1, i2, . . . iN) go high within the duration of the fire pulse applied to the latches 2120, as illustrated in FIG. 19C. As a result, the corresponding latch output signals (o1, o2, . . . oN) switch state, and the decoder 2130 determines, based on the state of the latch output signals, that the conditions are fast.

Figure 20A:
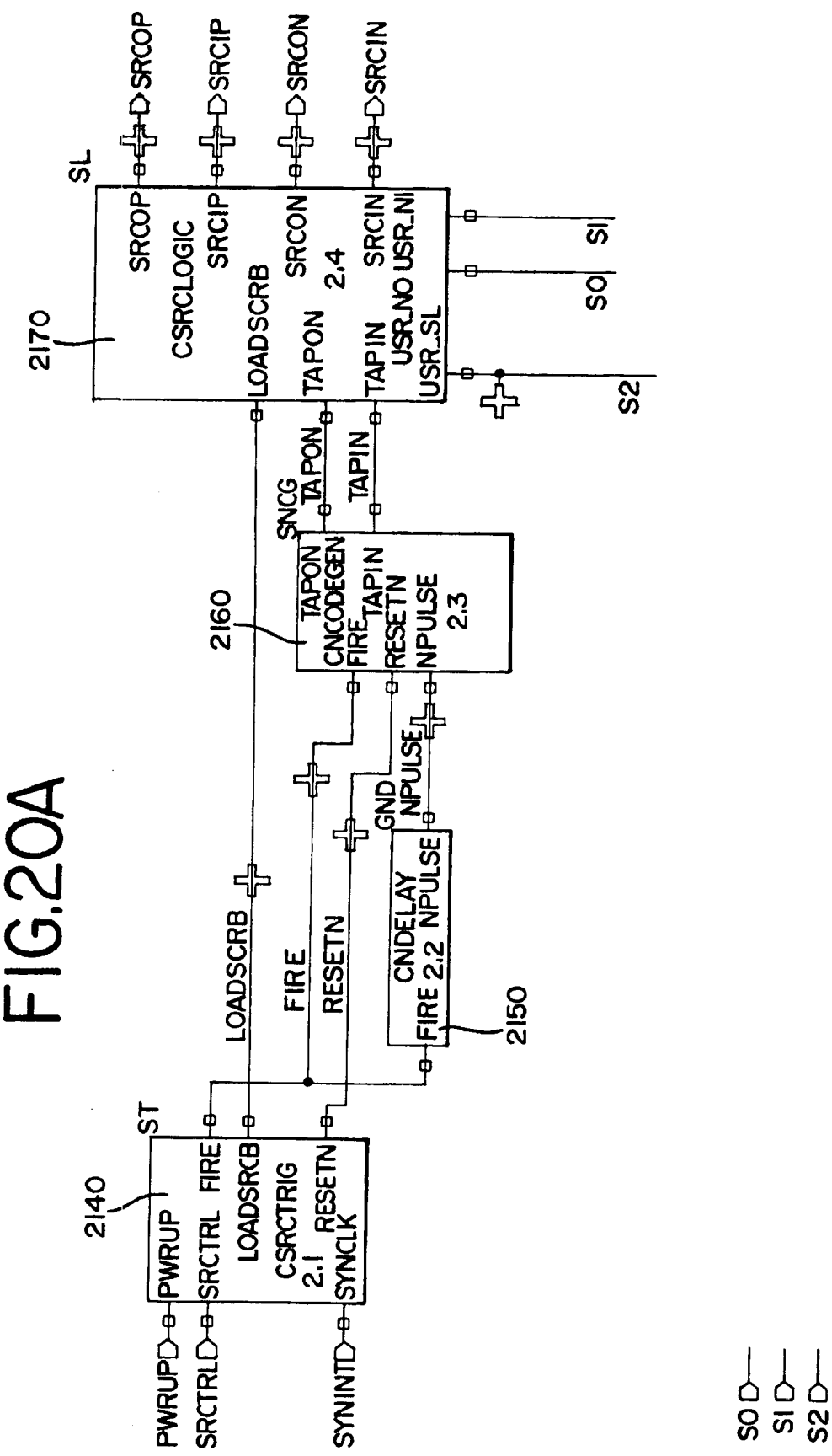
FIG. 20A is an electrical schematic of an embodiment of the PVT detector shown in FIG. 19A.

FIG. 20A is an electrical schematic of an embodiment of the PVT detector shown in FIG. 19A. A trigger circuit 2140 is coupled to a delay circuit 2150 and a code generating circuit 2160. The output of the code generating circuit is coupled to a decoder circuit 2170. The trigger circuit 2140 generates the first signal and the reset signal. The delay circuit 2150 produces a delayed version of the fire signal for application to the code generating circuit 2160.

Figure 20B:
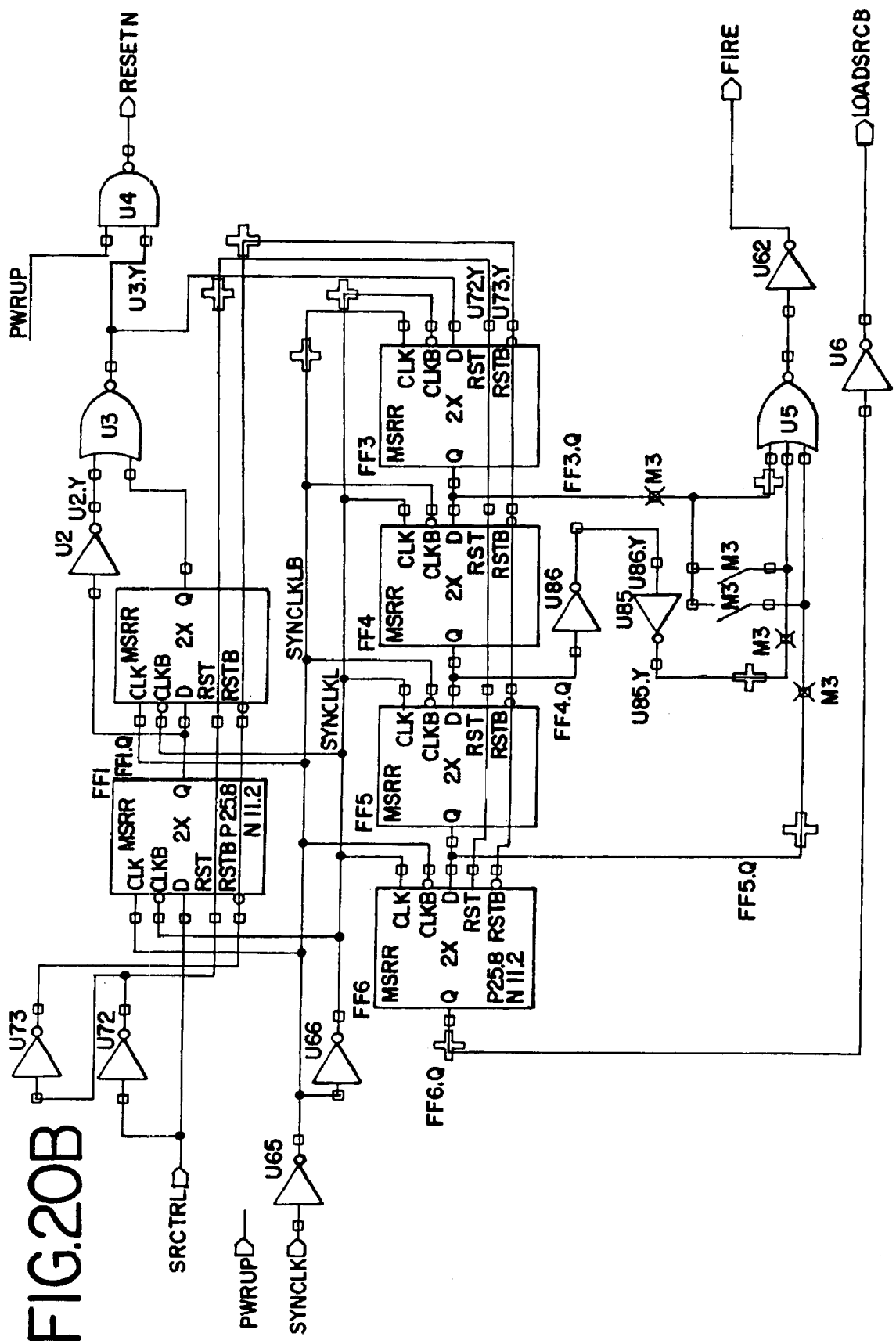
FIG. 20B is an electrical schematic of an embodiment of a trigger circuit for the PVT detector shown in FIG. 20A.

FIG. 20B is an electrical schematic of an embodiment of the trigger circuit 2140 shown in FIG. 20A. The trigger circuit 2140 receives a set/reset control signal 2180 and a clock signal 2190 and in response generates a first signal 2200 and a reset signal 2210. In FIG. 20B, the SRCTRL signal is pulsed high to begin the current calibration process and flip-flops FF1-FF3 change state on the falling edge of SYNCLK. Signal RESETN remains low for 1 cycle of SYNCLK and clears the state of the latches 2120. Flip-flops FF4-FF6 change on the rising edge of SYNCLK. The FIRE signal is asserted for 2.5 cycles of SYNCLK. The trigger circuit 2140 ensures that there is a pause of ½ cycle between the de-assertion of the RESETN, and the assertion of FIRE. Those skilled in the art will recognize, upon reviewing this detailed description, that other implementations of the trigger circuit 2140 may alternatively be used.

Figure 20C:
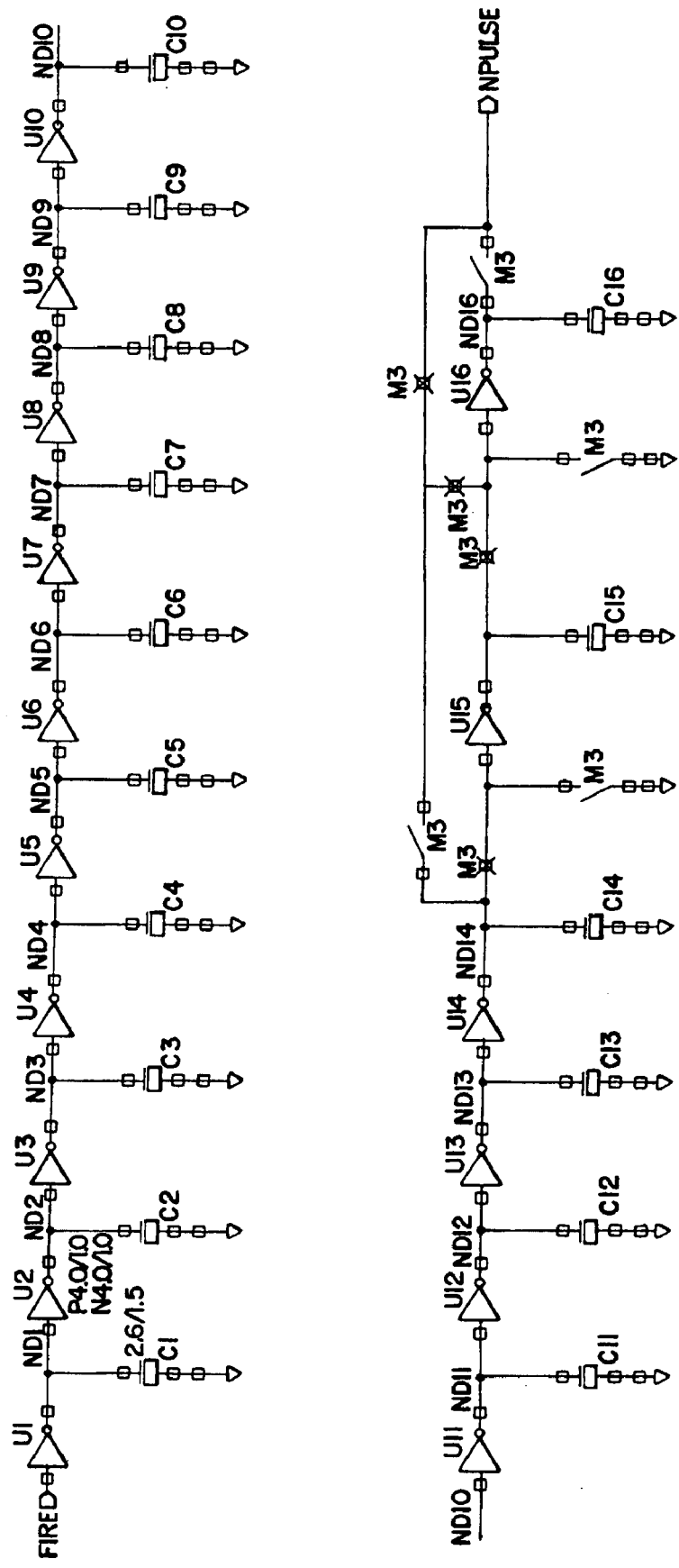
FIG. 20C is an electrical schematic of an embodiment of a delay circuit for the PVT detector shown in FIG. 20A.

FIG. 20C is an electrical schematic of an embodiment of the delay circuit 2150 shown in FIG. 20A. As shown in FIG. 20C, the delay circuit 2150 may be formed from a series of inverters 2220, the outputs of which are capacitively coupled to ground. In accordance with a preferred embodiment, the inverters 2220 are MOS inverters and the capacitors are likewise MOS devices. However, other delay structures, which are known to those skilled in the art, may alternatively be used. The delay circuit 2150 may also include a tuning structure 2155 for tuning the total delay of the delay chain 2150.

Figure 20D:
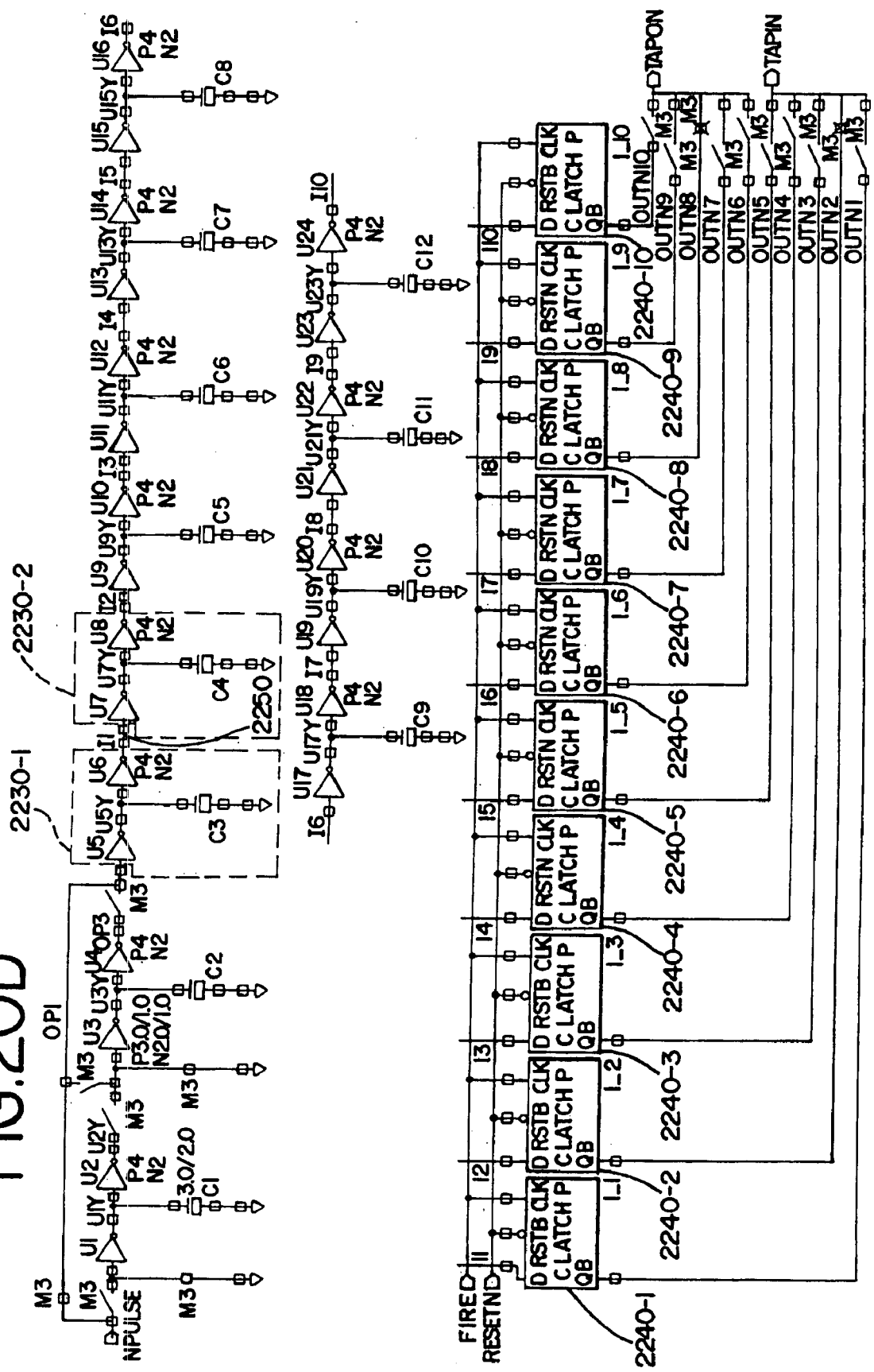
FIG. 20D is an electrical schematic of an embodiment of a code generating circuit for the PVT detector shown in FIG. 20A.

FIG. 20D is an electrical schematic of an embodiment of the code generating circuit 2160 shown in FIG. 20A. Like FIG. 19A, FIG. 20D includes a series of delay stages 2230 and a corresponding set of latches 2240. An output 2250 is provided by each one of the delay stages 2230 and coupled to a corresponding one of the latches 2240. For example, the first delay stage 2230-1 provides an output i1, which is coupled to the first latch 2240-1. The latches 2240 receive the first signal 2200, as a clock input, and the reset signal 2210 from the trigger circuit 2140. The outputs of the latches 2240 are coupled to two outputs 2250, which are provided as inputs to the decoder circuit 2170. In the embodiment of FIG. 20D, only 2 latch outputs, 2240-2 and 2240-8, are inspected by the decoder circuit of FIG. 20E.

Other implementations of the code generating circuit 2160 may alternatively be used. In addition, more than two latch outputs may be provided to the decoder circuit 2170.

Figure 20E:
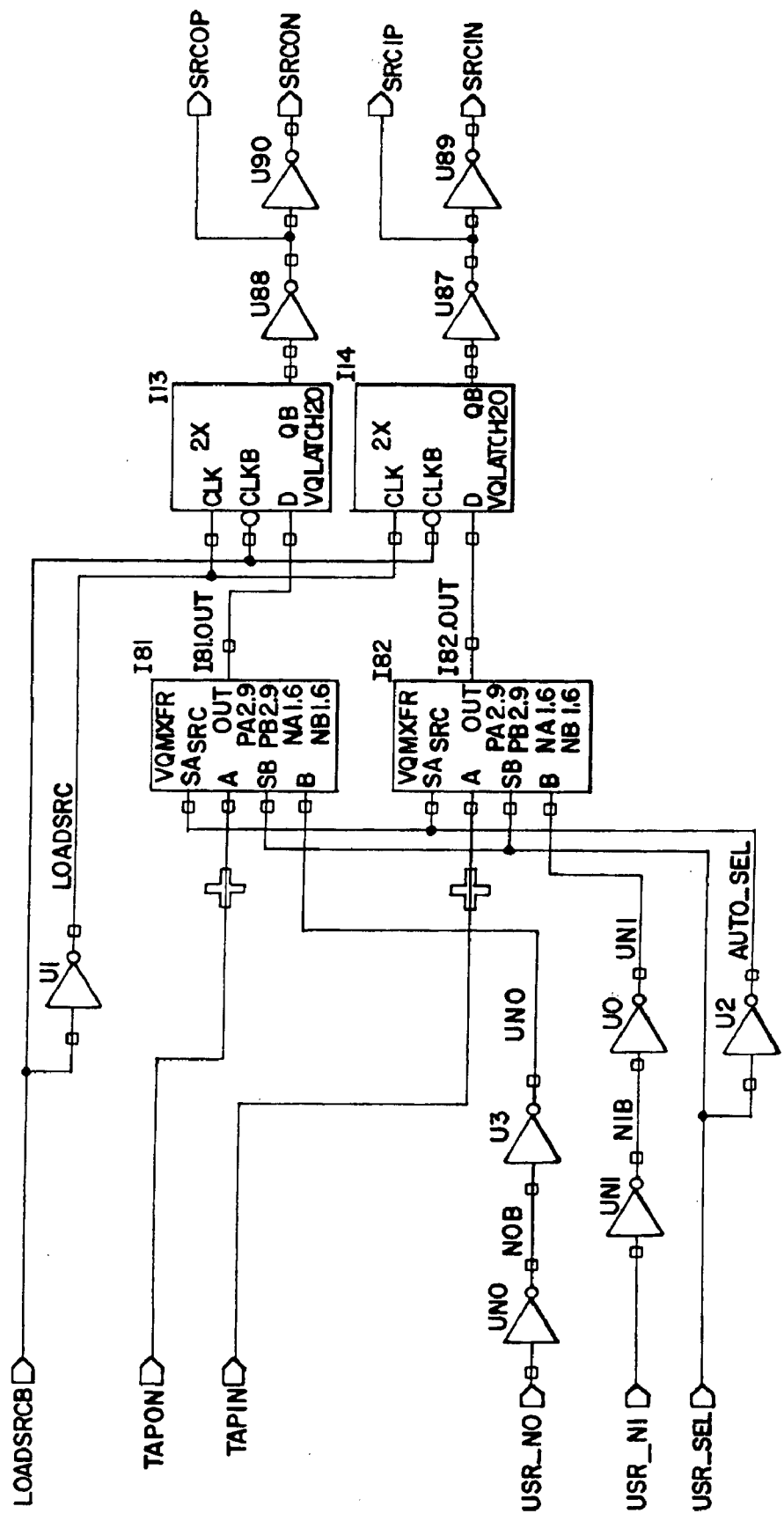
FIG. 20E is an electrical schematic of an embodiment of a decoder circuit for the PVT detector shown in FIG. 20A.

FIG. 20E is an electrical schematic of an embodiment of the decoder circuit 2170 shown in FIG. 20A. In FIG. 20E, the inputs, tapOn and tapIn, are provided by the latch outputs 2240-2 and 2240-8, as shown in FIG. 20D. The decoder circuit may decode the latch outputs, 2240-2 and 2240-8, as follows. If both 2240-2 and 2240-8 have not fired, then the process is "slow." If both 2240-2 and 2240-8 have fired, then the process "fast." Otherwise he process is "normal." The logic is resynchronized by the trailing two latches I13-14. In addition, the decoder circuit 2170 may allow the user to override the results of the PVT detector using the "usr" inputs. The outputs SRC1P, SRC0N, etc. may be used to control S1 and S2, as in FIG. 16, or alternatively to modulate the DACs 2310 or 2320 in FIGS. 22 and 23 below. Although one embodiment of a decoder circuit is described above, numerous alternatives may be implemented by those skilled in the art upon reading this detailed description.

In systems that include a phase-locked loop (PLL) or a delay-locked loop (DLL), the PLL or DLL may also be used as a PVT detector, rather than using one of the PVT detector embodiments described above. In particular, the PVT conditions may be derived from the state of the loop. For example, when the conditions are "slow," the loop will drive the controlled oscillator or delay line to a high speed condition relative to its normal setting. Conversely, if the conditions are "fast," the loop will slow down the oscillator or the delay stage relative to its normal setting. For a delay-locked loop, the loop logic would merely be decoded to provide a measure of the PVT conditions.

Upon reviewing the foregoing, those skilled in the art may discern other types of PVT detectors that may be suitable for the application described herein. The present invention is not intended to be limited to using the PVT detector embodiments described above or any particular type of PVT detector. Rather, certain of the preferred embodiments envision the use of a PVT detector, regardless of its implementation particulars, to improve the resolution of a current mode driver.

In accordance with another preferred embodiment of the present invention, a circuit is provided for varying the gate voltage associated with a current mode driver to thereby control the driver's output current, Iout. This provides an additional degree of freedom in the output current adjustment. The current control bits add or remove segments from the driver. The ability to also adjust Vgate allows one to set the minimum output voltage and the output impedance, as well as the current. The inverters that set the current control bits would have their 'on' voltage set by Vgate.

Figure 21A:
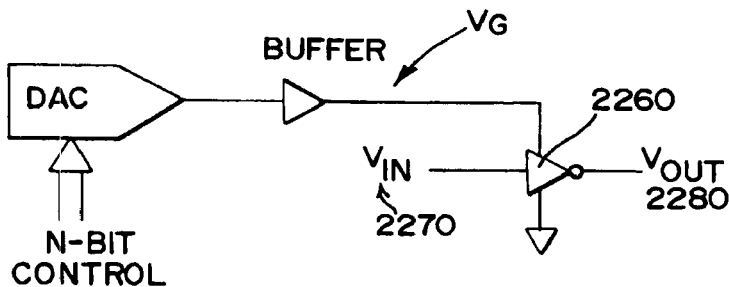
FIG. 21A is a schematic diagram of a circuit for controlling an output voltage, Vout.

FIG. 21A is a schematic diagram of a circuit for controlling an output voltage, Vout. The circuit includes an inverter 220 having an input 2270, an output 2280 and a control input, Vg. The control input, Vg, is provided by a DAC 2290 through a buffer 2300. The DAC 2290 is controlled by an N-bit control signal.

Figure 21B:
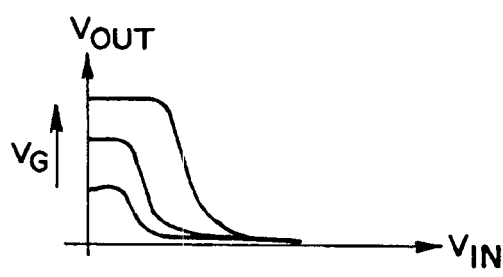
FIG. 21B illustrates, for an inverter, the relationship between the input voltage, Vin, and the output voltage, Vout, as a function of the control input, Vg.

FIG. 21B illustrates for the inverter 2260 the relationship between the liquid voltage, Vin, and the output voltage, Vout, as a function of the control input, Vg. As shown in FIG. 21B, the control input, Vg, limits the output swing of the inverter 2260 and is itself controlled by the DAC 2290.

Figure 22:
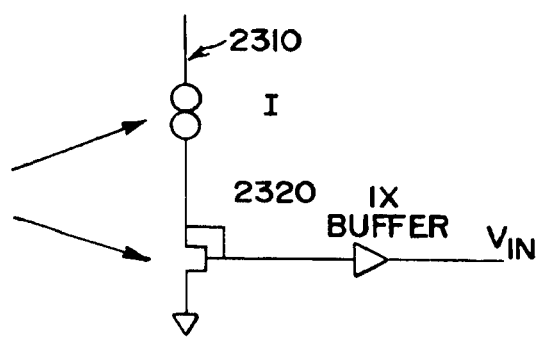
FIG. 22 is an electrical schematic of a first embodiment of a digital-to-analog converter.

FIG. 22 is an electrical schematic of a first embodiment of the DAC 2290. The DAC 2290 includes a variable current source 2310 that is coupled to ground by a MOSFET 2320. A buffer 2330 is coupled to the gate of the MOSFET 2320. The voltage, Vg, at the gate of the MOSFET 2320 may be controlled by either modulating the current source 2310 or adjusting the width-to-length ratio of the MOSFET.

Figure 23:
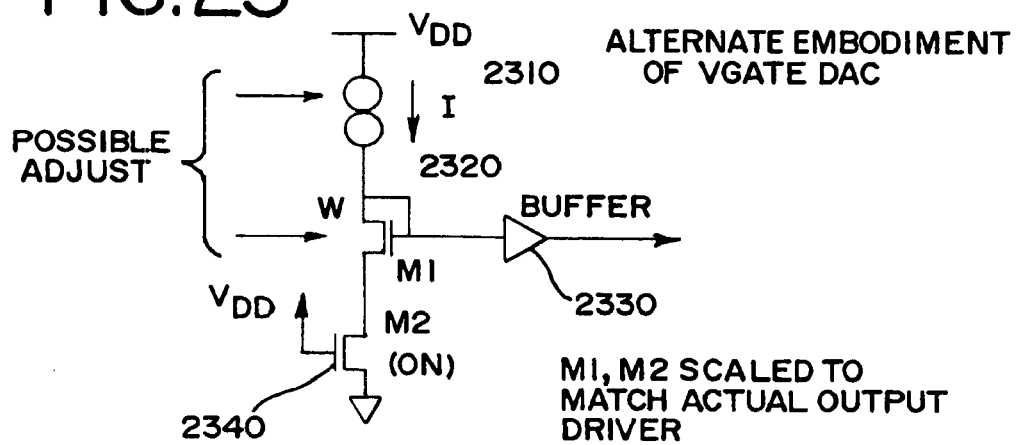
FIG. 23 is an electrical schematic of a second embodiment of the digital-to-analog converter.

FIG. 23 is an electrical schematic of a second embodiment of the DAC 2290. The second embodiment is similar to the embodiment shown in FIG. 22, except that the second embodiment includes an additional MOSFET 2340 coupled between the MOSFET 2320 and ground. In this embodiment, the transistors 2320 and 2340 are preferably scaled to match the output driver. That is, the transistors 2320 and 2340 have the same width-to-length ratio, for the same current. Alternatively, if the current were halved in the DAC 2290 to save power, then the width to length ratio is also halved.

The first embodiment of the DAC 2290, shown in FIG. 22, and the second embodiment of the DAC 2290, shown in FIG. 23, include a variable current source 2310 of which may be used to adjust the gate voltage, Vg. The current source 2310 may be adjusted in accordance with the PVT conditions, such as by utilizing an output of a PVT detector described above. Alternatively, the current source 2310 may be adjusted in accordance with an n-bit current control signal derived, for example, from the calibration process described above with reference to FIGS. 10, 11A and 11B. As a further alternative, the current source 2310 may be adjusted in accordance with an n-bit current control signal under user control.

Figure 24A:
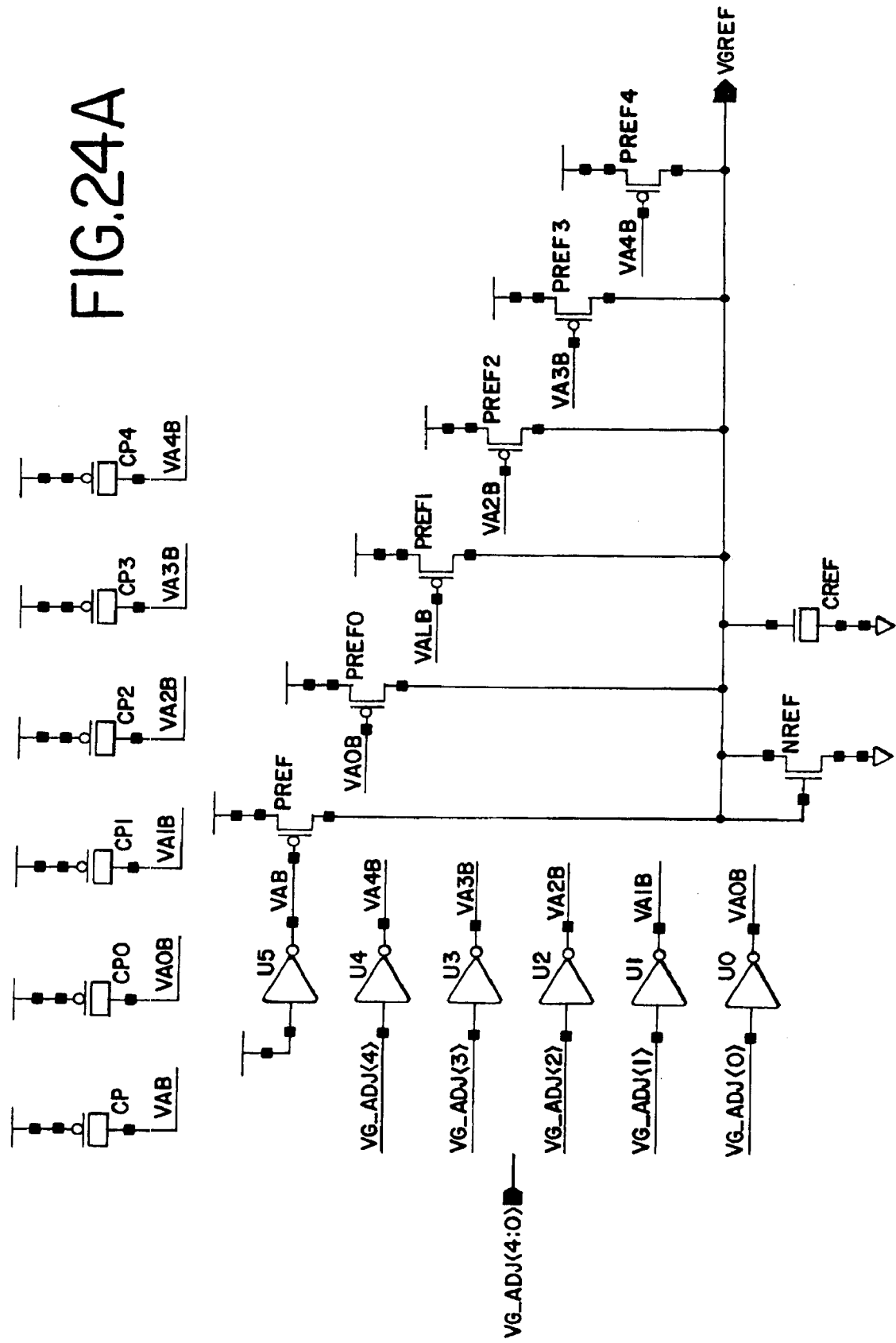
FIGS. 24A and 24B illustrate an electrical schematic of a preferred digital-to-analog converter and a simulated output of the digital-to-analog converter, respectively.
Figure 24B:
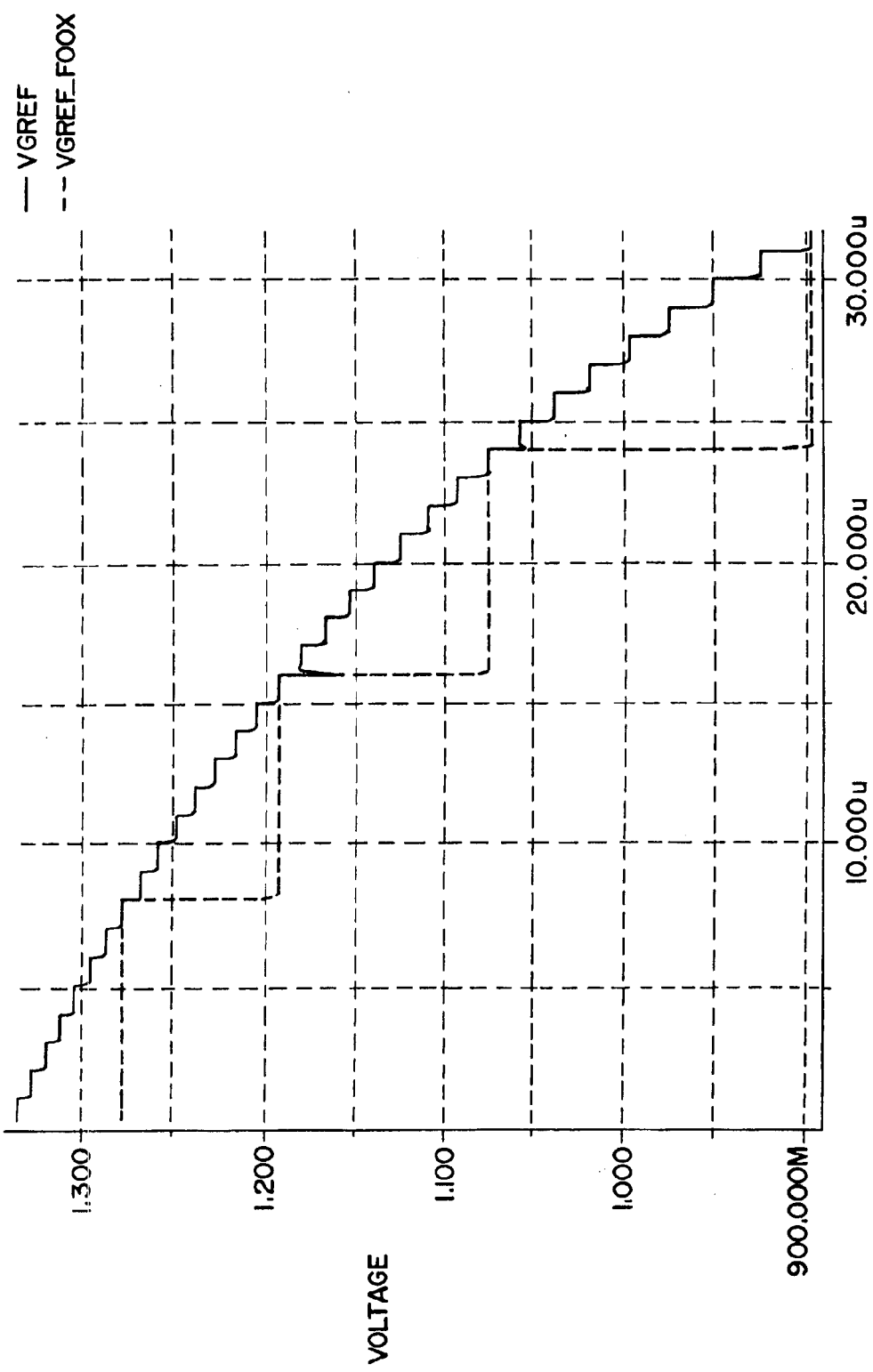

FIGS. 24A and 24B illustrate an electrical schematic of a preferred DAC 2290 and a simulated output of the DAC 2290, respectively. As shown in FIG. 24A, an output voltage, VgRef, is adjusted in accordance with an n-bit current control signal, which in this example is up to five bits, Vg_adj <4:0>. The current control bits, Vg_adj <0> through Vg_adj <4> are applied to a corresponding gate of a CMOS transistor, with the transistor width-to-length ratios being scaled as shown in FIG. 23A. Those skilled in the art will recognize that more or fewer parallel transistors may be used in alternative DAC embodiments, although the resolution of the output voltage adjustment is increased as the number of transistors utilized increases.

In FIG. 24B, the gate voltage, VgRef, is plotted as a function of time under two operating conditions. For the first set of conditions, represented by the solid line, all five bits of Vg_adj <4:0> are used, with each five-bit control signal from 11111 to 00000 being applied for 1 μs. For the second set of conditions, represented by the dashed line, only the two most significant bits of the five bit Vg_adj <4:0> are utilized, with each of the states, 11000, 10000, 01000 and 00000 lasting for 8 μs.

As noted above, the current source 2310 in the DAC 2290 may, in accordance with one embodiment of the invention, be adjusted in accordance with the PVT conditions. For the embodiment, a PVT detector, such as one of the PVT detector embodiments described above, provide an output indicative of the PVT conditions. For example, the PVT detector may indicate that the conditions are "fast," "normal" or "slow" by providing a two-bit output signal. This output signal may then be coupled to the DAC 2290 to adjust the output voltage, Vg. In accordance with an example described above with reference to FIG. 24B, the two bit output of the PVT detector may be used to control the state of the two most significant bits of the five bit Vg_adj <4:0> current control signal.

As also noted above, however, the DAC 2290 may alternatively be adjusted without regard to the PVT conditions. For example, the current control signals, Vg_adj, <N:0>, may be set by a register during current control calibration as follows. The output voltage, VgRef, is set to a minimum value by applying the appropriate current control signal, Vg_adj <N:0>. Next, as described above with reference to FIGS. 10, 11A and 11B, the current control calibration circuit determines the settings for the current control bits CC. If the calibration is successful, then a preferred method continues to calibrate the settings for the current control bits CCB and CCC. On the other hand, if the calibration is unsuccessful, for example due to no transition detected at the current control comparator (i.e. (Vhi-Vlo/2) >Vref), then increment Vg_adj <N:0> and repeat the calibration process for CC. The value of Vg_adj <N:0> may continue to be incremented until the calibration of CC is successful.

Upon reviewing the foregoing, those skilled in the art may discern other types of DACs that may be suitable for the application described herein. The present invention is not intended to be limited to using the DAC embodiments described above or any particular type of DAC. Rather, certain preferred embodiments envision the use of a DAC, regardless of its implementation particulars, to improve the resolution of a current mode driver.

In FIG. 12, a 4-PAM reference voltage generator 1380 generates the multi-PAM reference voltages VREFHI, VREFM and VREFLO from external voltages, VTERM and VREF, supplied on input pins 1382, 1384 respectively. Unity gain amplifiers 1386, 1388 receive and output the input voltages VTERM and VREF respectively. A voltage divider, including series-connected resistors R1, R2 and R3, is coupled between the outputs of the unity gain amplifiers 1386 and 1388. The lowest voltage VREF is selected to drive $V_{REFLO}$ via a power driver 1390. Power drivers 1392, 1394 are coupled between resistors R3, R2 and R2 to provide reference voltages VREFHI and VREFM respectively. The power drivers 1390–1394 are connected as unity gain amplifiers.

In one embodiment, the resistor values are selected such that resistors R2 and R3 have twice the resistance of resistor R1, and VREF, which is supplied externally, is equal to the desired VREFLO voltage.

Figure 13A:
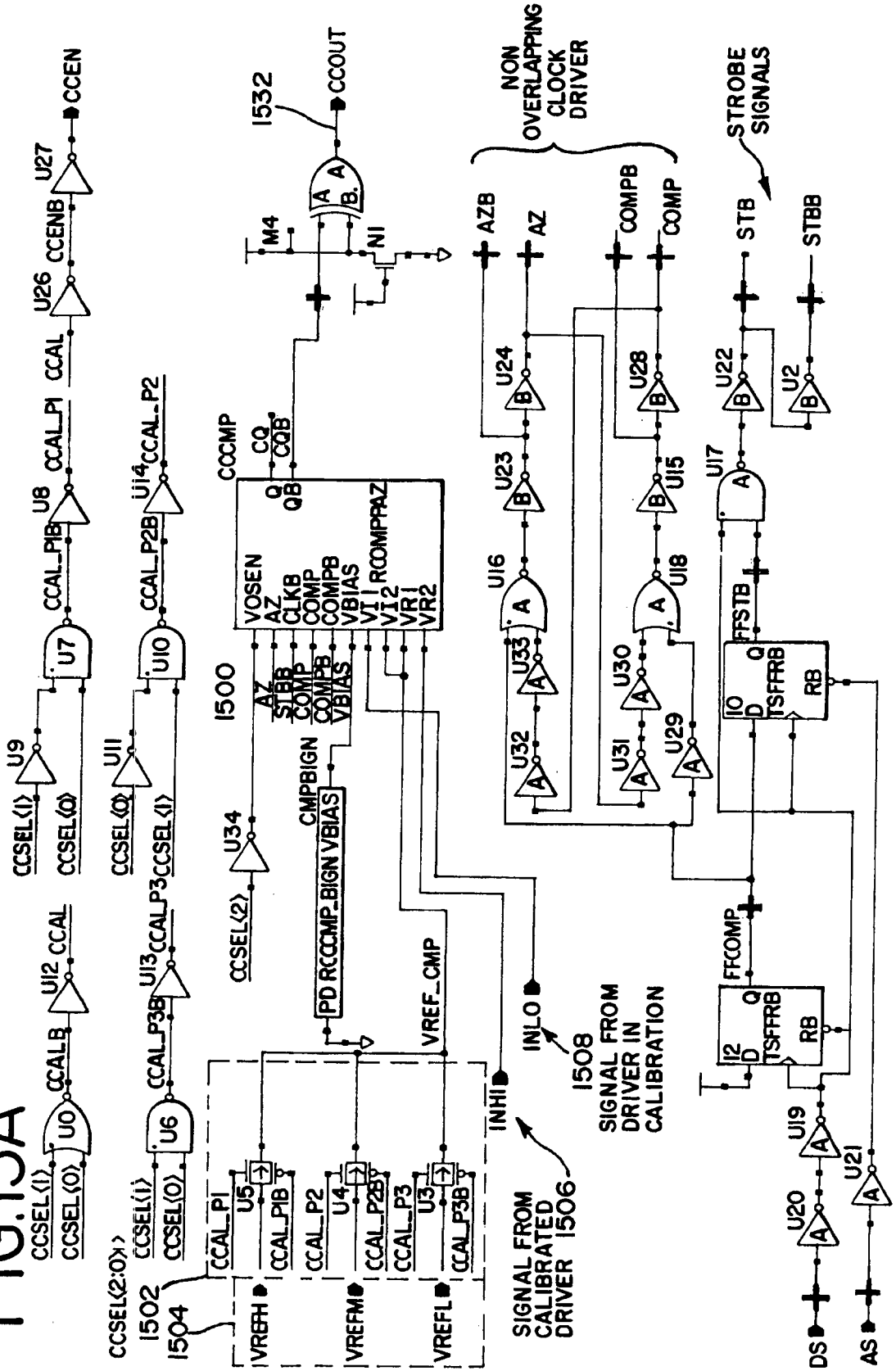
FIGS. 13A and 13B are electrical schematics of a first preferred alternative to the current control calibration circuit of FIG. 10.
Figure 13B:
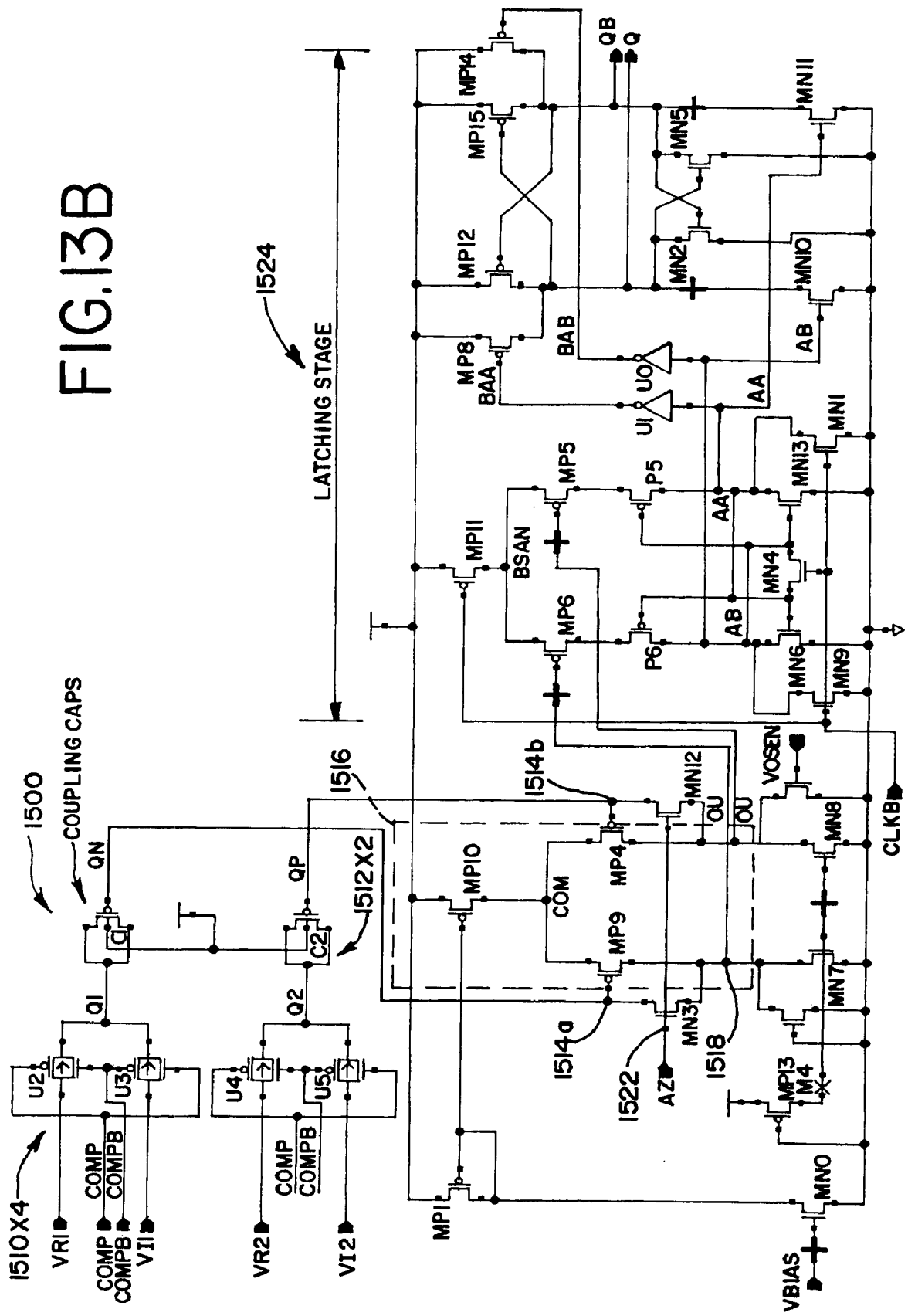

An electrical schematic of a first preferred alternative to the current control calibration circuit of FIG. 10 is shown in FIGS. 13A and 13B. In FIG. 13A, a comparator 1500 is coupled by a multiplexor 1502 to a multi-level voltage reference 1504, which in this case includes three discrete levels. One of the three reference 1504, which in this case includes three discrete levels. One of the three reference voltage levels, $V_{REFHI}$, $V_{REFM}$ or $V_{REFLO}$, is selectively applied to two inputs of the comparator 1500, as further described below. The comparator 1500 is also coupled to receive source calibration signals 1506 and 1508, which are supplied by current mode drivers, such as the 4-PAM driver 1000 shown in FIG. 5A. The source calibration signals 1506 and 1508, for the embodiment shown, include a first driver output at a known, or previously calibrated, voltage level on the input line 1506 and an unknown driver output voltage level on the input line 1508, such that the signal on input line 1508 is the signal being calibrated. The comparator 1500 provides an output for adjusting or calibrating the output of the drivers on input line 1508, as further described below, so that the driver output can be reliably received and decoded.

FIG. 13B is an electrical schematic of the comparator 1500 shown in FIG. 13A. The two inputs from the multiplexor 1502 and the source calibration signals 1506 and 1508 are each coupled to an input of a switch 1510. The outputs of the switches 1510 are combined in pairs and each combined switch output is connected to a coupling capacitor 1512. The coupling capacitors 1512 are connected to opposing inputs 1514a and 1514b of a transistor comparator 1516. The output of the transistor comparator 1516 is the voltage across nodes 1518 and 1520. Two switches 1522 selectively couple the output nodes 1518 and 1520 to the inputs 1514a and 1514b, respectively. The output nodes 1518 and 1520 are coupled to a latching stage 1524.

As illustrated in FIG. 13B, the elements of the comparator 1500, including the switches 1510, the coupling capacitors 1512, the amplifier 1516 and the switches 1522, are preferably implemented as semiconductor devices in an integrated circuit. The coupling capacitors 1512 are preferably constructed using MOS transistors connected as capacitors but other embodiments may alternatively use other capacitor types. Those skilled in the art of integrated circuit design will appreciate that, as a result of process variation, there is likely to be a random offset voltage associated with the transistor comparator 1516. In other words, if the same voltage is applied at the inputs 1514a and 1514b, a finite voltage will appear across output nodes 1518 and 1520, rather than the ideal case in which the output nodes 1518 and 1520 are at the same potential. While the offset voltage is not typically significant for systems using binary or 2-PAM signaling, it is preferable to correct for the offset voltage in systems using four or more signal levels, such as a 4-PAM system.

The comparator 1500 of FIG. 13B therefore includes offset cancellation circuitry. Specifically, the coupling capacitors 1512 and the switches 1522 are operable to provide offset cancellation as follows. During the cancellation phase, which may also be referred to herein as the auto-zero phase, signal az, which is coupled to the gates of the transistor switches 1522, is high. Referring back to FIG. 13A momentarily, the signal az is generated by a non-overlapping clock driver, which includes elements U29, U16, U18, etc. The non-overlapping clock driver produces skewed signals, with a delay period between transitions.

Referring again to FIG. 13B, when the signal az goes high, the amplifier 1516 is placed into unity gain mode by turning on switches 1522 and the offset voltage is stored on the coupling capacitors 1512. In addition, during the auto-zero phase, the switches 1510 are set to apply, in this particular embodiment, the reference voltage supplied by the multiplexor 1502 and the known output driver voltage 1506 to the coupling capacitors 1512. Thus, during the auto-zero phase, the transistor comparator 1516 samples the difference between the two known voltages as modified by the offset voltage of transistor comparator 1516.

At the end of the auto-zero phase, switches 1522 are opened, placing the amplifier 1516 into a high gain mode, and then there is a momentary delay followed by a compare phase. At the start of the compare phase, the state of the switches 1510 is changed to sample the reference voltage supplied by the multiplexor 1502 and the unknown output driver voltage 1508 onto the coupling capacitors 1512. Because the charge stored from the auto-zero phase is tapped on the coupling capacitors 1512, any change in the input voltages, such as the change to the unknown output driver voltage 1508, produces a voltage across the input nodes 1514a and 1514b of the transistor comparator 1516. This in turn produces an output voltage across the nodes 1518 and 1520 that is preferably latched into the latching stage 1524.

The control logic enables strobing of the latching stage 1524. In accordance with a preferred embodiment, the latch 1524 may be strobed multiple times during a single compare phase. Alternatively, the latch 1524 may be strobed only once during a single compare phase.

In accordance with a preferred embodiment, a current control transistor in the current mode driver is adjusted, for example as described above with respect to FIGS. 10, 11A and 11B or as described in U.S. Pat. No. 5,254,883, based upon the output of the transistor comparator 1516. In accordance with a preferred embodiment, the unknown driver output voltage level on line 1508 is incrementally adjusted, such as by increasing or decreasing the amount of current sunk by the output driver, until the average value of the voltage levels on lines 1506 and 1508 is equal to the reference voltage supplied by the multiplexor 1502.

Figure 13C:
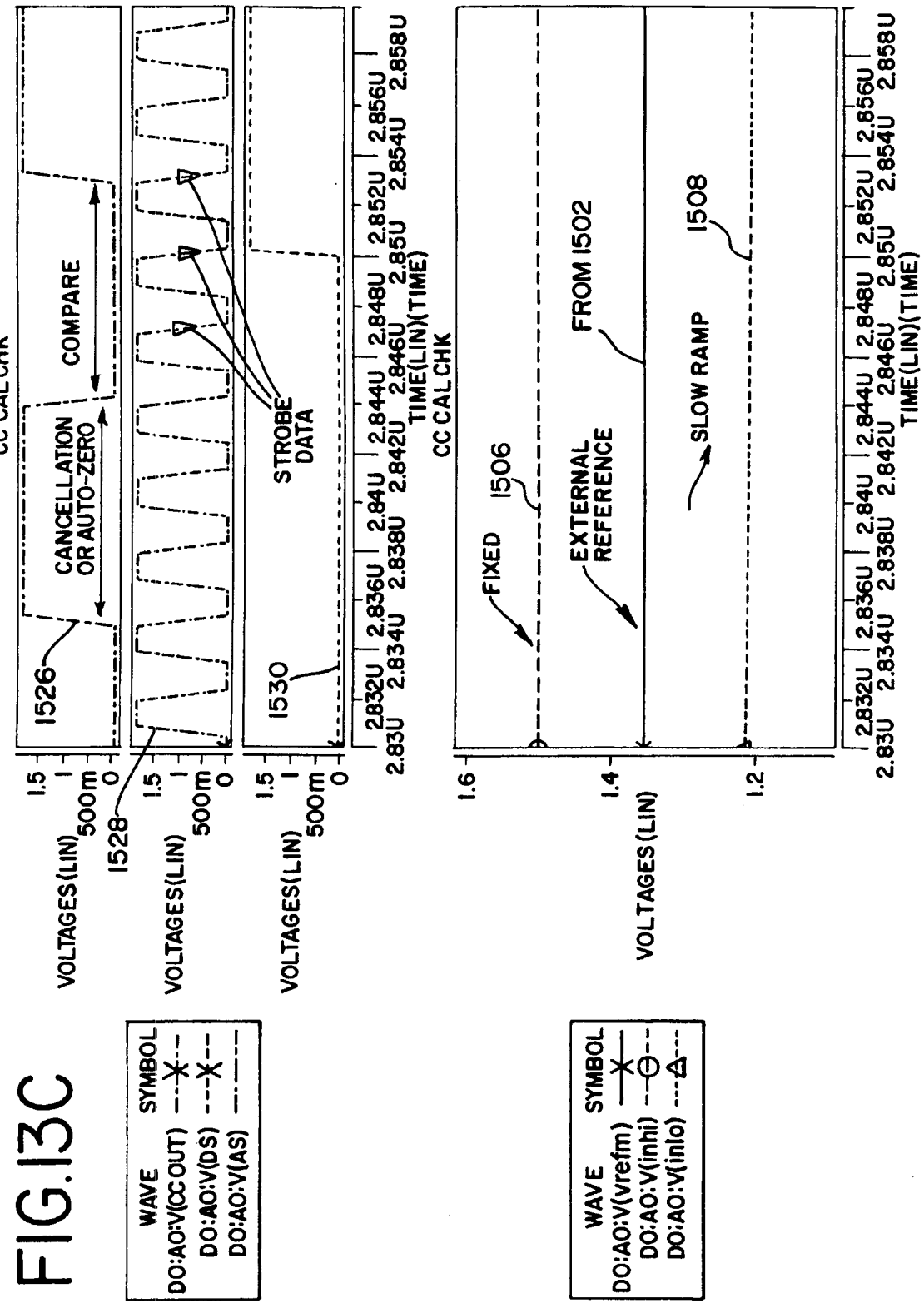
FIG. 13C is a timing diagram for the circuits of FIGS. 13A and 13B.

FIG. 13C is a timing diagram illustrating the relationship between several of the signals referenced above. The timing signals 1526 and 1528 drive the non-overlapping clock driver in FIG. 13A. The auto-zero and compare phases are defined in accordance with the signal 1526. The signal 1530 is the voltage output of the comparator, as shown at pin 1532 in FIG. 13A. The known voltage signal 1506 and the known voltage reference from the multiplexor 1502 are essentially constant. The unknown voltage signal 1508 is adjusted, in this example it is decreasing. When the unknown voltage signal 1508 reaches the point where the reference voltage is equal to the average of the signals 1506 and 1508, the output of the comparator circuit 1530 goes high.

The current control calibration circuit shown in FIGS. 13A and 13B may be utilized as follows to calibrate a 4-PAM output driver, such as the driver of FIG. 5A. When the transistors 1002, 1004 and 1006 are in the "off" state the voltage at the output of the current mode driver is $V_{TERM}$. This corresponds to the symbol 00, which is the zero current state and does not need to be calibrated.

The known voltage, $V_{TERM}$, is applied to line 1506 of the comparator 1500 and an unknown voltage generated by turning "on" the transistor 1002 (from FIG. 5A) is applied to line 1508 of the comparator 1500. The multiplexor 1502 causes the reference voltage, $V_{REFHI}$, to be applied to the comparator 1500. Using feedback from the output of the comparator 1500, a current control transistor (not shown) coupled in series with the transistor 1002 is adjusted until the average of the voltages of lines 1506 and 1508 is equal to the reference voltage, $V_{REFHI}$, the voltage on line 1508 is now calibrated to correspond with the 4-PAM symbol "01".

At this point, the voltage corresponding to the 4-PAM symbol "0" is applied to line 1506, and an unknown voltage generated by turning "on" the transistors 1002 and 1004 is applied to line 1508. The multiplexor 1502 is activated to cause the reference voltage, $V_{REFM}$, to be applied to the comparator 1500. Using feedback from the output of the comparator 1500, a current control transistor (not shown) coupled in series with the transistor 1004 is adjusted until the average of the voltages on lines 1506 and 1508 is equal to the reference voltage, $V_{REFM}$. The voltage on line 1508 is now calibrated to correspond with the 4-PAM symbol "11".

Next, the voltage corresponding to the 4-PAM symbol "11" is applied to line 1506, and an unknown voltage generated by turning "on" the transistors 1002, 1004 and 1006 is applied to line 1508. The multiplexor 1502 is activated to the cause the reference voltage, $V_{REFLO}$, to be applied to the comparator 1500. Using feedback from the output of the comparator 1500, a current control transistor (not shown) coupled in series with the transistor 1006 is adjusted until the average of the voltages on lines 1506 and 1508 is equal to the reference voltage, $V_{REFlo}$. The voltage on line 1508 is now calibrated to correspond with the 4-PAM symbol "10".

Those skilled in the art of circuit design will appreciate that the comparator 1500 may take other forms. FIG. 13D illustrates alternative embodiments for the differential comparator of FIG. 13B.

Referring again to FIG. 13B, it will be appreciated that if, for example, the comparator 1500 is implemented as an integrated circuit, then the coupling capacitors 1512 may be implemented using a PMOS FET topology as shown in FIG. 13E. Such capacitors operate linearly when the applied voltage, $V_{DC}$, is greater than the magnitude of the threshold voltage, $V_T$, of the PMOS FET. The averaging and offset cancellation functions of the comparator 1500 are not optimally realized when the capacitors are operated in the non-linear range. It is therefore preferred that the applied voltage be kept within the linear range. In accordance with a preferred embodiment, the applied voltage is within the range of approximately 1.0 volts to 1.8 volts. The auto-zero voltage, $V_{AZ}$, may be approximately 0.6 volts.

Figure 14A:
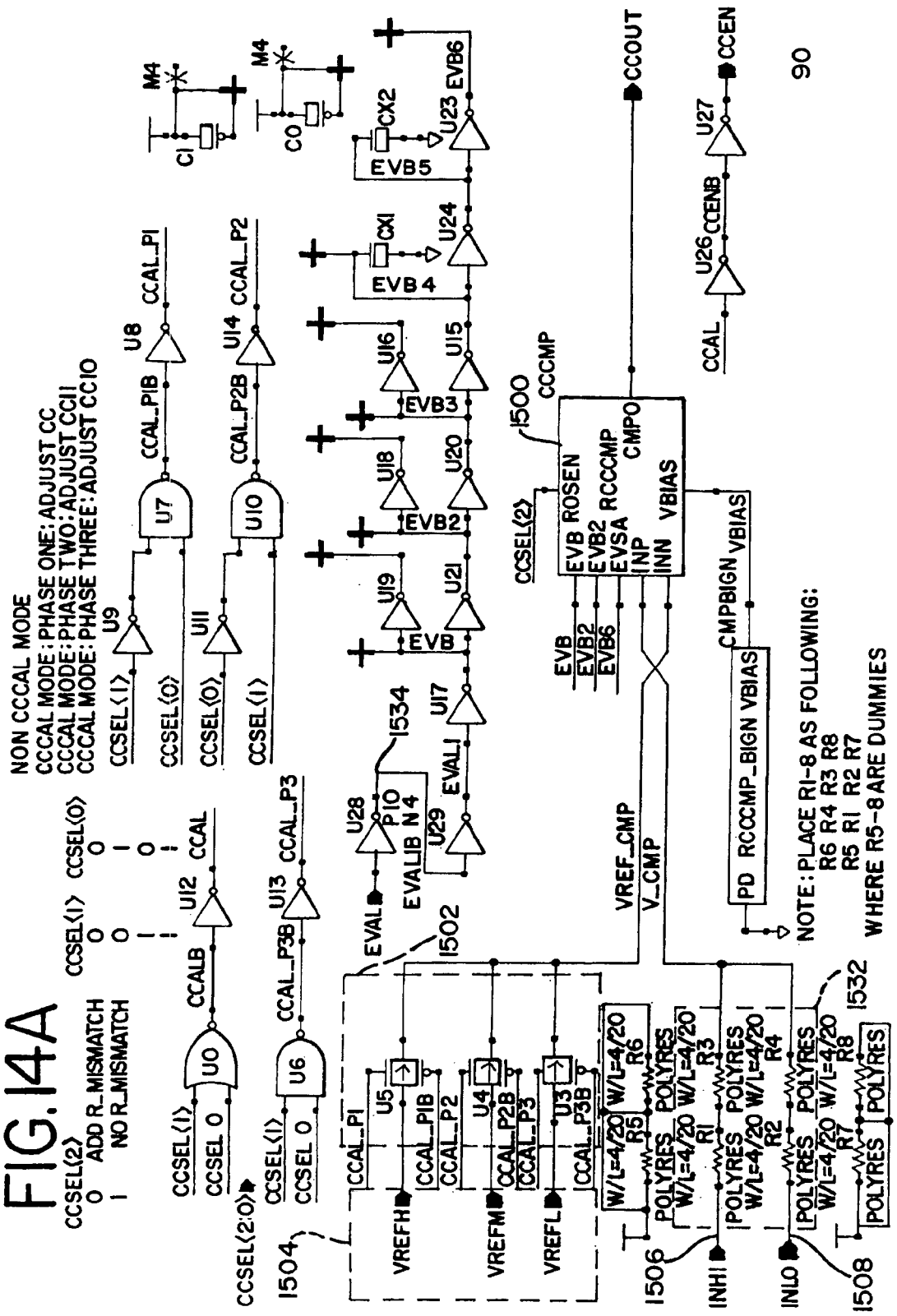
FIGS. 14A and 14B are electrical schematics of a second preferred alternative to the current control calibration circuit of FIG. 10.
Figure 14B:
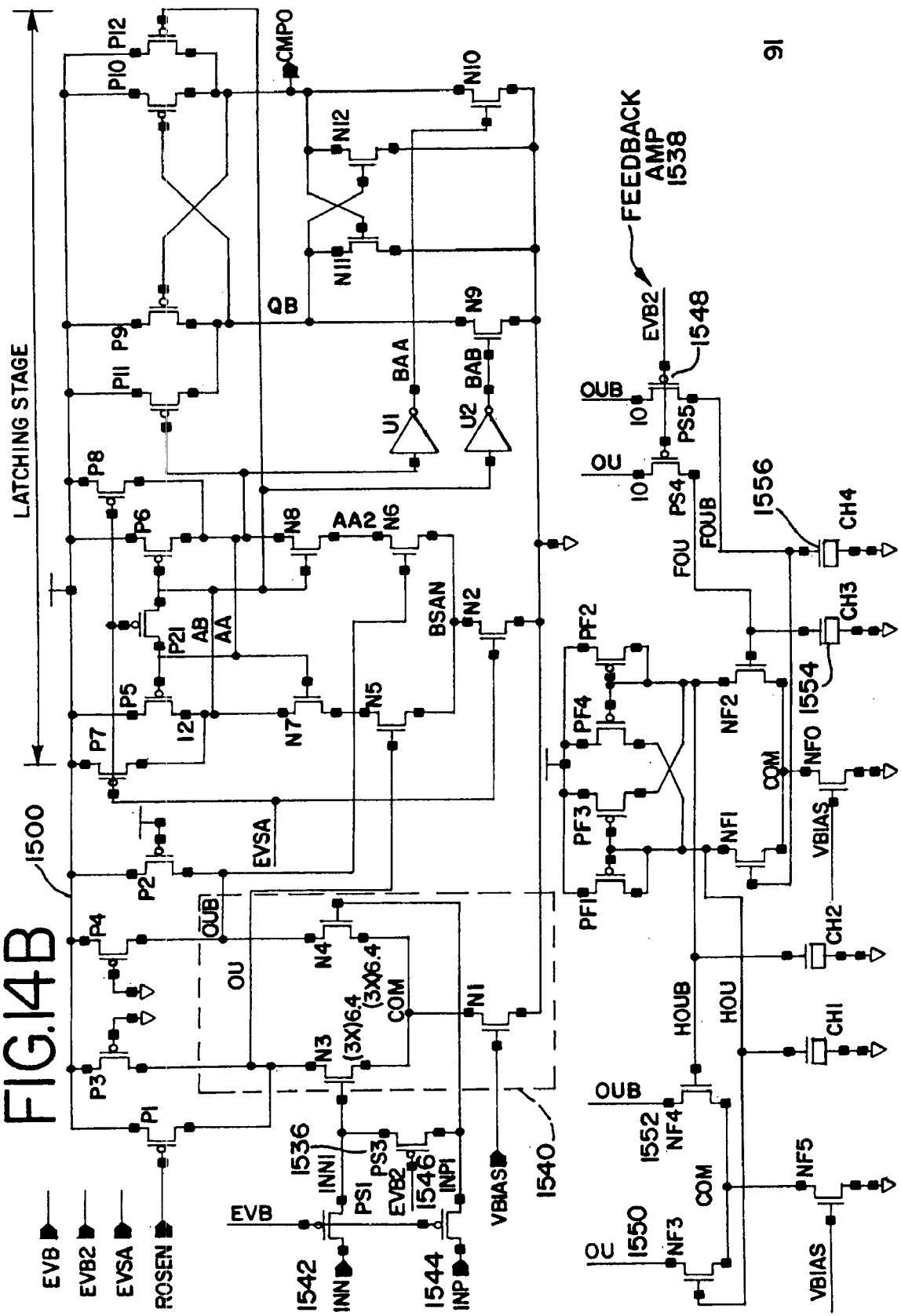

An electrical schematic of another preferred alternative to the current control calibration circuit of FIG. 10 is shown in FIGS. 14A and 14B. As shown in FIG. 14A, this embodiment includes a comparator 1500, a multiplexor 1502, multi-level voltage reference 1504, and source calibration signals 1506 and 1508, which carry a known voltage signal and an unknown (to be calibrated) voltage signal, respectively. In comparison to FIG. 13A, the circuit of FIG. 14A differs in that it includes a resistive voltage combiner 1532 that is coupled to provide the average of the signals on lines 1506 and 1508 to the comparator 1500. In addition, for the embodiment of FIG. 14A, the non-overlapping clock driver is replaced by an inverter delay chain 1534.

As shown in FIG. 14B, the comparator 1500 differs from that of FIG. 13B. Notably, a different offset cancellation technique is utilized. For the embodiment of FIG. 14B, a switch 1536 and feedback amplifier 1538 are used to compensate for the offset voltage associated with a differential amplifier 1540.

The operation of the embodiment shown in FIGS. 14A and 14B will now be described. The timing of the offset cancellation phase and the compare phase are controlled by the inverter delay chain 1534. The inverter delay chain 1534 produces skewed signals evb, evb2, evb6, etc, shown in FIGS. 14C and 14D. The delay between these signals is approximately the delay of one or more logic gates. The delay period may be augmented by loading the gate outputs with additional capacitance.

During the cancellation phase, the feedback amplifier 1538 senses the offset voltage associated with the differential amplifier 1540 as follows. When timing signal evb2 goes low, the inputs 1542 and 1544 of the amplifier 1540 are shorted together by a switch 1546. At the same time, a switch pair 1548 couples the outputs of the amplifier 1540 to the inputs of the feedback amplifier 1538. With the inputs 1542 and 1544 of the amplifier 1540 being shorted together, any voltage appearing at the output of the amplifier 1540 may be characterized as an output offset voltage. The feedback amplifier 1538 produces output current in the drains of transistors 1550 and 1552 in an amount that is proportional to the output offset voltage. The current supplied by the feedback amplifier 1538 works to drive the output offset voltage to zero, thereby balancing the amplifier 1540 when its inputs 1542 and 1544 are shorted. The resultant voltage required to produce the balancing current in the feedbac amplifier 1538 is stored on the capacitors 1554 and 1556 at the end of the cancellation phase when the switches 1548 are opened.

As shown in FIGS. 14C and 14D, shortly after the cancellation phase ends on the falling edge of the signal evb, the switches 1546 and 1548 are opened, disconnecting the feedback amplifier 1538 and coupling the inputs 1542 and 1544 to the amplifier 1540, as the signal evb2 goes high. The transition of evb2 to high starts the compare phase. Momentarily after the compare phase starts, the signal evb6 goes high, activating the latching stage of the comparator 1500. When the latching stage is active, the output voltage of the differential amplifier 1540 is latched.

The current control calibration circuit shown in FIGS. 14A and 14B may be utilized to calibrate a 4-PAM output driver in the same manner as described above with respect to FIGS. 13A and 13B.

Figure 15A:
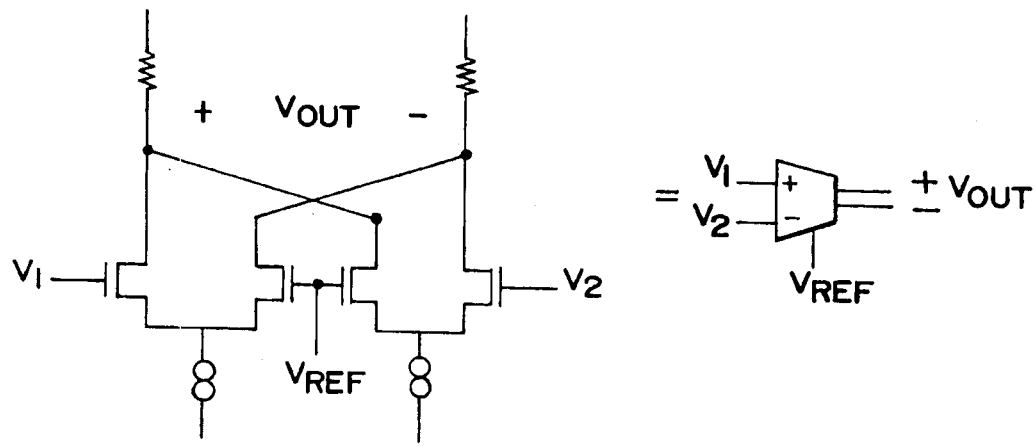
FIG. 15A is an electrical schematic of a linear transconductor.

FIG. 15A is an electrical schematic of a linear transconductor. In a linear region of operation, the output voltage, $V_{OUT}$, is proportional to the difference between the input voltages, $v_1$ and $v_2$. Thus, the output of the linear transconductor is balanced, i.e. $v_{OUT}=0$, when $v_1-v_{Ref}=v_{Ref}-v_2$, or $(v_1+v_2)/2=v_{Ref}$.

Figure 15B:
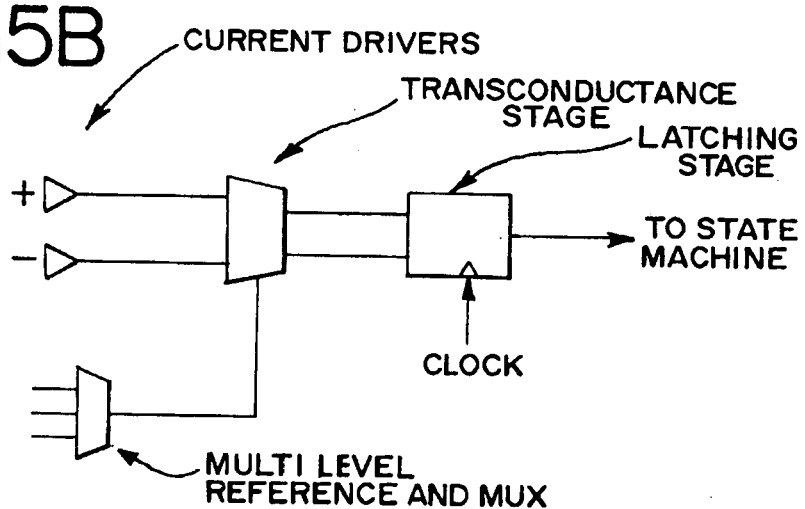
FIG. 15B is a schematic of a comparator using a transconductor stage.

In accordance with yet another alternative embodiment, therefore the comparator comprises a transconductor stage, as shown in FIG. 15B. For this embodiment, an offset canceling amplifier, such as the amplifier 1538 of FIG. 14B, is preferably utilized.

While the invention has been described in connection with a number of preferred embodiments, the foregoing is not intended to limit the scope of the invention to a particular form, circuit arrangement, or semiconductor topology. To the contrary, the invention is intended to be defined by the appended claims and to include such alternatives, modifications and variations as may be apparent to those skilled in the art upon reading the foregoing detailed description.

We claim:

1. A method for improving resolution of a current mode driver, where the current mode driver is operable to provide an output that falls within a predetermined range, the method comprising:

sensing at least one of a process condition, a voltage condition and a temperature condition with a PVT detector;

adjusting a full scale current of a DAC in accordance with an output of the PVT detector; and setting a current control signal based on an output of the DAC, the current control signal being applied to the current mode driver to improve resolution of the current mode driver, wherein the current control signal for transistors in the current mode driver includes a plurality of bits;

wherein the sensing comprises;

applying a PVT independent current to a PVT sensitive load; and detecting a voltage drop across the PVT sensitive load.

2. The method as claimed in claim 1, wherein the sensing comprises sensing a PVT sensitive DC parameter.

3. The method as claimed in claim 1, wherein the sensing comprises sensing a PVT sensitive AC parameter.

4. A method for improving resolution of a current mode driver, where the current mode driver is operable to provide an output that falls within a predetermined range, the method comprising:

sensing at least one of a process condition, a voltage condition and a temperature condition with a PVT detector;

adjusting a full scale current of a DAC in accordance with an output of the PVT detector; and setting a current control signal based on an output of the DAC, the current control signal being applied to the current mode driver to improve resolution of the current mode driver, wherein the current control signal for transistors in the current mode driver includes a plurality of bits;

wherein the sensing comprises:

applying a pulse in parallel to a delay line and a first plurality of latches, wherein the delay line comprises a second plurality of delay stages;

coupling an output of a subset of the plurality of delay stages to an input of a corresponding latch from the plurality of latches; and decoding an output from the plurality of latches.

5. In an output driver that is operable to provide a multi-PAM output having at least two levels, wherein the output is set in accordance with a current control signal, a method of improving resolution of the output driver, the method comprising the steps of:

applying the current control signal to cause the output driver to sink a full scale current;

providing a PVT detector to sense a characteristic that comprises at least one of a process condition, a voltage condition and a temperature condition;

generating a full scale current adjustment signal at the PVT detector;

applying a full scale current adjustment signal to alter the full scale current of the output driver;

applying the current control signal to cause the output driver to sink a second current, wherein the second current is less than the full scale current;

sensing, at the PVT detector, at least one of a process condition, a voltage condition and a temperature condition;

generating a second current adjustment signal at the PVT detector;

applying the second current adjustment signal to alter the second current of the output driver; and calibrating the altered full scale current of the output drier and the altered second current of the output driver by comparing the altered full scale current with a first reference and comparing the altered second current with a second reference.

6. The method of improving resolution of an output driver as claimed in claim 5, wherein the step of applying the full scale current adjustment signal comprises coupling the adjustment signal to a digital-to-analog converter.

7. The method of improving resolution of an output driver as claimed in claim 6, wherein the adjustment signal to a two-bit signal and the digital-to-analog converter has at least two inputs.

8. The method of improving resolution of an output driver as claimed in claim 6, wherein the digital-to-analog converter provides an output signal in response to the adjustment signal.

9. A method of improving resolution of a current mode driver, comprising the steps of:
applying a first current control signal to a digital-to-analog converter, the digital-to-analog converter providing a first output in response thereto;
applying the first output as a gate voltage to control a full scale current of an output driver;
calibrating the output driver by comparing a second output, which is provided by the output driver, with a reference; and
augmenting the first current control signal when the second output differs from the reference.

10. The method as claimed in claim 9, wherein the step of calibrating the output driver comprises deriving the second input from a signal provided directly to the output driver.

11. The method as claimed in claim 10, wherein the step of deriving the second output comprises applying the signal to a resistor divider.

12. The method as claimed in claim 10, wherein the step of deriving the second output comprises applying the signal to a transconductance stage.

13. The method as claimed in claim 10, wherein the step of deriving the second output comprises applying the signal to a switched capacitor circuit.

14. The method as claimed in claim 9, wherein the first current control signal is applied under user control.

15. A method for improving resolution of a current mode driver, where the current mode driver is operable to provide an output that falls within a predetermined range, the method comprising:
sensing at least one of a process condition, a voltage condition and a temperature condition with a PVT detector;
adjusting a full scale current of a DAC in accordance with an output of the PVT detector; and
setting a current control signal based on an output of the DAC, the current control signal being applied to the current mode driver to improve resolution of the current mode driver, wherein the current control signal for transistors in the current mode driver includes a plurality of bits;
wherein the current mode driver is a multi-PAM signal generator coupled to a bus, the multi-PAM signal generator uses pulses having a plurality of sets of signal amplitudes to encode signals, and wherein a respective set of signal amplitudes in the plurality of sets of signal amplitudes has at least two signal levels.

16. The method of claim 15, wherein the sensing, adjusting and setting steps occur during a power-up sequence for the multi-PAM signal generator.

17. The method of claim 15, wherein the adjusting and setting steps occur in response to a triggering event after power-up.

* * * * *

UNITED STATES PATENT AND TRADEMARK OFFICE
CERTIFICATE OF CORRECTION

| | | |
|---|---|---|
| PATENT NO. | : 7,161,513 B2 | Page 1 of 1 |
| APPLICATION NO. | : 09/742250 | |
| DATED | : January 9, 2007 | |
| INVENTOR(S) | : Werner et al. | |

It is certified that error appears in the above-identified patent and that said Letters Patent is hereby corrected as shown below:

In the Claims:

Column 23, line 67, please delete ";" and insert -- : --.

Column 24, line 55, please delete "drier" and insert --driver--.

Column 24, line 65, please delete "to" and insert --is--.

Column 25, line 22, please delete "resistor" and insert --resistive--.

Signed and Sealed this

Twenty-fourth Day of April, 2007

JON W. DUDAS
*Director of the United States Patent and Trademark Office*